US009207537B2

(12) United States Patent
Matsuura et al.

(10) Patent No.: US 9,207,537 B2
(45) Date of Patent: Dec. 8, 2015

(54) LITHOGRAPHIC PRINTING ORIGINAL PLATE

(71) Applicant: FUJIFILM Corporation, Minato-ku, Tokyo (JP)

(72) Inventors: Atsushi Matsuura, Haibara-gun (JP); Hirokazu Sawada, Haibara-gun (JP); Akio Uesugi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/507,346

(22) Filed: Oct. 6, 2014

(65) Prior Publication Data
US 2015/0024325 A1 Jan. 22, 2015

Related U.S. Application Data

(62) Division of application No. 13/498,001, filed as application No. PCT/JP2010/065285 on Sep. 7, 2010, now Pat. No. 8,883,401.

(30) Foreign Application Priority Data

Sep. 24, 2009 (JP) .................................. 2009-218909
Sep. 25, 2009 (JP) .................................. 2009-220406
Sep. 25, 2009 (JP) .................................. 2009-220443
Sep. 25, 2009 (JP) .................................. 2009-220592

(51) Int. Cl.
*G03F 7/00* (2006.01)
*G03F 7/09* (2006.01)
(Continued)

(52) U.S. Cl.
CPC ............. *G03F 7/09* (2013.01); *B41C 1/1008* (2013.01); *B41C 1/1016* (2013.01); *B41N 1/083* (2013.01);
(Continued)

(58) Field of Classification Search
CPC .......................................................... B41N 1/08
USPC .................................................... 252/299.01
See application file for complete search history.

(56) References Cited

U.S. PATENT DOCUMENTS 6,096,481 A 8/2000 Vermeersch et al.
6,143,464 A 11/2000 Kawauchi
(Continued)

FOREIGN PATENT DOCUMENTS

JP 03234594 A 10/1991
JP 1144956 A 2/1999
(Continued)

OTHER PUBLICATIONS

International Preliminary Report on Patentability and Written Opinion, mailed Apr. 19, 2012, issued in corresponding International Application No. PCT/JP2010/065285, 11 pages in English.
(Continued)

*Primary Examiner* — Chanceity Robinson
(74) *Attorney, Agent, or Firm* — Sughrue Mion, PLLC

(57) ABSTRACT

A presensitized plate having a long press life and excellent resistance to scum and corrosive micro-stains and capable of on-press development is provided. The presensitized plate includes a photosensitive layer containing (A) a sensitizing dye, (B) a polymerization initiator, (C) a polymerizable compound, and (D) a binder polymer; and a protective layer which are formed on a support in this order. The support is prepared from an aluminum alloy plate containing intermetallic compound particles with a circle equivalent diameter of 0.2 μm or more at a surface density of 35,000 pcs/mm² or more and aluminum carbide particles with a maximum length of 1 μm or more in an amount of up to 30,000 pcs/g.

6 Claims, 3 Drawing Sheets

(51) Int. Cl.
*B41C 1/10* (2006.01)
*B41N 1/08* (2006.01)

(52) U.S. Cl.
CPC ......... *B41C 2201/02* (2013.01); *B41C 2201/04* (2013.01); *B41C 2201/10* (2013.01); *B41C 2201/14* (2013.01); *B41C 2210/02* (2013.01); *B41C 2210/04* (2013.01); *B41C 2210/06* (2013.01); *B41C 2210/14* (2013.01); *B41C 2210/22* (2013.01); *B41C 2210/24* (2013.01); *B41C 2210/262* (2013.01)

(56) References Cited

U.S. PATENT DOCUMENTS

| | | | |
|---|---|---|---|
| 6,513,433 | B2 | 2/2003 | Inoue et al. |
| 6,555,247 | B2 | 4/2003 | Yamaguchi |
| 6,689,534 | B2 | 2/2004 | Oda et al. |
| 6,764,587 | B2 | 7/2004 | Sawada et al. |
| 6,890,700 | B2 * | 5/2005 | Tomita et al. ............... 430/271.1 |
| 7,198,876 | B2 | 4/2007 | Inno |
| 7,316,891 | B2 | 1/2008 | Vander Aa et al. |
| 7,473,516 | B2 | 1/2009 | Vander Aa et al. |
| 7,850,837 | B2 | 12/2010 | Matsuura et al. |
| 2003/0064318 | A1 | 4/2003 | Huang et al. |
| 2003/0221572 | A1 | 12/2003 | Matsuura et al. |
| 2004/0191692 | A1 | 9/2004 | Sawada et al. |
| 2004/0260050 | A1 | 12/2004 | Munnelly et al. |
| 2005/0003285 | A1 | 1/2005 | Hayashi et al. |
| 2005/0084797 | A1 | 4/2005 | Vermeersch et al. |
| 2005/0123853 | A1 | 6/2005 | Munnelly et al. |
| 2006/0269874 | A1 * | 11/2006 | Huang et al. ................. 430/302 |
| 2008/0160451 | A1 | 7/2008 | Inno et al. |
| 2009/0252642 | A1 * | 10/2009 | Uesugi et al. ................. 420/530 |

FOREIGN PATENT DOCUMENTS

| | | | |
|---|---|---|---|
| JP | 2938397 | B2 | 8/1999 |
| JP | 2001293971 | A | 10/2001 |
| JP | 2002055446 | A | 2/2002 |
| JP | 2002062660 | A | 2/2002 |
| JP | 2002088434 | A | 3/2002 |
| JP | 2002160466 | A | 6/2002 |
| JP | 2002214767 | A | 7/2002 |
| JP | 2002365791 | A | 12/2002 |
| JP | 2003255527 | A | 9/2003 |
| JP | 2003316021 | A | 11/2003 |
| JP | 2004292862 | A | 10/2004 |
| JP | 2005122177 | A | 5/2005 |
| JP | 2005522362 | A | 7/2005 |
| JP | 3788943 | B2 | 6/2006 |
| JP | 2007063586 | A | 3/2007 |
| JP | 2009098590 | A | 5/2009 |
| JP | 2009204829 | A | 9/2009 |

OTHER PUBLICATIONS

Notification of Reasons for Refusal, dated Dec. 18, 2012, issued in corresponding JP Application No. 2009-220443, 7 pages in English and Japanese.
Notification of Reasons for Refusal, dated Dec. 18, 2012, issued in corresponding JP Application No. 2009-220592, 7 pages in English and Japanese.
Notification of Reasons for Refusal, dated Dec. 18, 2012, issued in corresponding JP Application No. 2009-220406, 8 pages in English and Japanese.
Notification of Reasons for Refusal, dated Dec. 11, 2012, issued in corresponding JP Application No. 2009-218909, 8 pages in English and Japanese.
Chinese Office Action dated Nov. 27, 2013 issued in corresponding Chinese Application No. 201080042267.7, 26 pages in English and Chinese.
The Second Office Action, dated Jun. 26, 2014, issued in corresponding CN Application No. 201080042267.7, 20 pages in English and Chinese.
Communication, dated Oct. 16, 2015, issued in corresponding EP Application No. 10818681.8, 9 pages in English.

* cited by examiner

LITHOGRAPHIC PRINTING ORIGINAL PLATE

This application is a divisional of U.S. application Ser. No. 13/498,001, filed Mar. 23, 2012, which is a National Stage of International Application No. PCT/JP2010/065285 filed Sep. 7, 2010, claiming priority based on Japanese Patent Application No. 2009-218909, filed Sep. 24, 2009, Japanese Patent Application No. 2009-220406, filed Sep. 25, 2009, Japanese Patent Application No. 2009-220443, filed Sep. 25, 2009 and Japanese Patent Application No. 2009-220592, filed Sep. 25, 2009, the contents of all of which are incorporated herein by reference in their entirety.

TECHNICAL FIELD

The present invention relates to a presensitized plate.

BACKGROUND ART

A surface of an aluminum alloy plate is subjected to a surface treatment process including surface roughening treatment and anodizing treatment to obtain a support, a photosensitive material is then applied to the support and dried to obtain a so-called PS plate, the PS plate is then subjected to a plate-making process including image exposure, development and gum coating, and the resulting plate is generally used as an offset printing plate or lithographic printing plate. In such a plate-making process, part of the photosensitive layer which remains undissolved after development forms an image area, whereas the other part of the photosensitive layer which was removed to expose the aluminum surface under the photosensitive layer serves as a water-receptive portion because of its hydrophilic nature, thus forming a non-image area.

A lightweight rolled aluminum alloy plate having excellent surface treatment properties, workability and corrosion resistance is used as a support for offset printing or lithographic printing. Rolled aluminum alloy plates with a thickness of about 0.1 mm to about 0.5 mm made of materials such as JIS1050, JIS1100 and JIS3003 materials have been conventionally used for this purpose, and such rolled aluminum plates are used as printing plates after having undergone surface roughening treatment and its subsequent anodizing treatment.

Specifically, an aluminum lithographic printing plate obtained by carrying out mechanical graining treatment, chemical etching treatment and anodizing treatment in this order as described in Patent Literature 1; an aluminum lithographic printing plate obtained by carrying out electrochemical treatment, post-treatment and anodizing treatment in this order as described in Patent Literature 2; and an aluminum lithographic printing plate obtained by carrying out chemical etching treatment and anodizing treatment in this order as described in Patent Literature 3 are known.

Patent Literature 4 describes that defects of the photosensitive layer during storage can be suppressed by using an aluminum alloy support for a lithographic printing plate in which the number of aluminum carbide particles with a maximum length of 1 μm or more in a rolled plate made of a pure aluminum alloy is regulated to 30,000 pcs/g or less.

Patent Literature 5 describes that a presensitized plate having high adhesion to the photosensitive layer and a long press life can be obtained using a support containing intermetallic compound particles with a diameter of 0.1 μm or more in an amount of 5,000 to 35,000 pcs/mm$^2$.

Patent Literature 6 describes a presensitized plate excellent in laser exposure suitability and printing performance which uses a support obtained by surface-roughening an aluminum plate containing intermetallic compound particles within a depth of 2 μm from the surface at a density of 500 to 35,000 pcs/mm$^2$.

Patent Literature 7 describes obtaining a presensitized plate using a support having a uniformly roughened surface and obtained from an aluminum alloy which includes intermetallic compound particles dispersed in the planar direction at a density of 3,000 to 30,000 pcs/mm$^2$.

However, use of these supports was not enough to prevent the photosensitive layer from having defects during the storage of the resulting presensitized plates.

The plate-making step in conventional PS plates involves an operation for removing the non-image areas by dissolution in a highly alkaline developer after exposure to light and to simplify or eliminate such an additional wet process is a concern which is desired to be resolved for improvement over prior art. Especially in recent years, disposal of wastewater discharged in a wet process is a great concern in the whole of the industry with consideration for the global environment and therefore improvement in this aspect is further strongly requested.

On the other hand, as another recent trend in this field, digitization technology which includes electronic processing, storage and output of image information using a computer has been widely spread and various new image output systems compatible with the digitization technology have been put to practical use. This situation has drawn attention to computer-to-plate (CTP) technology in which a highly convergent radiation such as a laser beam is caused to carry digitized image information and a presensitized plate is scanned and exposed with this beam to directly manufacture a printing plate without using a lith film.

Among others, in order to solve the problem of wastewater treatment while achieving further step rationalization, researches have been made on a presensitized plate that can be directly mounted on a printing press after exposure to light without any development process and be used in printing, and various methods have been proposed therefor.

One of the methods for eliminating a treatment step is a method called "on-press development" in which an exposed presensitized plate is mounted on a plate cylinder of a printing press and fountain solution and ink are supplied as the plate cylinder is rotated to thereby remove non-image areas of the presensitized plate. In other words, this is a system in which the exposed presensitized plate is mounted on a printing press without any further treatment so that development completes in the usual printing process. The presensitized plate suitable for use in such on-press development is required to have an image recording layer which is soluble in fountain solution or an ink solvent and to have a light-room handling property capable of development on a printing press placed in a light room.

For instance, Patent Literature 8 describes a presensitized plate in which an image recording layer containing fine particles of a thermoplastic hydrophobic polymer dispersed in a hydrophilic binder polymer is provided on a hydrophilic support. Patent Literature 8 describes that the plate can be mounted on a plate cylinder of a printing press to remove unexposed areas using fountain solution and/or ink (on-machine development can be made) after an image has been formed by exposing the presensitized plate to a laser beam to coalesce together the thermoplastic hydrophobic polymer particles in the image recording layer by heat. The presensitized plate is photosensitive to the infrared region and therefore also has a light-room handling property.

Patent Literature 9 describes that a presensitized plate having an image recording layer which contains a thermoplastic particulate polymer and at least one of a particulate polymer having a heat-reactive group and a microcapsule containing a compound having a heat-reactive group has good on-press developability, a high sensitivity and a long press life.

However, in cases where the presensitized plates described in Patent Literatures 8 and 9 are stored for a long period of time, ink is prone to adhere to part of the non-image area surface, causing dot- or ring-shaped stains on printed paper. This defect is also hereinafter referred to as "corrosive micro-stains."

As for the CTP technology, high-power lasers including a semiconductor laser and a solid-state laser such as a YAG laser are recently available at low cost and therefore a plate-making method using high power density exposure with a high-power laser is highly promising.

Of those presensitized plates, one of the promising means suitable to a simple development process is a presensitized plate having an image recording layer which is a hydrophilic layer obtained by dispersing hydrophobic thermoplastic polymer particles in a hydrophilic binder polymer. This is the means which makes use of the conversion of the surface of the hydrophilic layer to a lipophilic image area due to fusion of the hydrophobic thermoplastic polymer particles upon exposure of the image recording layer.

Each of Patent Literatures 10 and 11 describes a method of making a lithographic printing plate which involves developing an image recording layer having hydrophobic thermoplastic polymer particles by a simple development process.

However, it has been difficult to sufficiently remove the image recording layer in non-image areas containing the hydrophobic thermoplastic polymer particles by a simple development means and the ingredients of the image recording layer remain in the non-image areas to cause stains in printing. In cases where a plate is stored for a long period of time, ink is prone to adhere to part of the non-image area surface, causing dot- or ring-shaped stains (hereinafter also referred to as "corrosive micro-stains") on printed paper.

Lithographic printing plate materials each containing a binder resin soluble in an aqueous alkali solution and an infrared absorbing dye generating heat by light absorption as essential ingredients are known as positive type recording materials compatible with an infrared laser having a photosensitive wavelength of 760 nm or more (see, for example, Patent Literatures 12 to 15).

Upon exposure of such a positive type recording material compatible with an infrared laser to infrared laser radiation, in unexposed areas (image areas), the solubility of the binder resin is substantially reduced by the interaction between the infrared absorbing dye or the like and the binder resin, and in the exposed areas (non-image areas), the infrared absorbing dye or the like absorbs light to generate heat, thus reducing the interaction between the infrared absorbing dye or the like and the binder resin. As a result, the exposed areas are only dissolved in the alkali developer and removed during development, whereby a lithographic printing plate is formed.

However, in such a positive type recording material compatible with an infrared laser, the exposed areas (non-image areas) are not dissolved in the alkali developer and part of the film remains in a spot shape (this defect is hereinafter referred to as "residual film spots"), which may cause printing stains.

In the development using an automatic developing machine, an exposed presensitized plate is repeatedly immersed in a development bath containing an alkali developer but aluminum scum (hereinafter referred to as "development scum") formed in the development bath during the passage of a number of presensitized plates through the automatic developer may be adhered to non-image areas of a lithographic printing plate to cause stains.

CITATION LIST

Patent Literature

Patent Literature 1: JP 48-49501 A;
Patent Literature 2: JP 51-146234 A;
Patent Literature 3: JP 48-28123 B;
Patent Literature 4: JP 2004-292862 A;
Patent Literature 5: JP 2002-160466 A;
Patent Literature 6: JP 3788943 B;
Patent Literature 7: JP 2002-88434 A;
Patent Literature 8: JP 2938397 B;
Patent Literature 9: JP 2001-293971 A;
Patent Literature 10: JP 2003-255527 A;
Patent Literature 11: JP 2003-316021 A;
Patent Literature 12: JP 11-44956 A;
Patent Literature 13: JP 2002-55446 A;
Patent Literature 14: JP 2002-62660 A;
Patent Literature 15: JP 2002-214767 A;

SUMMARY OF INVENTION

Technical Problems

A first object of the invention is to provide a presensitized plate having a uniformly roughened support shape, capable of obtaining a lithographic printing plate having a long press life and excellent scumming resistance, and causing no defect in the photosensitive layer even after a long-term storage.

A second object of the invention is to provide a presensitized plate having a long press life and excellent resistance to scum and corrosive micro-stains.

A third object of the invention is to provide a presensitized plate capable of suppressing the occurrence of residual film spots and development scum and obtaining a lithographic printing plate having excellent scumming resistance.

Solution to Problems

As for the foregoing first object of the invention, in a negative type presensitized plate having a photosensitive layer containing a sensitizing dye, a polymerization initiator, a polymerizable compound and a binder polymer, and a protective layer, an exposed area is cured to form an image area to which ink is attached, whereas an unexposed area is developed to form a non-image area. A long-term storage of such a presensitized plate may cause a problem that the exposed area to form the image area is lost in a circular shape to be turned into the non-image area. This defect may also be referred to as "white spot defect" in this application. It was observed that particularly a presensitized plate having a protective layer formed on a photosensitive layer tends to have enlarged defects in the photosensitive layer due to the storage. The inventors of the invention have found that this problem can be solved by using a support prepared from an aluminum alloy plate which contains intermetallic compound particles at a predetermined surface density or more and in which up to a predetermined amount of aluminum carbide particles with a predetermined size or more are included in the aluminum bulk, and a first aspect of the invention has been thus completed.

Accordingly, the first aspect of the invention provides the following (1) to (7).

(1) A presensitized plate comprising: a photosensitive layer containing (A) a sensitizing dye, (B) a polymerization initiator, (C) a polymerizable compound, and (D) a binder polymer; and a protective layer which are formed on a support in this order, wherein the support is prepared from an aluminum alloy plate containing intermetallic compound particles with a circle equivalent diameter of 0.2 µm or more at a surface density of 35,000 pcs/mm$^2$ or more and aluminum carbide particles with a maximum length of 1 µm or more in an amount of up to 30,000 pcs/g.

(2) The presensitized plate according to (1), wherein the support is one obtained by subjecting a surface of the aluminum alloy plate to surface roughening treatment including electrochemical graining treatment.

(3) The presensitized plate according to (1) or (2), wherein the support having undergone surface roughening treatment is further anodized to have an anodized film with an average thickness of 1.0 µm or more.

(4) The presensitized plate according to any one of (1) to (3), wherein the aluminum alloy plate is one manufactured by a continuous casting process.

(5) The presensitized plate according to any one of (1) to (4), including the photosensitive layer having a weight ratio of the polymerizable compound to the binder polymer (polymerizable compound weight/binder polymer weight) of 2 to 4.

(6) The presensitized plate according to any one of (1) to (5), wherein the sensitizing dye is one having an absorption maximum at 350 to 450 nm.

(7) The presensitized plate according to any one of (1) to (6), wherein the protective layer comprises a composition containing polyvinyl alcohol.

As for the second object of the invention, the inventors of the invention have made a study on why such corrosive micro-stains occur and focused attention on the fact that the image recording layer provided in the so-called on-press development type presensitized plates described in Patent Literatures 8 and 9 can be removed by printing ink and/or fountain solution and therefore contains large amounts of hydrophilic components, as a result of which the image recording layer is likely to be receptive to moisture under the influence of ambient air. It was made clear that in the so-called on-press development type presensitized plates described in Patent Literatures 8 and 9, the aluminum alloy plate is corroded by the presence of moisture included in the image recording layer due to ambient air or the like and a hydrophilic ingredient (hereinafter referred to simply as "anion") anionized by the moisture, thus leading to corrosive micro-stains.

Attention was focused on the fact that, also in the methods of preparing the lithographic printing plates described in Patent Literatures 10 and 12, the image recording layer having the hydrophobic thermoplastic polymer particles is the one including an array of the hydrophobic thermoplastic polymer particles and therefore moisture is easily included in the image recording layer by ambient air or other factor. It was made clear that the aluminum alloy plate is corroded by the presence of moisture included in the image recording layer due to ambient air or the like and a hydrophilic ingredient (hereinafter referred to simply as "anion") anionized by the moisture, thus leading to corrosive micro-stains.

On the other hand, as for the intermetallic compounds in an aluminum alloy plate, for example, JP 2005-330588 A, JP 2005-232596 A, and JP 11-151870 A each describe intermetallic compounds contained in an aluminum alloy plate for a lithographic printing plate.

More specifically, it is described that Al—Fe intermetallic compounds more easily serve as starting points for pit formation during electrolytic graining than Al—Fe—Si intermetallic compounds and that, of those Al—Fe intermetallic compounds, metastable Al—Fe intermetallic compounds more easily serve as starting points for pit formation. JP 2005-330588 A describes that uniform graining is achieved at a ratio between the number of metastable phase particles having a content ratio of iron to aluminum of 0.6 or less and the total number of intermetallic compound particles of at least 0.35. In addition, JP 2005-232596 A describes an aluminum alloy plate containing on average 0.5 to 2.0% of Al—Fe crystals. JP 11-151870 A describes that the ratio of the number of Al—Fe intermetallic compound particles to the number of Al—Fe—Si intermetallic compound particles is 0.7 or more.

However, these patent documents do not mention any intermetallic compounds for suppressing the corrosion of the aluminum substrate due to the image recording layer.

The inventors of the invention have found that a presensitized plate having a long press life and excellent resistance to scum and corrosive micro-stains can be obtained using a support prepared from an aluminum alloy plate containing intermetallic compound particles at a surface density of 35,000 pcs/mm$^2$ or more and second and third aspects of the invention have been thus completed.

Accordingly, the second aspect of the invention provides the following (8) to (15).

(8) A presensitized plate comprising: an image recording layer containing (E) an infrared absorbing dye and (F) hydrophobic thermoplastic particles and formed on a support, wherein the support is prepared from an aluminum alloy plate containing intermetallic compound particles with a circle equivalent diameter of 0.2 µm or more at a surface density of 35,000 pcs/mm$^2$ or more.

(9) The presensitized plate according to (8), wherein the hydrophobic thermoplastic particles are styrene-acrylonitrile particles.

(10) The presensitized plate according to (8) or (9), wherein the aluminum alloy plate contains intermetallic compound particles with a circle equivalent diameter of 1.0 µm or more at a surface density of up to 2,500 pcs/mm$^2$.

(11) The presensitized plate according to any one of (8) to (10), wherein Al—Fe intermetallic compounds of the aluminum alloy plate have peak count values as measured with an X-ray diffractometer (XRD) of up to 400 cps and AlFeSi intermetallic compounds of the aluminum alloy plate have peak count values of up to 30 cps.

(12) The presensitized plate according to any one of (8) to (11), wherein a micropore-bearing anodized film is formed on a surface side of the support on which the image recording layer is to be formed, an average pore size in a surface layer of the anodized film is from 10 to 75 nm, and a ratio of an average of a maximum diameter inside pores to the average pore size is from 1.1 to 3.0.

(13) The presensitized plate according to any one of (8) to (12), wherein the anodized film is formed by anodizing treatment using an electrolytic solution containing sulfuric acid or phosphoric acid.

(14) The presensitized plate according to any one of (8) to (13), wherein the aluminum alloy plate is one manufactured by a continuous casting process.

(15) A method of manufacturing a lithographic printing plate comprising: performing image recording on the presensitized plate according to any one of (8) to (14); and rubbing a plate surface with a rubbing member in the presence of a treatment solution in an automatic processor equipped with the rubbing member to remove non-image areas of the image recording layer.

Accordingly, the third aspect of the invention provides the following (16) to (26).

(16) A presensitized plate comprising: an image recording layer containing (G) a sensitizing dye, (H) a polymerization initiator, (I) a polymerizable compound, and (J) a polymer and formed on a support, unexposed portions of the image recording layer removed with printing ink and/or fountain solution, wherein the support is prepared from an aluminum alloy plate containing intermetallic compound particles with a circle equivalent diameter of 0.2 μm or more at a surface density of 35,000 pcs/mm² or more.

(17) The presensitized plate according to (16), wherein the aluminum alloy plate contains intermetallic compound particles with a circle equivalent diameter of 1.0 μm or more at a surface density of up to 2,500 pcs/mm².

(18) The presensitized plate according to (16) or (17), comprising an oxygen shield layer on the image recording layer.

(19) The presensitized plate according to (16) or (17), comprising no oxygen shield layer on the image recording layer.

(20) The presensitized plate according to any one of (16) to (19), wherein the polymer (J) has an alkylene oxide chain.

(21) The presensitized plate according to any one of (16) to (20), wherein the polymer (J) is particulate.

(22) The presensitized plate according to any one of (16) to (21), wherein Al—Fe intermetallic compounds of the aluminum alloy plate have peak count values as measured with an X-ray diffractometer (XRD) of up to 400 cps.

(23) The presensitized plate according to any one of (16) to (22), wherein AlFeSi intermetallic compounds of the aluminum alloy plate have peak count values as measured with an X-ray diffractometer (XRD) of up to 30 cps.

(24) The presensitized plate according to any one of (16) to (23), wherein a micropore-bearing anodized film is formed on a surface side of the support on which the image recording layer is to be formed, an average pore size in a surface layer of the anodized film is from 10 to 75 nm, and a ratio of an average of a maximum diameter inside pores to the average pore size is from 1.1 to 3.0.

(25) The presensitized plate according to any one of (16) to (24), wherein the anodized film is formed by anodizing treatment using an electrolytic solution containing sulfuric acid or phosphoric acid.

(26) The presensitized plate according to any one of (16) to (25), wherein the aluminum alloy plate is one manufactured by a continuous casting process.

The inventors of the invention have made an intensive study on the foregoing third object of the invention and as a result found that the occurrence of residual film spots and development scum can be suppressed to obtain a lithographic printing plate having excellent scumming resistance by using a support formed using an aluminum alloy plate containing intermetallic compound particles with a circle equivalent diameter of 0.2 μm or more at a surface density of 35,000 pcs/mm² or more and the fourth aspect of the invention has been thus completed.

The fourth aspect of the invention provides the following (27) to (36).

(27) A presensitized plate comprising: an image recording layer containing (K) an infrared absorber and (L) an alkali-soluble resin and formed on a support, exposed portions of the image recording layer having an increased alkali solubility after exposure to infrared radiation, wherein the support is formed from an aluminum alloy plate containing intermetallic compound particles with a circle equivalent diameter of 0.2 μm or more at a surface density of more than 35,000 pcs/mm².

(28) The presensitized plate according to (27), wherein the aluminum alloy plate contains intermetallic compound particles with a circle equivalent diameter of 1.0 μm or more at a density of up to 2,500 pcs/mm².

(29) The presensitized plate according to (27) or (28), wherein the alkali-soluble resin (L) is a phenol resin.

(30) The presensitized plate according to (29), wherein the phenol resin is a novolac resin.

(31) The presensitized plate according to any one of (27) to (30), wherein the aluminum alloy plate is manufactured by a continuous casting process.

(32) The presensitized plate according to (31), wherein the aluminum alloy plate is obtained by the continuous casting process which includes feeding an aluminum alloy melt through a melt feed nozzle between a pair of cooling rollers and rolling the aluminum alloy melt while solidifying with the pair of cooling rollers.

(33) The presensitized plate according to any one of (27) to (32), wherein the support is one obtained by subjecting a surface of the aluminum alloy plate to surface roughening treatment including electrochemical graining treatment.

(34) The presensitized plate according to (33), wherein the surface roughening treatment is one including anodizing treatment following the electrochemical graining treatment.

(35) The presensitized plate according to (34), wherein the anodizing treatment is one using an electrolytic solution containing sulfuric acid or phosphoric acid.

(36) A method of manufacturing a lithographic printing plate comprising:

an image recording step for recording an image on the presensitized plate according to any one of (27) to (35) by imagewise exposure; and a development step for developing the presensitized plate having the image recorded thereon with a developer at a pH of 9 or more to obtain the lithographic printing plate.

Advantageous Effects of Invention

According to the first aspect of the invention, a presensitized plate causing no defect in the photosensitive layer even after a long-term storage can be obtained. The presensitized plate according to the first aspect of the invention has a long press life and excellent scumming resistance.

According to the second and third aspects of the invention, a presensitized plate having a long press life and excellent resistance to scum and corrosive micro-stains can be obtained.

According to the fourth aspect of the invention, a presensitized plate capable of suppressing the occurrence of residual film spots and development scum and obtaining a lithographic printing plate having excellent scumming resistance can be provided.

It is not clear why the occurrence of residual film spots can be suppressed but the inventors of the invention presume as follows: Namely, the cause for the occurrence of residual film spots would be that the image recording layer enters relatively large recesses which may be formed during surface roughening treatment on the surface of the aluminum alloy plate and remains undissolved during development. The inventors of the invention revealed that when relatively large intermetallic compound particles with a circle equivalent diameter of, for example, 1.0 μm or more are present at the surface of the aluminum alloy plate, relatively large recesses may be formed from the intermetallic compound particles upon surface roughening treatment (in particular alkali etching treatment). Therefore, it is considered that use of an aluminum alloy plate containing intermetallic compound particles with a circle equivalent diameter of 0.2 μm or more at a surface density of 35,000 pcs/mm$^2$ or more reduces the amount of relatively large intermetallic compound particles and as a result large recesses may not be formed by surface roughening treatment to suppress the occurrence of residual film spots.

The inventors of the invention also revealed for the occurrence of development scum that, when relatively large intermetallic compound particles are present at the surface of a non-image area in the presensitized plate, that is, at the surface of the aluminum alloy plate (support), they may serve as nuclei (starting points) for scum in the development bath. Therefore, it is considered that use of an aluminum alloy plate containing intermetallic compound particles with a circle equivalent diameter of 0.2 μm or more at a surface density of 35,000 pcs/mm$^2$ or more reduces the amount of relatively large intermetallic compound particles and as a result the occurrence of nuclei for scum in the development bath is suppressed.

DESCRIPTION OF EMBODIMENTS

Figure 1:
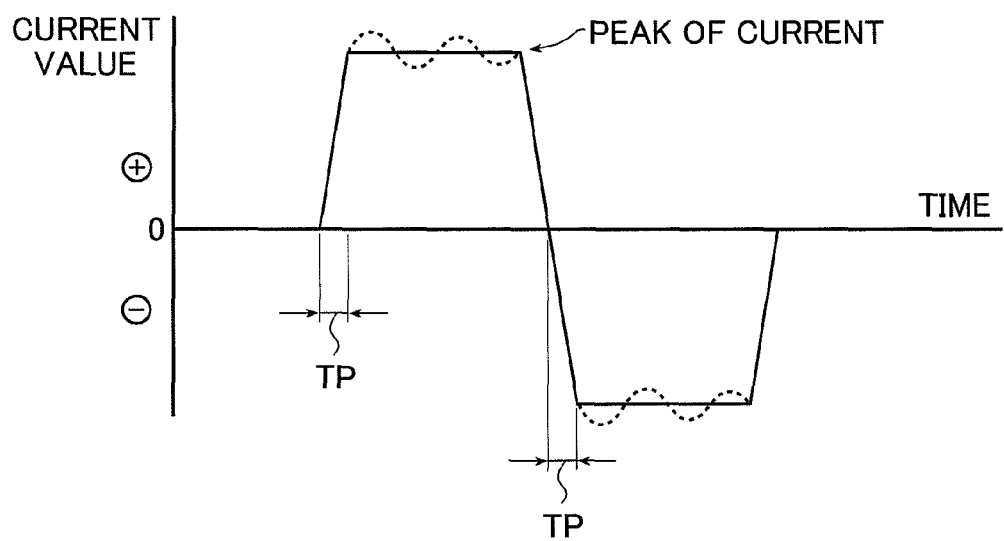
FIG. 1 is a graph showing an example of an alternating current waveform that may be used in electrochemical graining treatment.

The invention is described in detail below.
First of all, the first aspect of the invention is described.
The presensitized plate in the first aspect of the invention includes a photosensitive layer containing (A) a sensitizing dye, (B) a polymerization initiator, (C) a polymerizable compound, and (D) a binder polymer, and a protective layer which are formed on a support in this order and is characterized in that the support is prepared from an aluminum alloy plate in which a surface density of intermetallic compound particles with a circle equivalent diameter of 0.2 μm or more is 35,000 pcs/mm$^2$ or more and a number of aluminum carbide particles with a maximum length of 1 μm or more is up to 30,000 pcs/g.

As described above, a long-term storage of a negative type presensitized plate having a photosensitive layer containing a sensitizing dye, a polymerization initiator, a polymerizable compound and a binder polymer, and a protective layer may cause a problem (so-called "white spot defect") that an exposed portion to form an image area is lost in a circular shape to be turned into a non-image area. Although the detail of the reason is not clear, it is presumed that aluminum carbide and/or intermetallic compounds at the surface of the support may react with moisture in the air during the long-term storage to generate air bubbles and lift the photosensitive layer and protective layer, thus causing white spot defects. That is, although the effect obtained by merely adjusting the amount of aluminum carbide is limited, it is considered that by using an aluminum alloy plate containing aluminum carbide adjusted in amount and intermetallic compound particles at a larger surface density than a predetermined value, the size of the individual intermetallic compound particles is reduced, whereby a presensitized plate having a long press life and excellent scumming resistance with suppressed white spot defects is obtained.

The surface density of intermetallic compounds with a circle equivalent diameter of 0.2 μm or more is preferably more than 30,000 pcs/mm$^2$ and more preferably 35,000 pcs/mm$^2$ or more. In the case of an aluminum alloy plate having a surface density of intermetallic compound particles within the foregoing range, the individual intermetallic compound particles present at the surface of the aluminum alloy plate are reduced in size and the surface obtained after surface roughening treatment is uniformly grained and therefore the lithographic printing plate obtained using the aluminum support has a long press life and excellent scumming resistance and the risk of occurrence of white spot defects is reduced by adjusting the amount of aluminum carbide in the aluminum alloy.

It is also newly found that intermetallic compound particles present at the surface of the aluminum alloy plate serve as effective starting points for reaction upon electrochemical graining treatment of the aluminum alloy plate, and the uniformity of the electrolytically grained surface is improved by using the aluminum alloy plate containing intermetallic compound particles with a circle equivalent diameter of 0.2 μm or more at a surface density of 35,000 pcs/mm$^2$ or more.

In addition, the number of intermetallic compound particles with a circle equivalent diameter of more than 1 μm which are present at the surface of the aluminum alloy plate is preferably small. More specifically, the number of intermetallic compound particles with a circle equivalent diameter of 1.0 μm or more at the surface of the aluminum alloy plate is preferably up to 2,500 pcs/mm$^2$ and more preferably up to 2,000 pcs/mm$^2$.

The number and density of intermetallic compound particles at the surface of the aluminum alloy plate can be measured by the following methods.

First, the aluminum alloy plate from which the surface oil was wiped off is used as a measurement sample.

Then, a scanning electron microscope (PC-SEM7401F, JEOL Ltd.) is used to capture a reflected electron image of the surface of the aluminum alloy plate at an acceleration voltage of 12.0 kV and a magnification of 2,000×.

Images at five positions arbitrarily selected from the resulting reflected electron image are saved into JPEG format and converted to bmf (bitmap file) format with MS-Paint (Microsoft Corporation).

This bmf format file is read into image analysis software ImageFactroy Ver. 3.2, Japanese version (Asahi-Hitec. K.K.) to carry out image analysis. Thereafter, the images are statically binarized to count the portions corresponding to intermetallic compound white spots. The circle equivalent diameter is specified as a characteristics amount to obtain the particle size distribution.

The density of intermetallic compound particles with a circle equivalent diameter of 0.2 μm or more is calculated from the results of the particle size distribution. The numbers calculated from the respective image data at the five positions (particle size distribution) are averaged and the average is rounded to the nearest 1,000.

After the manufacture of the presensitized plate, the density of intermetallic compound particles or the number of intermetallic compound particles at the surface of the aluminum alloy plate can be measured in the same manner on the back side of the aluminum alloy plate on which no photosensitive layer is formed.

The intermetallic compounds present in the aluminum alloy plate depend on the metallic elements contained in the aluminum alloy plate. To be more specific, in a preferred embodiment of the aluminum alloy plate to be described later which contains Al, Si and Fe as its essential ingredients, intermetallic compounds including Al—Fe intermetallic compounds such as $Al_3Fe$, $Al_6Fe$, $Al_mFe$ and AlFeSi intermetallic compounds such as α-AlFeSi and β-AlFeSi are present in the aluminum alloy plate.

The aluminum alloy plate that may be used in the first aspect of the invention contains at least 99 wt % of aluminum and also contains as trace elements at least one element selected from the group consisting of Si, Fe, Ni, Mn, Cu, Mg, Cr, Zn, Bi, Ti and V.

The aluminum alloy plate that may be used in the first aspect of the invention is preferably the aluminum alloy plate to be described later which contains Al, Si and Fe as its essential ingredients.

The inventors of the invention have found that the size and number of intermetallic compound particles in the aluminum alloy plate can be adjusted to proper values by adjusting the heat treatment temperature and time during the manufacture of the aluminum alloy plate to proper values.

In the first aspect of the invention, a continuous casting and rolling process to be described later is preferably used to adjust the size and number of intermetallic compound particles in the aluminum alloy plate to specific values.

In the aluminum alloy plate that may be used in the first aspect of the invention, the number of aluminum carbide particles with a maximum length of 1 μm or more is up to 30,000 pcs/g.

Extremely fine aluminum carbide particles with a maximum length of less than 1 μm are usually corroded and lost during surface roughening treatment and an anodized film is normally formed at that portion. Therefore such aluminum carbide particles cause no particular problem. On the other hand, aluminum carbide particles with a maximum length of 1 μm or more still remain after surface roughening treatment to hinder the formation of an anodized film at that portion and cause corrosion of the aluminum carbide particles upon subsequent contact with fountain solution and therefore if carbide particles with such a given size or more are present at a density of a predetermined value per g of aluminum or more, the carbide particles may serve as starting points to considerably reduce the ink scum resistance. Formation of a reaction product such as a hydrate may cause a defect in the photosensitive layer itself and the protective layer formed thereon. Then, in the first aspect of the invention, this problem was solved by adjusting the number of aluminum carbide particles with a maximum length of 1 μm or more in the rolled plate to 30,000 pcs/g or less and the surface density of intermetallic compound particles with a circle equivalent diameter of 0.2 μm or more to 35,000 pcs/mm² or more. The number of aluminum carbide particles with a maximum length of 1 μm or more is more preferably adjusted to 27,000 pcs/g or less. The number of aluminum carbide particles with a maximum length of 1 μm or more is even more preferably 19,000 pcs/g or less and still even more preferably 10,000 pcs/g or less.

The number of carbide particles in aluminum is measured as follows.

First, an aluminum sample in a weight of 1 g is taken from a rolled plate and immersed in 100 mL of dehydrated methanol (guaranteed reagent). Then, several drops of bromine (guaranteed reagent) are mixed (the whole of the vessel is cooled to prevent the temperature from exceeding 40° C.) and added in an amount of 5 mL to completely dissolve the aluminum at 40° C. in 3 hours. Then, the solution is filtered through a Teflon (registered trademark) filter with a mesh size of 1 μm, and 50 mL of 10% NaOH solution is poured through the filter at room temperature and reacted for 10 minutes. Then, the filter is washed with water and dried. A given area of the filter is observed by SEM at 2,000× and the number of particles identified as aluminum carbide is measured from elemental analysis such as EPMA or EDX analysis. The number of aluminum carbide particles contained in 1 g of dissolved aluminum is calculated from the relation between the measured number in the given area and the total filtration area of the filter.

[Aluminum Alloy Plate (Rolled Aluminum)]

A preferred embodiment of the aluminum alloy plate that may be used in the first aspect of the invention is described below.

The preferred embodiment of the aluminum alloy plate that may be used in the first aspect of the invention contains aluminum in an amount of at least 99 wt %, silicon in an amount of 0.03 to 0.20 wt % and iron in an amount of 0.11 to 0.45 wt %. The silicon content in solid solution is preferably from 120 to 600 ppm and the iron content in solid solution is preferably up to 100 ppm.

Use of the preferred embodiment of the above-described aluminum alloy plate enables the stability of electrolytic graining treatment to be improved while enhancing the uniformity of the electrolytically grained surface. Supports having uniformly roughened surfaces can be thus obtained after electrolysis under various electrolytic graining treatment conditions and use of such supports enables presensitized plates having excellent scumming resistance and a long press life to be obtained.

The alloying ingredients of the aluminum alloy plate in the preferred embodiment are Al, Fe and Si but the aluminum alloy plate may contain copper (Cu) as an optional ingredient.

Silicon is an element which is contained in an amount of around 0.03 to 0.1 wt % as an inevitable impurity in the aluminum ingot serving as the starting material. A very small amount of silicon is often intentionally added to prevent variations due to starting material differences. Silicon is present in the state of solid solution in aluminum or as an intermetallic compound or a single deposit.

In the first aspect of the invention, the silicon content is preferably 0.03 to 0.20 wt %, more preferably 0.04 to 0.18 wt % and even more preferably 0.05 to 0.15 wt %.

At a silicon content within the above-defined range, a necessary silicon content in solid solution is ensured, and even when electrolytic graining treatment is followed by anodizing treatment, defects do not readily occur in the anodized film, thus enabling the lithographic printing plate obtained to have good scumming resistance.

In the first aspect of the invention, the silicon content in solid solution is preferably 120 to 600 ppm, more preferably 150 to 600 ppm and even more preferably 150 to 500 ppm.

When the silicon content in solution is within this range, the surface after electrolytic graining treatment is uniform and pits having an average opening diameter of 0.01 to 0.05 μm and those having an average opening diameter of 0.05 to 1.5 μm are uniformly formed at the entire surface.

Iron is an element which enters into solid solution in aluminum in a small amount and almost remains as intermetallic compounds.

In the first aspect of the invention, the iron content is preferably 0.11 to 0.45 wt %, more preferably 0.15 to 0.45 wt % and even more preferably 0.20 to 0.43 wt %.

When the iron content is within this range, iron is dispersed as fine intermetallic compound particles, which serve as starting points for electrolytic graining treatment and as a result the surface is uniformly roughened by electrolysis.

In the first aspect of the invention, the iron content in solid solution is preferably up to 100 ppm, more preferably up to 50 ppm and even more preferably up to 40 ppm in order to ensure necessary iron intermetallic compounds.

The ion content in solid solution is preferably at least 10 ppm in order to ensure the heat resistance of the aluminum alloy plate.

Copper is an important element for controlling electrolytic graining treatment and may be optionally contained.

In the first aspect of the invention, when copper is to be contained, the copper content is preferably up to 0.030 wt % in order to keep the uniformity in electrolytic graining.

Elements which have a crystal grain refining effect do not affect the uniformity in electrolytic graining and may be therefore appropriately added to prevent cracks from being formed during casting. To this end, for example, titanium may be added in a range of up to 0.05 wt % and boron in a range of up to 0.02 wt %.

The aluminum alloy plate contains aluminum and inevitable impurities as the balance.

Examples of the inevitable impurities include Mg, Mn, Zn, Cr, Zr, V, Zn and Be. These may be contained in amounts of not more than 0.05 wt %, respectively.

Most of the inevitable impurities will originate from the aluminum material. If the inevitable impurities are what is present in an ingot having an aluminum purity of 99.5%, they will not compromise the intended effects of the invention.

The inevitable impurities may be, for example, impurities included in the amounts mentioned in Aluminum Alloys: Structure and Properties, by L. F. Mondolfo (1976).

The aluminum alloy plate in the preferred embodiment is preferably manufactured by continuous casting in which an aluminum alloy melt is fed through a melt feed nozzle between a pair of cooling rollers and rolled as it is being solidified by the pair of cooling rollers.

Rolling by means of continuous casting yields fine and uniform crystals because of a large solidification rate at the surface of a cast material, and does not require soaking treatment of an ingot which is necessary in DC casting, or a long-time treatment. The aluminum alloy plate obtained thereby has a consistent quality and is appropriate for use as a blank of a lithographic printing plate support.

To be more specific, the following preferable methods may be used.

First, an aluminum alloy melt that has been adjusted to a given alloying ingredient content is optionally subjected to cleaning treatment by an ordinary method.

Cleaning treatment is carried out, for example, by degassing treatment for removing hydrogen and other unwanted gases from the melt (e.g., flux treatment using argon gas, chlorine gas or the like); filtering treatment using, for example, what is referred to as a rigid media filter (e.g., ceramic tube filter, ceramic foam filter), a filter that employs alumina flakes, alumina balls or the like as the filter medium, or a glass cloth filter; or a combination of degassing treatment and filtering treatment.

Upon the manufacture of a rolled plate from an aluminum alloy, it is preferred to use one of steps including 1) holding the melt obtained by melting the alloy for 10 minutes or more in the melting stage prior to casting, 2) subsequently carrying out in-line degassing treatment, and 3) further passing the melt through an in-line filter and subjecting it to casting, or a combination of two or more thereof because the number of aluminum carbide particles with a maximum length of 1 μm or more in the rolled plate can be easily adjusted to 30,000 pcs/g or less even when the aluminum alloy used contains the carbide in a relatively large amount.

It is also preferred for the step to be simple as in a continuous casting process, because the number of aluminum carbide particles with a maximum length of 1 μm or more can be easily adjusted to 30,000 pcs/g or less because of a small amount of carbon (C) incorporated from the outside.

Such cleaning treatment is preferably carried out to prevent defects due to foreign matter such as nonmetallic inclusions and oxides in the melt, and defects due to dissolved gases in the melt. Melt filtration is described in, for example, JP 6-57432 A, JP 3-162530 A, JP 5-140659 A, JP 4-231425 A, JP 4-276031 A, JP 5-311261 A, and JP 6-136466 A. Melt degassing is described in, for example, JP 5-51659 A and JP 5-49148 U. The present applicant proposes a technique concerning the melt degassing in JP 7-40017 A.

Then, the melt having optionally undergone cleaning treatment is used to carry out continuous casting.

Continuous casting is a step in which an aluminum alloy melt is fed through a melt feed nozzle between a pair of cooling rollers and rolled therebetween as it is solidified, and is carried out by using processes which use cooling rolls, such as the twin roll process (Hunter process) and the 3C process; and processes which use a cooling belt or a cooling block, such as the twin belt process (Hazelett process) and the Alusuisse Caster II process.

Continuous casting processes generally have a faster cooling rate than DC casting processes, and thus are characterized by the ability to achieve a higher solid solubility of alloying ingredients in the aluminum matrix. The melt is solidified at a cooling rate of 100 to 1,000° C./s.

A cooling rate within the above-defined range is preferred because the density of intermetallic compound particles with a circle equivalent diameter of 0.2 μm or more at the surface of the resulting aluminum alloy plate can be easily adjusted to 35,000 pcs/mm$^2$ or more.

The techniques relating to continuous casting processes that have been proposed by the present applicant are described in, for example, JP 3-79798 A, JP 5-201166 A, JP 5-156414 A, JP 6-262203 A, JP 6-122949 A, JP 6-210406 A and JP 6-26308 A.

When continuous casting is carried out by, for example, a process involving the use of cooling rolls (e.g., the Hunter process), the melt can be directly and continuously cast as a plate having a thickness of 1 to 10 mm, thus making it possible to omit the hot rolling step.

When use is made of a process that employs a cooling belt (e.g., the Hazelett process), a cast plate having a thickness of 10 to 50 mm can be obtained. Generally, a hot-rolling roll is positioned immediately downstream of a casting machine, and the cast plate is successively rolled, enabling a continuously cast and rolled plate having a thickness of 1 to 10 mm to be obtained.

In the first aspect of the invention, in terms of producing intermetallic compounds in large amounts, the process involving the use of cooling rolls is preferred and the plate is preferably rolled to a thickness of 7 mm or less.

The aluminum alloy plate obtained as a result of continuous casting is then optionally passed through a step such as cold rolling, and thereby finished to a specified plate thickness of, for example, 0.1 to 0.5 mm.

In the first aspect of the invention, intermediate annealing may be carried out before or after cold rolling, or even during cold rolling to increase the silicon content in solid solution or to suppress the iron content in solid solution. Suitable intermediate annealing also has the crystal grain refining effect and can ameliorate the surface quality.

Intermediate annealing at an excessively high temperature or for an excessively long period of time is desirably avoided in terms of reasonable size and number of intermetallic compound particles. It is particularly desired to avoid a heat treatment temperature exceeding 550° C. and a heat treatment time exceeding 36 hours, because the intermetallic compounds may enter into solid solution in aluminum again or metastable intermetallic compounds such as α-AlFeSi and β-AlFeSi may turn into stable $Al_3Fe$.

The intermediate annealing conditions may consist of 2 to 20 hours of heating at 280 to 550° C., preferably 2 to 10 hours of heating at 350 to 550° C., and more preferably 2 to 5 hours of heating at 350 to 550° C. in a batch-type annealing furnace, or of heating for up to 6 minutes at 400 to 550° C., and preferably up to 2 minutes at 450 to 550° C. in a continuous annealing furnace.

The aluminum alloy plate finished into the given thickness as in a range of 0.1 to 0.5 mm by the above-described steps may be further treated by a leveling apparatus such as a roller leveler or a tension leveler to improve the flatness. The flatness may be improved after the aluminum alloy plate has been cut into discrete sheets. However, to enhance productivity, it is preferable to improve the flatness of the aluminum alloy plate in the state of a continuous coil.

It is also possible to feed the aluminum alloy plate into a slitter line so as to form it into a given plate width.

A thin film of oil may be provided on the aluminum alloy plate surface to prevent scuffing due to friction between adjoining aluminum alloy plates. Suitable use may be made of either a volatile or non-volatile oil film, as needed.

<Surface Roughening Treatment>

The support that may be used in the presensitized plate according to the first aspect of the invention can be prepared by subjecting the surface of the aluminum alloy plate obtained by the above-described continuous casting step and various steps carried out as desired (e.g., intermediate annealing step, cold rolling step) to surface roughening treatment.

In general, mechanical graining treatment, chemical graining treatment and electrochemical graining treatment are used for the surface roughening treatment alone or in combination of two or more.

In the first aspect of the invention, it is preferable for the surface roughening treatment to include at least electrolytic graining treatment and for the electrolytic graining treatment to be preceded by alkali etching treatment (first alkali etching treatment) and followed by alkali etching treatment (second alkali etching treatment).

It is preferable for the surface graining treatment to include two electrochemical graining treatment steps and for etching treatment with an aqueous alkali solution to be carried out therebetween. More specifically, in a suitable treatment, the aluminum alloy plate is subjected to, in order, etching treatment in an aqueous alkali solution (first alkali etching treatment), desmutting treatment in an aqueous acid solution (first desmutting treatment), electrochemical graining treatment in a nitric acid- or hydrochloric acid-containing aqueous solution (first electrolytic graining treatment), etching treatment in an aqueous alkali solution (second alkali etching treatment), desmutting treatment in an aqueous acid solution (second desmutting treatment), electrochemical graining treatment in a hydrochloric acid-containing aqueous solution (second electrolytic graining treatment), etching treatment in an aqueous alkali solution (third alkali etching treatment), desmutting treatment in an aqueous acid solution (third desmutting treatment), and anodizing treatment.

The above-described alkali etching treatment (first alkali etching treatment) is preferably preceded by mechanical graining treatment.

It is also preferable for anodizing treatment to be further followed by sealing treatment and hydrophilizing treatment.

The method of manufacturing the support that may be used in the presensitized plate according to the first aspect of the invention may include various other steps than those described above.

The respective surface treatment steps are described below in detail.

<Mechanical Graining Treatment>

In the first aspect of the invention, it is preferable to carry out mechanical graining treatment that is done for the purpose of adjusting the center-line mean surface roughness of the aluminum alloy plate surface in a range of 0.35 to 1.0 μm.

Brush graining that may be advantageously used for mechanical graining treatment is described below.

Brush graining is generally carried out with a roller brush obtained by setting many bristles made of a synthetic resin such as nylon (trade name), propylene or vinyl chloride resin), on the surface of a cylindrical roller core. Brush graining is carried out by rubbing one or both sides of the aluminum alloy plate while spraying an abrasive-containing slurry onto the rotating roller brush.

The roller brush and the slurry may be replaced by a polishing roller that is a roller having a polishing layer formed on the surface thereof.

In the case of using the roller brush, the bristles on the brush that may be used have a flexural modulus of preferably 10,000 to 40,000 $kg/cm^2$, and more preferably 15,000 to 35,000 $kg/cm^2$, and have a stiffness of preferably 500 g or less, and more preferably 400 g or less. The bristles generally have a diameter of 0.2 to 0.9 mm. The bristle length may be determined as appropriate depending on the outer diameter of the roller brush and the diameter of the roller core, but the bristles generally have a length of 10 to 100 mm.

In the first aspect of the invention, it is preferable to use a plurality of nylon brushes, more preferably at least three nylon brushes and most preferably at least four nylon brushes. Adjustment of the number of brushes enables the wavelength components of the pits formed at the aluminum alloy plate surface to be adjusted.

The brush rollers are pressed against the aluminum alloy plate until the load on the driving motor that rotates the brushes is preferably at least 1 kW, more preferably at least 2 kW and most preferably at least 8 kW greater than before the brush rollers are pressed against the plate. Adjustment of the load enables the depth of the pits formed at the aluminum alloy plate surface to be adjusted. The rotation speed of the brushes is preferably at least 100 rpm and more preferably at least 200 rpm.

Use may be made of known abrasives including pumice, silica sand, aluminum hydroxide, alumina powder, silicon carbide, silicon nitride, volcanic ash, carborundum, emery, and a mixture thereof. Of these, pumice and silica sand are preferable. Silica sand is harder and less brittle than pumice and is therefore excellent in graining efficiency. An excessive load may break particles of aluminum hydroxide, so aluminum hydroxide is appropriate in the case where formation of locally deep pits is not desired.

The abrasive preferably has a median diameter of 2 to 100 µm and more preferably 20 to 60 µm because the graining efficiency is excellent and the graining pitch can be narrowed. Adjustment of the abrasive median diameter enables the depth of the pits formed at the aluminum alloy plate surface to be adjusted.

The abrasive is suspended in, for example, water to be used as a slurry. In addition to the abrasive, the slurry may contain a thickening agent, a dispersant (e.g., a surfactant) and a preservative. The slurry preferably has a specific gravity of 0.5 to 2.

For example, an apparatus described in JP 50-40047 B is suitable for use in mechanical graining treatment.

The apparatus that may be used in mechanical graining treatment with brushes and an abrasive is mentioned in detail in commonly assigned JP 2002-211159 A.

Another process than brush graining that may be used in mechanical graining treatment is a process in which transfer is carried out at the end of the above-described cold rolling to form irregularities at the plate surface. In the first aspect of the invention, this process may be applied instead of or together with brush graining.

<First Alkali Etching Treatment>

In the first alkali etching treatment, the aluminum alloy plate is brought into contact with an alkali solution so as to dissolve the surface layer.

The purpose of the first alkali etching treatment carried out prior to electrolytic graining treatment (first electrolytic graining treatment) is to smooth the roughened surface in cases where mechanical graining treatment was carried out, to form uniform pits in electrolytic graining treatment (first electrolytic graining treatment) and to remove substances such as rolling oil, contaminants and a naturally oxidized film from the surface of the aluminum alloy plate in cases where no mechanical graining treatment was carried out.

The amount of material removed in the first alkali etching treatment (also referred to below as the "etching amount") is preferably at least 0.1 g/m$^2$, more preferably at least 0.5 g/m$^2$, and even more preferably at least 1 g/m$^2$, but preferably not more than 12 g/m$^2$, more preferably not more than 10 g/m$^2$ and even more preferably not more than 8 g/m$^2$. When the lower limit of the etching amount falls within the above range, uniform pits may be formed in electrolytic graining treatment (first electrolytic graining treatment), thus preventing treatment unevenness from occurring. When the upper limit of the etching amount falls within the above range, the amount of aqueous alkali solution used is decreased, which is economically advantageous.

Alkalis that may be used in the alkali solution are exemplified by caustic alkalis and alkali metal salts. Specific examples of suitable caustic alkalis include sodium hydroxide and potassium hydroxide. Specific examples of suitable alkali metal salts include alkali metal silicates such as sodium metasilicate, sodium silicate, potassium metasilicate and potassium silicate; alkali metal carbonates such as sodium carbonate and potassium carbonate; alkali metal aluminates such as sodium aluminate and potassium aluminate; alkali metal aldonates such as sodium gluconate and potassium gluconate; and alkali metal hydrogen phosphates such as disodium hydrogen phosphate, dipotassium hydrogen phosphate, sodium dihydrogen phosphate and potassium dihydrogen phosphate. Of these, caustic alkali solutions and solutions containing both a caustic alkali and an alkali metal aluminate are preferred on account of the high etch rate and low cost. An aqueous solution of sodium hydroxide is especially preferred.

In the first alkali etching treatment, the alkali solution has a concentration of preferably at least 30 g/L, and more preferably at least 300 g/L, but preferably not more than 500 g/L, and more preferably not more than 450 g/L.

It is desirable for the alkali solution to contain aluminum ions. The aluminum ion concentration is preferably at least 1 g/L, and more preferably at least 50 g/L, but preferably not more than 200 g/L, and more preferably not more than 150 g/L. Such an alkali solution can be prepared using, for example, water, a 48 wt % aqueous sodium hydroxide solution, and sodium aluminate.

In the first alkali etching treatment, the alkali solution has a temperature of preferably at least 30° C., and more preferably at least 50° C., but preferably not more than 80° C., and more preferably not more than 75° C.

In the first alkali etching treatment, the treatment time is preferably at least 1 second and more preferably at least 2 seconds, but preferably not more than 30 seconds, and more preferably not more than 15 seconds.

When the aluminum alloy plate is continuously etched, the aluminum ion concentration in the alkali solution rises and the amount of material etched from the aluminum alloy plate changes. It is thus desirable to control the etching solution composition as follows.

That is, a matrix of the conductivity, specific gravity and temperature or a matrix of the conductivity, ultrasonic wave propagation velocity and temperature is prepared in advance with respect to a matrix of the sodium hydroxide concentration and the aluminum ion concentration. The solution composition is then measured based on either the conductivity, specific gravity and temperature or the conductivity, ultrasonic wave propagation velocity and temperature, and sodium hydroxide and water are added up to control target values for the solution composition. Next, the etching solution which has increased in volume with the addition of sodium hydroxide and water is allowed to overflow from a circulation tank, thereby keeping the amount of solution constant. The sodium hydroxide added may be industrial-grade 40 to 60 wt % sodium hydroxide.

The conductivity meter and hydrometer used are preferably temperature-compensated instruments. The hydrometer is preferably a pressure differential hydrometer.

Illustrative examples of methods for bringing the aluminum alloy plate into contact with the alkali solution include passing the aluminum alloy plate through a tank filled with the alkali solution, immersing the aluminum alloy plate in a tank filled with the alkali solution, and spraying the surface of the aluminum alloy plate with the alkali solution.

The most desirable of these is a method that involves spraying the surface of the aluminum alloy plate with the alkali solution. A method in which the etching solution is sprayed from one or more spray lines, each having 2 to 5 mm diameter openings spaced at a pitch of 10 to 50 mm, at a rate of 10 to 100 L/min per spray line is desirable. A plurality of spray lines are preferably provided.

Following completion of alkali etching treatment, it is desirable to remove etching solution remaining on the aluminum alloy plate with nip rollers, subject the plate to rinsing treatment with water for 1 to 10 seconds, and then remove the water with nip rollers.

Rinsing treatment is preferably carried out by rinsing with a rinsing apparatus that uses a free-falling curtain of water and also by rinsing with spray lines.

An apparatus that carries out rinsing treatment with a free-falling curtain of water has a water holding tank that holds water, a pipe that feeds water to the water holding tank, and a flow distributor that supplies a free-falling curtain of water from the water holding tank to an aluminum alloy plate.

In this apparatus, the pipe feeds water to the water holding tank. When the water in the water holding tank overflows, it is distributed by the flow distributor and a free-falling curtain of water is supplied to the aluminum alloy plate. During the use of this apparatus, the flow rate is preferably 10 to 100 L/min. The distance L over which the water between the flow distributor and the aluminum alloy plate exists as a free-falling curtain of liquid is preferably from 20 to 50 mm. Moreover, it is preferable for the aluminum alloy plate to be inclined at an angle α to the horizontal of 30 to 80°.

By using the apparatus which rinses the aluminum alloy plate with a free-falling curtain of water, the aluminum alloy plate can be uniformly rinsed to enhance the uniformity of the treatment carried out before rinsing. A suitable example of the apparatus that carries out rinsing treatment with a free-falling curtain of water is described in JP 2003-96584 A.

Alternatively, rinsing may be carried out with a spray line having a plurality of spray tips that discharge fan-like sprays of water and are disposed along the width of the aluminum alloy plate. The interval between the spray tips is preferably 20 to 100 mm, and the amount of water discharged per spray tip is preferably 0.5 to 20 L/min. The use of a plurality of spray lines is preferred.

<First Desmutting Treatment>

After the first alkali etching treatment, it is preferable to carry out acid pickling (first desmutting treatment) to remove contaminants (smut) remaining on the surface of the aluminum alloy plate. Desmutting treatment is carried out by bringing an acidic solution into contact with the aluminum alloy plate.

Examples of acids that may be used include nitric acid, sulfuric acid, phosphoric acid, chromic acid, hydrofluoric acid and tetrafluoroboric acid.

In the first desmutting treatment which follows the first alkali etching treatment, it is preferable to use overflow from the electrolytic solution employed in electrolysis using nitric acid when it is subsequently carried out as electrolytic graining treatment (first electrolytic graining treatment).

The composition of the desmutting treatment solution can be controlled by selecting and using a method of control based on electrical conductivity and temperature with respect to a matrix of the acidic solution concentration and the aluminum ion concentration, a method of control based on electrical conductivity, specific gravity and temperature with respect to the above matrix, or a method of control based on electrical conductivity, ultrasonic wave propagation velocity and temperature with respect to the above matrix.

In the first desmutting treatment, it is preferable to use an acidic solution containing 1 to 400 g/L of acid and 0.1 to 5 g/L of aluminum ions.

The acidic solution has a temperature of preferably at least 20° C., and more preferably at least 30° C., but preferably not more than 70° C., and more preferably not more than 60° C.

In the first desmutting treatment, the treatment time is preferably at least 1 second, and more preferably at least 4 seconds, but preferably not more than 60 seconds, and more preferably not more than 40 seconds.

Illustrative examples of methods for bringing the aluminum alloy plate into contact with the acidic solution include passing the aluminum alloy plate through a tank filled with the acidic solution, immersing the aluminum alloy plate in a tank filled with the acidic solution, and spraying the surface of the aluminum alloy plate with the acidic solution.

Of these, a method in which the acidic solution is sprayed onto the surface of the aluminum alloy plate is preferred. More specifically, a method in which the etching solution is sprayed from one or more spray lines, each having 2 to 5 mm diameter openings spaced at a pitch of 10 to 50 mm, at a rate of 10 to 100 L/min per spray line is desirable. A plurality of spray lines are preferably provided.

Following completion of desmutting treatment, it is desirable to remove the solution remaining on the aluminum alloy plate with nip rollers, subject the plate to rinsing treatment with water for 1 to 10 seconds, and then remove the water with nip rollers.

Rinsing treatment is the same as rinsing treatment following alkali etching treatment. However, it is preferable for the amount of water discharged per spray tip to be from 1 to 20 L/min.

If overflow from the electrolytic solution used in the subsequently carried out electrolysis with nitric acid is employed as the desmutting solution in the first desmutting treatment, rather than having desmutting treatment followed by the removal of solution with nip rollers and rinsing treatment, it is preferable to handle the aluminum alloy plate up until the electrolysis step using nitric acid by suitably spraying the aluminum alloy plate with the desmutting solution as needed so that the surface of the aluminum alloy plate does not dry.

<First Electrolytic Graining Treatment>

The first electrolytic graining treatment is one carried out in a nitric acid- or hydrochloric acid-containing aqueous solution.

According to the first aspect of the invention, the first electrolytic graining treatment is preferably a treatment which uses an alternating current having a trapezoidal waveform in a nitric acid-containing electrolytic solution in order to increase the latitude of the electrolytically grained surface, and is preferably a treatment which uses an alternating current having a sinusoidal waveform in a hydrochloric acid-containing electrolytic solution in order to easily control the shape of the electrolytically grained surface.

The aluminum alloy plate having undergone the first electrolytic graining treatment preferably has a mean surface roughness $R_a$ of 0.2 to 1.0 µm.

(Electrolytic Graining Treatment in Nitric Acid-Containing Aqueous Solution (Nitric Acid Electrolysis))

Nitric acid electrolysis enables an appropriately roughened structure to be formed at the surface of the aluminum alloy plate. If the aluminum alloy plate contains copper in a relatively large amount in the first aspect of the invention, nitric acid electrolysis forms relatively large and uniform pits at the surface of the aluminum alloy plate. As a result, a lithographic printing plate manufactured using the lithographic printing plate support according to the first aspect of the invention has a long press life.

Any nitric acid-containing aqueous solution which is used in conventional electrochemical graining treatment involving the use of direct current or alternating current may be employed. The nitric acid-containing aqueous solution may be prepared by adding to an aqueous solution having a nitric acid concentration of 1 to 100 g/L at least one nitrate compound containing nitrate ions, such as aluminum nitrate, sodium nitrate or ammonium nitrate, in a range of 1 g/L to saturation, and used.

Metals which are present in the aluminum alloy, such as iron, copper, manganese, nickel, titanium, magnesium and silica may also be dissolved in the nitric acid-containing aqueous solution. Hypochlorous acid or hydrogen peroxide may be added in an amount of 1 to 100 g/L.

More specifically, it is preferable to use a solution which has an aluminum ion concentration adjusted to 3 to 7 g/L by dissolving aluminum nitrate in an aqueous nitric acid solution having a nitric acid concentration of 5 to 15 g/L.

The temperature of the nitric acid-containing aqueous solution is preferably at least 20° C. but is preferably not more than 55° C.

Nitric acid electrolysis enables pits having an average opening diameter of 1 to 10 μm to be formed. However, a relatively increased amount of electricity causes concentration of an electrolytic reaction, leading to formation of honeycomb pits having an opening diameter in excess of 10 μm as well.

To obtain such a grained surface, the total amount of electricity furnished for the anodic reaction on the aluminum alloy plate up until completion of the electrolytic reaction is preferably at least 150 C/dm$^2$, and more preferably at least 170 C/dm$^2$, but preferably not more than 600 C/dm$^2$, and more preferably not more than 500 C/dm$^2$.

The peak current density is preferably at least 5 A/dm$^2$ and more preferably from 20 to 100 A/dm$^2$.

(Electrolytic Graining Treatment in Hydrochloric Acid-Containing Aqueous Solution (Hydrochloric Acid Electrolysis))

Any hydrochloric acid-containing aqueous solution which is used in conventional electrochemical graining treatment involving the use of direct current or alternating current may be employed. The hydrochloric acid-containing aqueous solution may be prepared by adding to an aqueous solution having a hydrochloric acid concentration of 1 to 30 g/L and preferably 2 to 10 g/L at least one nitrate compound containing nitrate ions, such as aluminum nitrate, sodium nitrate or ammonium nitrate, or at least one chloride compound containing chloride ions, such as aluminum chloride, sodium chloride or ammonium chloride in a range of 1 g/L to saturation.

Metals which are present in the aluminum alloy, such as iron, copper, manganese, nickel, titanium, magnesium and silica may also be dissolved in the hydrochloric acid-containing aqueous solution. Hypochlorous acid or hydrogen peroxide may be added in an amount of 1 to 100 g/L. A compound which may form a complex with copper may also be added in an amount of 1 to 200 g/L. Sulfuric acid may also be added in an amount of 1 to 100 g/L.

The hydrochloric acid-containing aqueous solution that may be particularly preferred is an aqueous solution prepared by adding an aluminum salt (aluminum chloride: $AlCl_3 \cdot 6H_2O$) to an aqueous solution containing 2 to 10 g/L of hydrochloric acid to adjust the aluminum ion concentration to 3 to 7 g/L and preferably 4 to 6 g/L.

Electrolytic graining treatment using such an aqueous hydrochloric acid solution makes the electrolytically grained surface more uniform, and no treatment unevenness occurs irrespective of whether a low-purity or a high-purity aluminum alloy plate is used. As a result, the lithographic printing plate obtained using such an aluminum alloy plate can have a longer press life and more excellent scumming resistance.

The hydrochloric acid-containing aqueous solution has a temperature of preferably at least 20° C. and more preferably at least 30° C., but preferably not more than 55° C. and more preferably not more than 50° C.

Conditions used in known electrochemical graining treatment may be employed for the substances added to the hydrochloric acid-containing aqueous solution, apparatus, power supply, current density, flow rate and temperature. In electrochemical graining, an AC power supply or a DC power supply is used, but an AC power supply is particularly preferred.

Because hydrochloric acid itself has a strong ability to dissolve aluminum, fine irregularities can be formed at the surface by merely applying a small amount of current. These fine irregularities have an average opening diameter (pit diameter) of 0.01 to 1.5 μm, and are uniformly formed over the entire surface of the aluminum alloy plate.

By increasing the amount of electricity (to a total amount of electricity furnished for the anodic reaction of 150 to 2,000 C/dm$^2$), pits with an average opening diameter of 1 to 30 μm are produced which have pits with an average opening diameter of 0.01 to 0.4 μm formed on the surfaces thereof. To obtain such a grained surface, the total amount of electricity furnished for the anodic reaction on the aluminum alloy plate up until completion of the electrolytic reaction is preferably at least 10 C/dm$^2$, more preferably at least 50 C/dm$^2$, and even more preferably at least 100 C/dm$^2$, but preferably not more than 2,000 C/dm$^2$, and more preferably not more than 600 C/dm$^2$.

In hydrochloric acid electrolysis, the peak current density is preferably at least 5 A/dm$^2$ and more preferably from 20 to 100 A/dm$^2$.

Hydrochloric acid electrolysis of the aluminum alloy plate with a large amount of electricity enables large undulations and fine irregularities to be formed at a time. Scumming resistance can be improved by making more uniform the large undulations in the second alkali etching treatment to be described later.

The first electrolytic graining treatment may be carried out in accordance with the electrochemical graining processes (electrolytic graining processes) described in, for example, JP 48-28123 B and GB 896,563. These electrolytic graining processes use an alternating current having a sinusoidal waveform, although they may also be carried out using special waveforms like those described in JP 52-58602 A. Use can also be made of the waveforms described in JP 3-79799 A. Other processes that may be employed for this purpose include those described in JP 55-158298 A, JP 56-28898 A, JP 52-58602 A, JP 52-152302 A, JP 54-85802 A, JP 60-190392 A, JP 58-120531 A, JP 63-176187 A, JP 1-5889 A, JP 1-280590 A, JP 1-118489 A, JP 1-148592 A, JP 1-178496 A, JP 1-188315 A, JP 1-154797 A, JP 2-235794 A, JP 3-260100 A, JP 3-253600 A, JP 4-72079 A, JP 4-72098 A, JP 3-267400 A and JP 1-141094 A. In addition to the above, electrolysis can also be carried out using alternating currents of a special frequency such as have been proposed in connection with methods for manufacturing electrolytic capacitors. These are described in, for example, U.S. Pat. No. 4,276,129 and U.S. Pat. No. 4,676,879.

Various electrolytic cells and power supplies have been proposed. Use may be made of those described in, for example, U.S. Pat. No. 4,203,637, JP 56-123400 A, JP 57-59770 A, JP 53-12738 A, JP 53-32821 A, JP 53-32822 A, JP 53-32823 A, JP 55-122896 A, JP 55-132884 A, JP 62-127500 A, JP 1-52100 A, JP 1-52098 A, JP 60-67700 A, JP 1-230800 A, JP 3-257199 A, JP 52-58602 A, JP 52-152302 A, JP 53-12738 A, JP 53-12739 A, JP 53-32821 A, JP 53-32822 A, JP 53-32833 A, JP 53-32824 A, JP 53-32825 A, JP 54-85802 A, JP 55-122896 A, JP 55-132884 A, JP 48-28123 B, JP 51-7081 B, JP 52-133838 A, JP 52-133840 A, JP 52-133844 A, JP 52-133845 A, JP 53-149135 A and JP 54-146234 A.

When the aluminum alloy plate is consecutively subjected to electrolytic graining treatment, the aluminum ion concentration in the alkali solution rises, as a result of which the shape of the irregularities formed at the aluminum alloy plate by the first electrolytic graining treatment will change. It is therefore preferred to control the composition of the nitric acid- or hydrochloric acid-containing electrolytic solution as follows.

That is, a matrix of the conductivity, specific gravity and temperature or a matrix of the conductivity, ultrasonic wave propagation velocity and temperature is prepared in advance with respect to a matrix of the nitric acid or hydrochloric acid concentration and the aluminum ion concentration. The solution composition is then measured based on either the conductivity, specific gravity and temperature or the conductivity, ultrasonic wave propagation velocity and temperature, and nitric acid or hydrochloric acid and water are added to the solution up to control target values for the solution composition. Next, the electrolytic solution which has increased in volume with the addition of nitric acid or hydrochloric acid and water is allowed to overflow from a circulation tank, thereby holding the amount of solution constant. The nitric acid added may be industrial-grade 30 to 70 wt % nitric acid. The hydrochloric acid added may be industrial-grade 30 to 40 wt % hydrochloric acid.

The conductivity meter and hydrometer used are preferably temperature-compensated instruments. The hydrometer is preferably a pressure differential hydrometer.

To measure the solution composition to a high accuracy, it is preferable that samples collected from the electrolytic solution for the purpose of measurement of the solution composition be furnished for measurement after first being controlled to a fixed temperature (e.g., 40±0.5° C.) using a different heat exchanger from the one used for the electrolytic solution.

Figure 4:
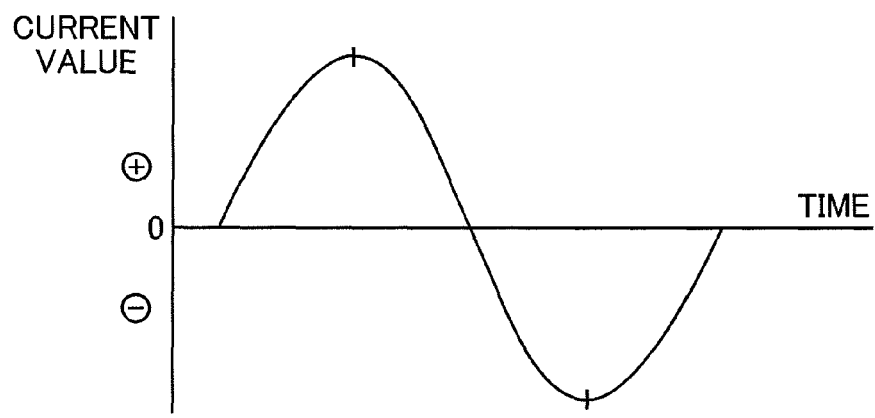
FIG. 4 is a graph showing an example of a sinusoidal waveform that may be used to perform electrochemical graining treatment.

No particular limitation is imposed on the waveform of the alternating current used in electrochemical graining treatment. For example, a sinusoidal, square, trapezoidal or triangular waveform may be used. Of these, a sinusoidal, square or trapezoidal waveform is preferred. A trapezoidal waveform is especially preferred. A sinusoidal waveform is especially preferred in the case of the first hydrochloric acid electrolysis, because pits having an average diameter of at least 1 μm are uniformly and readily produced. "Sinusoidal waveform" refers herein to a waveform like that shown in FIG. 4.

"Trapezoidal waveform" refers herein to a waveform like that shown in FIG. 1. In this trapezoidal waveform, it is preferable for the time TP until the current reaches a peak from zero to be from 0.5 to 3 ms. At a TP of more than 3 ms, particularly when a nitric acid-containing aqueous solution is used, the aluminum alloy plate tends to be affected by ammonium ions and other trace ingredients in the electrolytic solution that spontaneously increase during electrolytic treatment, making it difficult to carry out uniform graining. As a result, there is a tendency for the lithographic printing plate obtained using the aluminum alloy plate to have a reduced scumming resistance.

Use can be made of an alternating current having a duty ratio of from 1:2 to 2:1. However, as noted in JP 5-195300 A, use of an alternating current having a duty ratio of 1:1 is preferred in an indirect power feed system that does not use a conductor roll to feed current to the aluminum alloy plate.

Use can be made of an alternating current having a frequency of from 0.1 to 120 Hz, although a frequency of 50 to 70 Hz is preferable in terms of equipment. At a frequency lower than 50 Hz, the carbon electrode serving as the main electrode is more likely to dissolve. On the other hand, at a frequency higher than 70 Hz, the power supply circuit is more likely to be affected by inductance components thereon, increasing the power supply costs.

Figure 2:
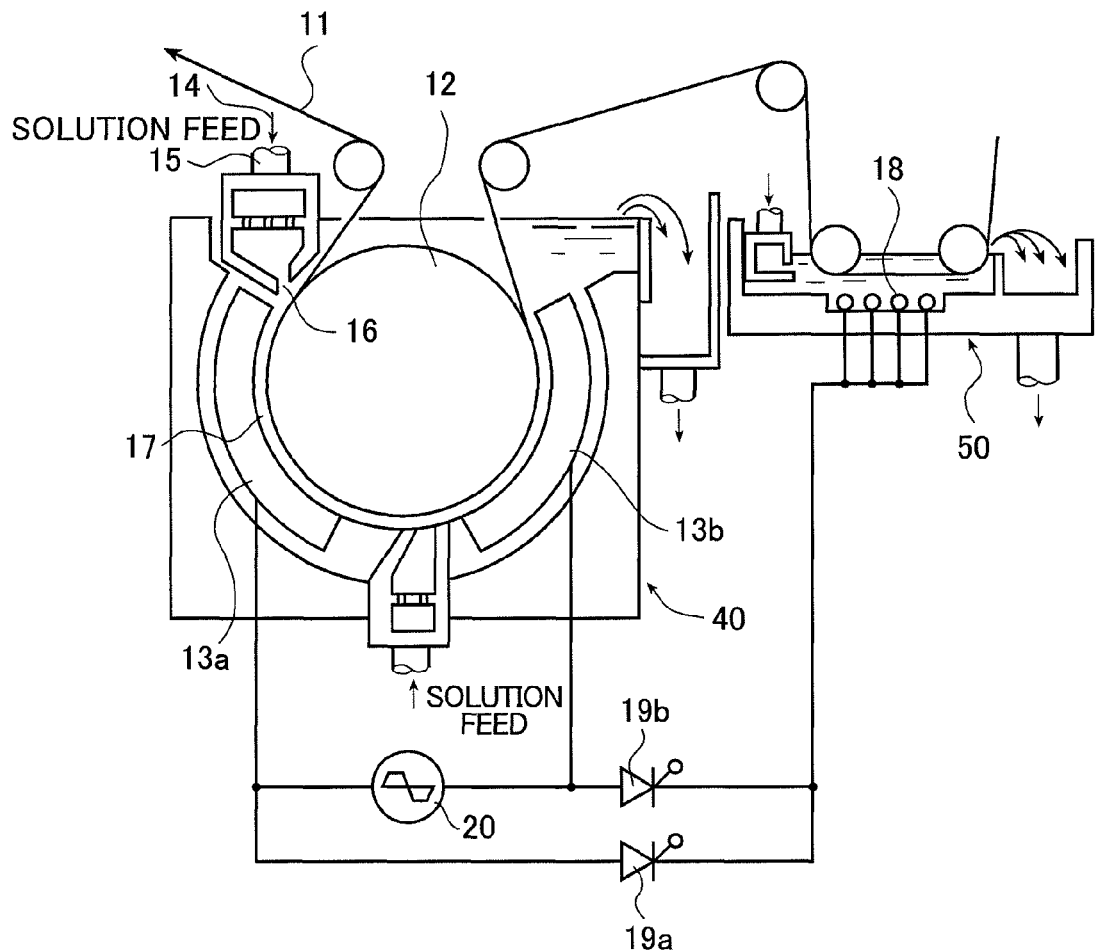
FIG. 2 is a side view of a radial electrolytic cell that may be used in electrochemical graining treatment with alternating current.

FIG. 2 is a side view of a radial electrolytic cell that may be used in electrochemical graining treatment with alternating current.

One or more AC power supplies may be connected to the electrolytic cell. To control the anode/cathode current ratio of the alternating current applied to the aluminum alloy plate facing the main electrodes and thereby carry out uniform graining and to dissolve carbon from the main electrodes, it is preferred to provide an auxiliary anode and divert some of the alternating current as shown in FIG. 2. FIG. 2 shows an aluminum alloy plate 11, a radial drum roller 12, main electrodes 13a and 13b, an electrolytic treatment solution 14, a solution feed inlet 15, a slit 16, a solution channel 17, an auxiliary anode 18, thyristors 19a and 19b, an AC power supply 20, a main electrolytic cell 40 and an auxiliary anode cell 50. By using a rectifying or switching device to divert some of the current as direct current to an auxiliary anode provided in a separate cell from that containing the two main electrodes, it is possible to control the ratio between the current furnished for the anodic reaction which acts on the aluminum alloy plate facing the main electrodes and the current furnished for the cathodic reaction. The ratio between the amount of electricity furnished for the anodic reaction and that furnished for the cathodic reaction on the aluminum alloy plate facing the main electrodes (the ratio between the total amount of electricity when the aluminum alloy plate serves as a cathode and that when the aluminum alloy plate serves as an anode) is preferably in a range of 0.3 to 0.95.

Any known electrolytic cell employed for surface treatment, including vertical, flat and radial type electrolytic cells, may be used but radial-type electrolytic cells such as those described in JP 5-195300 A are especially preferred. The electrolytic solution is passed through the electrolytic cell either parallel or counter to the direction in which aluminum web advances.

Electrolytic solution used in conventional electrochemical graining treatment with a direct current may be used for the electrochemical graining treatment with a direct current. More specifically, electrolytes of the same type as those used in the above-described electrochemical graining treatment with an alternating current may be used.

The direct current used in electrochemical graining treatment is not particularly limited as long as the polarity of the current used does not change. Examples that may be used include a DC having a comb-shaped waveform, a continuous DC and a current obtained by fully rectifying a commercial AC with a thyristor, and a smoothed continuous DC is preferably used.

Electrochemical graining treatment with a direct current may be carried out by any of a batch process, a semicontinuous process, and a continuous process, but a continuous process is preferably used.

The apparatus used for electrochemical graining treatment with a direct current is not particularly limited, as long as the apparatus is configured to apply a dc voltage across anodes and cathodes disposed alternately and to allow an aluminum alloy plate to pass between the anodes and cathodes in pairs while keeping the distance therebetween.

The electrodes are not particularly limited but conventionally known electrodes employed in electrochemical graining treatment may be used.

Examples of the anode that may be preferably used include ones formed by plating or cladding valve metals such as titanium, tantalum and niobium with platinum-group metals; ones formed by coating or sintering platinum-group metal oxides on the valve metals; aluminum; and stainless steel. Of these, ones formed by cladding the valve metals with platinum are preferably used. The anode can have a further extended service life, for example, by a method which involves passing water inside the electrode to cool it.

Metals that do not dissolve at a negative electrode potential may be selected and used for the cathode based on Pourbaix diagrams. Carbon is particularly preferable.

The arrangement of the electrodes may be selected as appropriate for the wavy structure. The wavy structure may be adjusted by changing the length of the anode and the cathode in the direction of travel of the aluminum alloy plate, passing speed of the aluminum alloy plate, flow rate, temperature and composition of the electrolytic solution, and current density. In the case of using an apparatus including separate electrolytic cells for the anode and cathode, the electrolysis conditions in the respective cells may also be changed.

Following completion of the first electrolytic graining treatment, it is desirable to remove the electrolytic solution remaining on the aluminum alloy plate with nip rollers, subject the plate to rinsing treatment with water for 1 to 10 seconds, and then remove the water with nip rollers.

Rinsing treatment is preferably carried out with a spray line. Alternatively, rinsing may be carried out, for example, with a spray line having a plurality of spray tips that discharge fan-like sprays of water and are disposed along the width of the aluminum alloy plate. The interval between the spray tips is preferably 20 to 100 mm, and the amount of water discharged per spray tip is preferably 1 to 20 L/min. The use of a plurality of spray lines is preferred.

<Second Alkali Etching Treatment>

The purpose of the second alkali etching treatment carried out between the first electrolytic graining treatment and the second electrolytic graining treatment is to dissolve the smut that arises in the first electrolytic graining treatment and to dissolve the edges of the pits formed by the first electrolytic graining treatment.

The second alkali etching treatment causes the edges of the large pits formed by the first electrolytic graining treatment to dissolve to smooth the plate surface, and as a result, ink does not readily catch on the edges. Therefore, a presensitized plate having excellent scumming resistance can be obtained.

Because the second alkali etching treatment is basically the same as the first alkali etching treatment, only those features that differ are described below.

The amount of material removed from the aluminum alloy plate in the second alkali etching treatment is preferably at least 0.05 $g/m^2$, and more preferably at least 0.1 $g/m^2$, but preferably not more than 4 $g/m^2$, and more preferably not more than 3.5 $g/m^2$. At an etching amount of 0.05 $g/m^2$ or more, the edges of the pits formed in the first electrolytic graining treatment are smoothed and ink does not readily catch on the edges of the pits, thus enhancing the scumming resistance in non-image areas of the lithographic printing plate. On the other hand, at an etching amount of not more than 4 $g/m^2$, the irregularities formed in the first electrolytic graining treatment become larger, thus achieving a long press life.

In the second alkali etching treatment, the alkali solution has a concentration of preferably at least 30 g/L, and more preferably at least 300 g/L, but preferably not more than 500 g/L, and more preferably not more than 450 g/L.

It is desirable for the alkali solution to contain aluminum ions. The aluminum ion concentration is preferably at least 1 g/L, and more preferably at least 50 g/L, but preferably not more than 200 g/L, and more preferably not more than 150 g/L. Such an alkali solution can be prepared using, for example, water, a 48 wt % aqueous sodium hydroxide solution, and sodium aluminate.

<Second Desmutting Treatment>

After the second alkali etching treatment, it is preferable to carry out acid pickling (second desmutting treatment) to remove contaminants (smut) remaining on the surface of the aluminum alloy plate. The second desmutting treatment can be carried out in the same manner as the first desmutting treatment.

In the second desmutting treatment, it is preferable to use nitric acid or sulfuric acid.

In the second desmutting treatment, it is preferable to use an acidic solution containing 1 to 400 g/L of acid and 0.1 to 8 g/L of aluminum ions.

In the case of using sulfuric acid, more specifically, use may be made of a solution prepared by dissolving aluminum sulfate in an aqueous sulfuric acid solution having a sulfuric acid concentration of 100 to 350 g/L so as to have an aluminum ion concentration of 0.1 to 5 g/L. Use may also be made of overflow from the electrolytic solution used in anodizing treatment to be described later.

In the second desmutting treatment, the treatment time is preferably at least 1 second, and more preferably at least 4 seconds, but preferably not more than 60 seconds, and more preferably not more than 20 seconds.

In the second desmutting treatment, the aqueous acid solution has a temperature of preferably at least 20° C. and more preferably at least 30° C., but preferably not more than 70° C. and more preferably not more than 60'C.

<Second Electrolytic Graining Treatment (Second Hydrochloric Acid Electrolysis)>

The second electrolytic graining treatment is an electrochemical graining treatment carried out in a hydrochloric acid-containing aqueous solution with an alternating current or a direct current.

The above-described first electrolytic graining treatment may only be carried out in the first aspect of the invention. However, the combination with the second electrolytic graining treatment enables a more complex topographic structure to be formed at the aluminum alloy plate surface, thus achieving a long press life.

The second electrolytic graining treatment is basically the same as the hydrochloric acid electrolysis described in connection with the first electrolytic graining treatment.

The total amount of electricity furnished for the anodic reaction on the aluminum alloy plate through electrochemical graining in a hydrochloric acid-containing aqueous solution in the second electrolytic graining treatment may be selected from a range of 10 to 200 $C/dm^2$ at the time electrochemical graining treatment has been finished. In order to substantially keep the surface roughened by the first electrolytic graining treatment, the total amount of electricity is preferably from 10 to 100 $C/dm^2$, and most preferably from 50 to 80 $C/dm^2$.

<First Alkali Etching Treatment-First Electrolytic Graining Treatment (Nitric Acid Electrolysis)-Second Alkali Etching Treatment-Second Electrolytic Treatment (Second Hydrochloric Acid Electrolysis)>

In the case where the above treatments are carried out in combination, nitric acid electrolysis in which the total amount of electricity in the anodic reaction carried out in the nitric acid-containing electrolytic solution is from 65 to 500 $C/dm^2$, alkali etching treatment in which at least 0.1 $g/m^2$ of material is dissolved out, second hydrochloric acid electrolysis in which the total amount of electricity in the anodic reaction carried out in the hydrochloric acid-containing electrolytic solution is from 25 to 100 $C/dm^2$, and alkali etching treatment in which at least 0.03 g/m² of material is dissolved out are preferably carried out in this order.

A presensitized plate having a longer press life and more excellent scumming resistance can be obtained by carrying out the surface roughening treatment based on the above combination.

<Third Alkali Etching Treatment>

The purpose of the third alkali etching treatment carried out after the second electrolytic graining treatment is to dissolve the smut that arises in the second electrolytic graining treatment, and to dissolve the edges of the pits formed by the second electrolytic graining treatment. Because the third alkali etching treatment is basically the same as the first alkali etching treatment, only those features that differ are described below.

The amount of material removed by the third alkali etching treatment is preferably at least 0.05 g/m², and more preferably at least 0.1 g/m², but preferably not more than 0.3 g/m², and more preferably not more than 0.25 g/m². At an etching amount of 0.05 g/m² or more, the edges of the pits formed in the second hydrochloric acid electrolysis are smoothed and ink does not readily catch on the edges of the pits, thus enhancing the scumming resistance in non-image areas of the lithographic printing plate. At an etching amount of not more than 0.3 g/m², the irregularities formed in the first and second electrolytic graining treatments become larger, thus achieving a long press life.

In the third alkali etching treatment, the alkali solution has a concentration of preferably at least 30 g/L. However, to keep the irregularities formed in the preceding hydrochloric acid electrolysis with an alternating current from becoming too small, the concentration is preferably not more than 100 g/L, and more preferably not more than 70 g/L.

It is desirable for the alkali solution to contain aluminum ions. The aluminum ion concentration is preferably at least 1 g/L, and more preferably at least 3 g/L, but preferably not more than 50 g/L, and more preferably not more than 8 g/L. Such an alkali solution can be prepared using, for example, water, a 48 wt % aqueous sodium hydroxide solution, and sodium aluminate.

In the third alkali etching treatment, the alkali solution has a temperature of preferably at least 25° C., and more preferably at least 30° C., but preferably not more than 60° C., and more preferably not more than 50° C.

In the third alkali etching treatment, the treatment time is preferably at least 1 second, and more preferably at least 2 seconds, but preferably not more than 30 seconds, and more preferably not more than 10 seconds.

<Third Desmutting Treatment>

After the third alkali etching treatment, it is preferable to carry out acid pickling (third desmutting treatment) to remove contaminants (smut) remaining on the surface of the aluminum alloy plate. Because the third desmutting treatment is basically the same as the first desmutting treatment, only the features that differ are described below.

In the third desmutting treatment, it is preferable to use an acidic solution containing 5 to 400 g/L of acid and 0.5 to 8 g/L of aluminum ions. In the case of using sulfuric acid, more specifically, it is preferred to use a solution which has an aluminum ion concentration adjusted to 1 to 5 g/L by dissolving aluminum sulfate in an aqueous sulfuric acid solution having a sulfuric acid concentration of 100 to 350 g/L.

In the third desmutting treatment, the treatment time is preferably at least 1 second, and more preferably at least 4 seconds, but preferably not more than 60 seconds, and more preferably not more than 15 seconds.

When the desmutting solution used in the third desmutting treatment is a solution of the same type as the electrolytic solution employed in the subsequently carried out anodizing treatment, solution removal with nip rollers and rinsing that are to be carried out after the desmutting treatment may be omitted.

<Anodizing Treatment>

Preferably, the aluminum alloy plate treated as described above is also subjected to anodizing treatment.

Anodizing treatment may be carried out by any method commonly used in the art. More specifically, an anodized film can be formed by passing a current through the aluminum alloy plate as the anode in, for example, a solution having a sulfuric acid concentration of 50 to 300 g/L and an aluminum ion concentration of up to 5 wt %. Acids such as sulfuric acid, phosphoric acid, chromic acid, oxalic acid, sulfamic acid, benzenesulfonic acid and amidosulfonic acid may be used alone or in combination of two or more for the solution for use in anodizing treatment. Anodizing treatment using an aqueous solution of sulfuric acid or phosphoric acid is particularly preferred.

It is acceptable for at least ingredients ordinarily present in the aluminum alloy plate, electrodes, tap water, ground water and the like to be present in the electrolytic solution. In addition, secondary and tertiary ingredients may be added. Here, "second and tertiary ingredients" includes, for example, the ions of metals such as Na, K, Mg, Li, Ca, Ti, Al, V, Cr, Mn, Fe, Co, Ni, Cu and Zn; cations such as ammonium ion; and anions such as nitrate ion, carbonate ion, chloride ion, phosphate ion, fluoride ion, sulfite ion, titanate ion, silicate ion and borate ion. These may be present in concentrations of about 0 to 10,000 ppm.

The anodizing treatment conditions vary empirically according to the electrolytic solution used, although it is generally suitable for the solution to have an electrolyte concentration of 1 to 80 wt % and a temperature of 5 to 70° C., and for the current density to be 0.5 to 60 A/dm², the voltage to be 1 to 100 V, and the electrolysis time to be 15 seconds to 50 minutes. These conditions may be adjusted to obtain the desired anodized film weight.

Methods that may be used to carry out anodizing treatment include those described in JP 54-81133 A, JP 57-47894 A, JP 57-51289 A, JP 57-51290 A, JP 57-54300 A, JP 57-136596 A, JP 58-107498 A, JP 60-200256 A, JP 62-136596 A, JP 63-176494 A, JP 4-176897 A, JP 4-280997 A, JP 6-207299 A, JP 5-24377 A, JP 5-32083 A, JP 5-125597 A and JP 5-195291 A.

Of these, as described in JP 54-12853 A and JP 48-45303 A, it is preferable to use a sulfuric acid solution as the electrolytic solution. The electrolytic solution has a sulfuric acid concentration of preferably 10 to 300 g/L (1 to 30 wt %), and more preferably 50 to 200 g/L (5 to 20 wt %), and has an aluminum ion concentration of preferably 1 to 25 g/L (0.1 to 2.5 wt %), and more preferably 2 to 10 g/L (0.2 to 1 wt %). Such an electrolytic solution can be prepared by adding a compound such as aluminum sulfate to dilute sulfuric acid having a sulfuric acid concentration of 50 to 200 g/L.

The composition of the electrolytic solution is controlled using a method similar to that employed in the above-described nitric acid electrolysis. That is, control is preferably effected by means of the conductivity, specific gravity and temperature or of the conductivity, ultrasonic wave propagation velocity and temperature with respect to a matrix of the sulfuric acid concentration and the aluminum ion concentration.

The electrolytic solution has a temperature of preferably 25 to 55° C., and more preferably 30 to 50° C.

When anodizing treatment is carried out in an electrolytic solution containing sulfuric acid, direct current or alternating current may be applied across the aluminum alloy plate and the counter electrode.

When a direct current is applied to the aluminum alloy plate, the current density is preferably 1 to 60 A/dm$^2$, and more preferably 5 to 40 A/dm$^2$.

To keep burnt deposits (areas of the anodized film which are thicker than surrounding areas) from arising on portions of the aluminum alloy plate due to the concentration of current when anodizing treatment is carried out as a continuous process, it is preferable to apply current at a low density of 5 to 10 A/m$^2$ at the start of anodizing treatment and to increase the current density to 30 to 50 A/dm$^2$ or more as anodizing treatment proceeds.

Specifically, it is preferable for current from the DC power supplies to be allocated such that current from downstream DC power supplies is equal to or greater than current from upstream DC power supplies. Current allocation in this way will discourage the formation of burnt deposits, enabling high-speed anodization to be carried out.

When anodizing treatment is carried out as a continuous process, this is preferably done using a system that supplies power to the aluminum alloy plate through the electrolytic solution.

By carrying out anodizing treatment under such conditions, a porous film having numerous pores (micropores) can be obtained. These micropores generally have an average diameter of about 5 to about 50 nm and an average pore density of about 300 to about 800 pores/μcm$^2$.

The weight of the anodized film is preferably at least 1.0 μm, more preferably at least 1.3 μm, and even more preferably at least 2 μm. The weight of the anodized film is preferably 1 to 5 g/m$^2$. At less than 1 g/m$^2$, scratches are readily formed on the plate. On the other hand, a weight of more than 5 g/m$^2$ requires a large amount of electrical power, which is economically disadvantageous. An anodized film weight of 1.5 to 4 g/m$^2$ is more preferred. It is also desirable for anodizing treatment to be carried out in such a way that the difference in the anodized film weight between the center of the aluminum alloy plate and areas near the edges is not more than 1 g/m$^2$.

Examples of electrolysis apparatuses that may be used in anodizing treatment include those described in JP 48-26638 A, JP 47-18739 A, JP 58-24517 B and JP 2001-11698 A.

Figure 3:
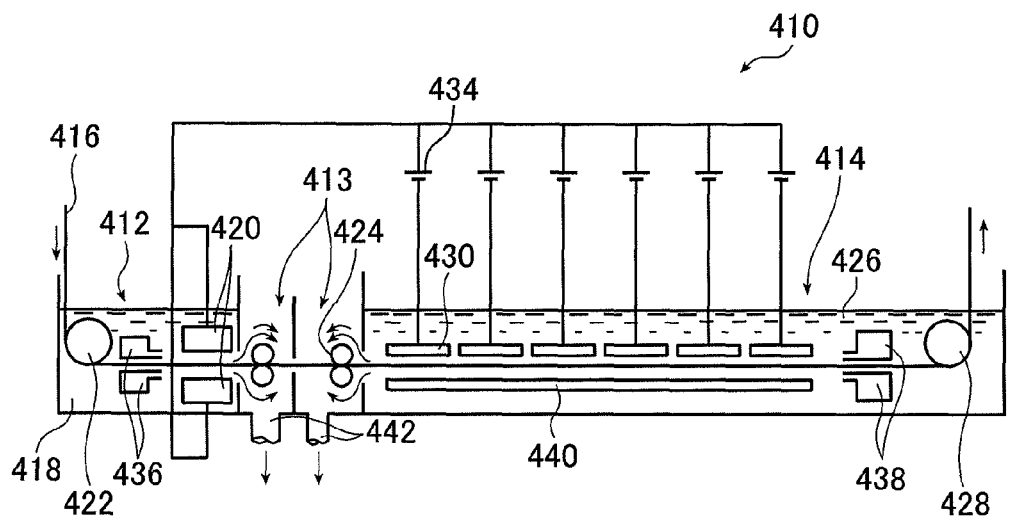
FIG. 3 is a schematic view of an anodizing apparatus that may be used to perform anodizing treatment.

An apparatus shown in FIG. 3 is particularly used with advantage. FIG. 3 is a schematic view of an apparatus for anodizing the surface of an aluminum alloy plate.

In an anodizing apparatus 410 shown in FIG. 3, to apply a current to an aluminum alloy plate 416 through an electrolytic solution, a power supplying tank 412 is disposed on the upstream side of the aluminum alloy plate 416 in its travel direction and an anodizing treatment tank 414 is disposed on the downstream side. The aluminum alloy plate 416 is transported by pass rollers 422 and 428 in the direction indicated by arrows in FIG. 3. The power supplying tank 412 through which the aluminum alloy plate 416 first passes is provided with an anode 420 which is connected to the positive poles of DC power supplies 434; and the aluminum alloy plate 416 serves as the cathode. Hence, a cathodic reaction arises at the aluminum alloy plate 416.

The anodizing treatment tank 414 through which the aluminum alloy plate 416 next passes is provided with a cathode 430 which is connected to the negative poles of the DC power supplies 434; the aluminum alloy plate 416 serves as the anode. Hence, an anodic reaction arises at the aluminum alloy plate 416, and an anodized film is formed on the surface of the aluminum alloy plate 416.

The aluminum alloy plate 416 and the cathode 430 are separated by a distance of preferably 50 to 200 mm. The cathode 430 may be made of aluminum. In order that hydrogen gas generated by the anodic reaction may be more easily discharged from the system, the cathode 430 is preferably divided into a plurality of sections in the direction of advance of the aluminum alloy plate 416 instead of being a single electrode having a large area.

As shown in FIG. 3, it is preferable to provide, between the power supplying tank 412 and the anodizing treatment tank 414, an intermediate tank 413 which does not hold the electrolytic solution. By providing the intermediate tank 413, current can be prevented from flowing from the anode 420 to the cathode 430 without passing through the aluminum alloy plate 416. The bypass current is preferably minimized by providing nip rollers 424 in the intermediate tank 413 and removing the solution remaining on the aluminum alloy plate 416. The solution removed by the nip rollers 424 is discharged to the outside of the anodizing apparatus 410 through discharge outlets 442.

To reduce voltage loss, the electrolytic solution 418 supplied to the power supplying tank 412 is adjusted to have a higher temperature and/or a higher concentration than an electrolytic solution 426 supplied to the anodizing treatment tank 414. In addition, the composition, temperature and other characteristics of the electrolytic solutions 418 and 426 are determined based on such considerations as the anodized film forming efficiency, the shapes of micropores of the anodized film, the hardness of the anodized film, the voltage, and the cost of the electrolytic solutions.

The electrolytic solutions are injected from solution feed nozzles 436 and 438 into the power supplying tank 412 and the anodizing treatment tank 414, respectively. To ensure that the distribution of electrolytic solution remains uniform and thereby prevent the localized concentration of current on the aluminum alloy plate 416 in the anodizing treatment tank 414, the solution feed nozzles 436 and 438 have a construction in which slits are provided to keep the flow of injected liquid constant in the width direction.

In the anodizing treatment tank 414, a shield 440 is provided on the opposite side of the aluminum alloy plate 416 from the cathode 430 to inhibit the flow of current to the opposite side of the aluminum alloy plate 416 from the surface on which the anodized film is to be formed. The aluminum alloy plate 416 and the shield 440 are separated by a distance of preferably 5 to 30 mm. It is preferable to use a plurality of DC power supplies 434 with their positive poles connected in common, thereby enabling the current distribution within the anodizing treatment tank 414 to be controlled.

<Sealing Treatment>

In the first aspect of the invention, sealing treatment may be optionally carried out to close the micropores present in the anodized film. Sealing treatment may be performed in accordance with a known method, such as boiling water treatment, hot water treatment, steam treatment, sodium silicate treatment, nitrite treatment or ammonium acetate treatment. For example, sealing treatment may be performed using the apparatuses and processes described in JP 56-12518 B, JP 4-4194 A, JP 5-202496 A and JP 5-179482 A.

<Hydrophilizing Treatment>

Hydrophilizing treatment may be carried out after anodizing treatment or after sealing treatment. Illustrative examples of suitable hydrophilizing treatments include the potassium hexafluorozirconate treatment described in U.S. Pat. No. 2,946,638, the phosphomolybdate treatment described in U.S. Pat. No. 3,201,247, the alkyl titanate treatment described in GB 1,108,559, the polyacrylic acid treatment described in DE 1,091,433, the polyvinylphosphonic acid treatments described in DE 1,134,093 and GB 1,230,447, the phosphonic acid treatment described in JP 44-6409 B, the phytic acid treatment described in U.S. Pat. No. 3,307,951, the treatments involving the divalent metal salts of lipophilic organic polymeric compounds described in JP 58-16893 A and JP 58-18291 A, a treatment like that described in U.S. Pat. No. 3,860,426 in which a water-soluble metal salt (e.g., zinc acetate)-containing hydrophilic cellulose (e.g., carboxymethyl cellulose) undercoat is provided, and an undercoating treatment like that described in JP 59-101651 A in which a sulfo group-bearing water-soluble polymer is applied.

Additional examples of suitable hydrophilizing treatments include those which involve undercoating the aluminum alloy plate with the phosphates mentioned in JP 62-019494 A, the water-soluble epoxy compounds mentioned in JP 62-033692 A, the phosphoric acid-modified starches mentioned in JP 62-097892 A, the diamine compounds mentioned in JP 63-056498 A, the inorganic or organic acids of amino acids mentioned in JP 63-130391 A, the carboxy or hydroxy group-bearing organic phosphonic acids mentioned in JP 63-145092 A, the amino group- and phosphonate group-bearing compounds mentioned in JP 63-165183 A, the specific carboxylic acid derivatives mentioned in JP 2-316290 A, the phosphate esters mentioned in JP 3-215095 A, the compounds having one amino group and one phosphorus oxo acid group mentioned in JP 3-261592 A, the phosphate esters mentioned in JP 3-215095 A, the aliphatic or aromatic phosphonic acids (e.g., phenylphosphonic acid) mentioned in JP 5-246171 A, the sulfur atom-containing compounds (e.g., thiosalicylic acid) mentioned in JP 1-307745 A, and the phosphorus oxo acid group-bearing compounds mentioned in JP 4-282637 A.

Coloration with an acid dye as mentioned in JP 60-64352 A may also be carried out.

Hydrophilizing treatment is preferably carried out by a method which involves immersion or electrolysis in an aqueous solution of an alkali metal silicate such as sodium silicate or potassium silicate; a method which involves treatment with potassium hexafluorozirconate; and a method which involves applying a hydrophilic vinyl polymer or a hydrophilic compound, for example, by treatment with polyvinyl phosphonic acid to form a hydrophilic undercoat. Immersion in an aqueous solution of polyvinyl phosphonic acid is preferred.

Hydrophilizing treatment with an aqueous solution of an alkali metal silicate such as sodium silicate or potassium silicate can be carried out according to the processes and procedures described in U.S. Pat. No. 2,714,066 and U.S. Pat. No. 3,181,461.

Illustrative examples of suitable alkali metal silicates include sodium silicate, potassium silicate and lithium silicate. The aqueous solution of an alkali metal silicate may include also a suitable amount of, for example, sodium hydroxide, potassium hydroxide or lithium hydroxide.

The aqueous solution of an alkali metal silicate may include also an alkaline earth metal salt or a Group 4 (Group IVA) metal salt. Examples of suitable alkaline earth metal salts include nitrates such as calcium nitrate, strontium nitrate, magnesium nitrate and barium nitrate; and also sulfates, hydrochlorides, phosphates, acetates, oxalates, and borates. Exemplary Group 4 (Group IVA) metal salts include titanium tetrachloride, titanium trichloride, titanium potassium fluoride, titanium potassium oxalate, titanium sulfate, titanium tetraiodide, zirconium chloride oxide, zirconium dioxide, zirconyl chloride, and zirconium tetrachloride. These alkaline earth metal salts and Group 4 (Group IVA) metal salts may be used alone or in combination of two or more thereof.

The amount of silicon adsorbed as a result of alkali metal silicate treatment can be measured with a fluorescent X-ray analyzer, and is preferably about 1.0 to 15.0 mg/m$^2$.

The alkali metal silicate treatment has the effect of enhancing the resistance at the surface of the lithographic printing plate support to dissolution in an alkali developer and suppresses the leaching of aluminum ingredients into the developer, thus enabling the generation of development scum arising from developer fatigue to be reduced.

Hydrophilizing treatment for forming a hydrophilic undercoat may also be carried out according to the conditions and procedures described in JP 59-101651 A and JP 60-149491 A.

Hydrophilic vinyl polymers that may be used in such a method include copolymers of a sulfo group-bearing vinyl polymerizable compound such as polyvinylsulfonic acid or sulfo group-bearing p-styrenesulfonic acid with a conventional vinyl polymerizable compound such as an alkyl(meth) acrylate. Examples of hydrophilic compounds that may be used in this method include compounds having at least one group selected from among —NH$_2$ group, —COOH group and sulfo group.

<Drying>

After the support for use in the presensitized plate according to the first aspect of the invention has been obtained according to the above-described procedure, the surface of the support is preferably dried before forming a photosensitive layer on the support. Drying is preferably carried out after the support has been rinsed with water and the water removed with nip rollers after the end of the final surface treatment.

The drying temperature is preferably at least 70° C., and more preferably at least 80° C., but preferably not more than 110° C., and more preferably not more than 100° C.

The drying time is preferably at least 1 second, and more preferably at least 2 seconds, but preferably not more than 20 seconds, and more preferably not more than 15 seconds.

<Control of Solution Compositions>

In the first aspect of the invention, the compositions of the various treatment solutions used in the above-described surface treatment are preferably controlled by the method described in JP 2001-121837 A. This typically involves first preparing a large number of treatment solution samples to various concentrations, then measuring the ultrasonic wave propagation velocity at two solution temperatures for each sample and constructing a matrix-type data table based on the results. During treatment, it is preferable to measure the solution temperature and ultrasonic wave propagation velocity in real time and to control the concentration based on these measurements. Particularly in cases where an electrolytic solution having a sulfuric acid concentration of 250 g/L or more is used in desmutting treatment, controlling the concentration by the foregoing method is especially preferred.

The various electrolytic solutions used in electrolytic graining treatment and anodizing treatment preferably have a copper concentration of not more than 100 ppm. If the copper concentration is too high, copper will deposit onto the aluminum alloy plate when the production line stops. When the line starts moving again, the deposited copper may be transferred to the pass rollers, which may cause uneven treatment.

[Photosensitive Layer]

The photosensitive layer is formed on the support prepared according to the above-described procedure. As described above, the photosensitive layer of the presensitized plate according to the first aspect of the invention contains (A) a sensitizing dye, (B) a polymerization initiator, (C) a polymerizable compound and (D) a binder polymer.

(A) Sensitizing Dye

The photosensitive layer according to the first aspect of the invention contains a sensitizing dye. The sensitizing dye can be used without particular limitation as far as it absorbs light upon image exposure to form the excited state and provides energy to the polymerization initiator described below with electron transfer, energy transfer or heat generation thereby improving the polymerization initiation function. Particularly, a sensitizing dye having an absorption maximum in a wavelength range from 300 to 450 nm or from 750 to 1,400 nm is preferably used.

Examples of the sensitizing dye having an absorption maximum in a wavelength range from 350 to 450 nm include merocyanine dyes, benzopyranes, coumarins, aromatic ketones and anthracenes.

Of the sensitizing dyes having an absorption maximum in a wavelength range from 360 to 450 nm, a dye represented by general formula (IX) shown below is more preferable in terms of high sensitivity.

[Chemical Formula 1]

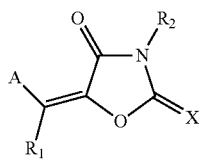

(IX)

In general formula (IX), A represents an aromatic cyclic group which may have a substituent or a heterocyclic group which may have a substituent, X represents an oxygen atom, a sulfur atom or N—($R_3$), and $R_1$, $R_2$ and $R_3$ each independently represent a monovalent non-metallic atomic group, or A and $R_1$ or $R_2$ and $R_3$ may be taken together to form an aliphatic or aromatic ring.

General formula (IX) is described in more detail below. $R_1$, $R_2$ and $R_3$ each independently represent a monovalent non-metallic atomic group, preferably an optionally substituted alkyl group, an optionally substituted alkenyl group, an optionally substituted aryl group, an optionally substituted aromatic heterocyclic residue, an optionally substituted alkoxy group, an optionally substituted alkylthio group, a hydroxyl group or a halogen atom.

A in general formula (IX) is described below. A represents an aromatic cyclic group which may have a substituent or a heterocyclic group which may have a substituent. Specific examples of the aromatic cyclic group which may have a substituent and the heterocyclic group which may have a substituent are the same as those described for $R_1$, $R_2$ and $R_3$ in general formula (IX).

Specific examples of the sensitizing dye that may be preferably used include compounds described in paragraphs [0047] to [0053] of JP 2007-58170 A.

Sensitizing dyes represented by general formulae (V) and (VI) shown below may also be used.

[Chemical Formula 2]

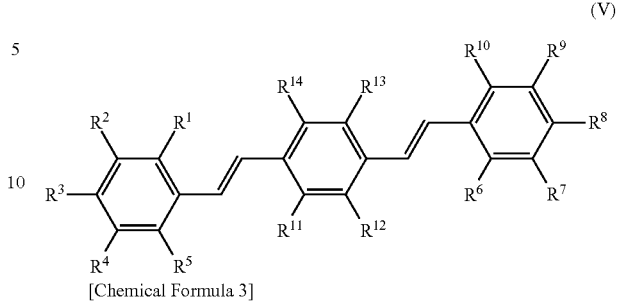

(V)

[Chemical Formula 3]

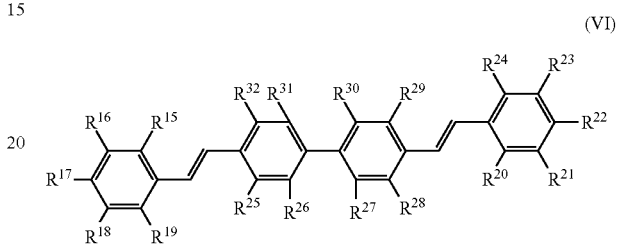

(VI)

In formula (V), $R^1$ to $R^{14}$ each independently represent a hydrogen atom, an alkyl group, an alkoxy group, a cyano group or a halogen atom, provided that at least one of $R^1$ to $R^{10}$ represents an alkoxy group having 2 or more carbon atoms.

In formula (VI), $R^{15}$ to $R^{32}$ each independently represent a hydrogen atom, an alkyl group, an alkoxy group, a cyano group or a halogen atom, provided that at least one of $R^{15}$ to $R^{24}$ represents an alkoxy group having 2 or more carbon atoms.

Specific examples of the sensitizing dye that may be preferably used include compounds described in EP 1349006 A and WO 2005/029187.

Sensitizing dyes described in JP 2007-171406 A, JP 2007-206216 A, JP 2007-206217 A, JP 2007-225701 A, JP 2007-225702 A, JP 2007-316582 A and JP 2007-328243 A may also be preferably used.

Next, the sensitizing dye having an absorption maximum in a wavelength range from 750 to 1,400 nm (hereinafter also referred to as "infrared absorber") that may be preferably used in the first aspect of the invention is described in detail. The infrared absorber used is preferably a dye or pigment.

Dyes which may be used include commercial dyes and known dyes that are mentioned in the technical literature, such as Senryo Binran [Handbook of Dyes] (The Society of Synthetic Organic Chemistry, Japan, 1970). Illustrative examples of suitable dyes include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal-thiolate complexes.

Of these dyes, cyanine dyes, squarylium dyes, pyrylium salts, nickel-thiolate complexes and indolenine cyanine dyes are particularly preferred. In addition, cyanine dyes and indolenine cyanine dyes are more preferred, and cyanine dyes of general formula (a) below are most preferred.

[Chemical Formula 4]

General formula (a)

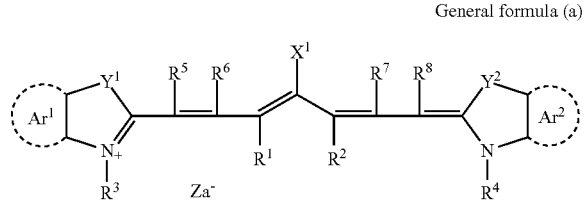

In general formula (a), $X^1$ is a hydrogen atom, a halogen atom, $—N(Ph)_2$, $—X^2-L^1$ or the following group. In the above formula, Ph is a phenyl group, $X^2$ is an oxygen atom, a nitrogen atom or a sulfur atom; $L^1$ is a hydrocarbon group having 1 to 12 carbon atoms, an aromatic ring having a heteroatom (N, S, O, a halogen atom, Se), or a hydrocarbon group of 1 to 12 carbon atoms containing a heteroatom. In the following group, $Xa^-$ is defined in the same way as $Za^-$ described below; and $R^a$ is a substituent selected from among a hydrogen atom, an alkyl group, an aryl group, an optionally substituted amino group and a halogen atom.

[Chemical Formula 5]

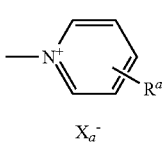

$R^1$ and $R^2$ each independently represent a hydrocarbon group having 1 to 12 carbon atoms. For good storage stability of the photosensitive layer-forming coating liquid, $R^1$ and $R^2$ are each preferably a hydrocarbon group having at least two carbon atoms. It is particularly preferred for $R^1$ and $R^2$ to be taken together to form a 5- or 6-membered ring.

$Ar^1$ and $Ar^2$ may be the same or different and are each an aromatic hydrocarbon group that may be substituted. Preferred aromatic hydrocarbon groups include benzene and naphthalene rings. Preferred examples of the substituent include hydrocarbon groups having up to 12 carbon atoms, halogen atoms, and alkoxy groups having up to 12 carbon atoms. $Y^1$ and $Y^2$ may be the same or different and are each a sulfur atom or a dialkylmethylene group having up to 12 carbon atoms. $R^3$ and $R^4$ may be the same or different and are each a hydrocarbon group having up to 20 carbon atoms which may have a substituent. Preferred examples of the substituent include alkoxy groups having up to 12 carbon atoms, carboxy group and sulfo group. $R^5$, $R^6$, $R^7$ and $R^8$ may be the same or different and are each a hydrogen atom or a hydrocarbon group having up to 12 carbon atoms. In consideration of the availability of the starting materials, it is preferable for each of $R^5$ to $R^8$ to be a hydrogen atom. $Za^-$ represents a counteranion. In cases where the cyanine dye of general formula (a) has an anionic substituent in the structure and there is no need for charge neutralization, $Za^-$ is unnecessary. For good storage stability of the photosensitive layer-forming coating liquid, preferred examples of $Za^-$ include halide ion, perchlorate ion, tetrafluoroborate ion, hexafluorophosphate ion and sulfonate ion. Of these, perchlorate ion, hexafluorophosphate ion and arylsulfonate ion are most preferred.

Specific examples of cyanine dyes of general formula (a) that may be preferably used in the first aspect of the invention include those described in paragraphs [0017] to [0019] of JP 2001-133969 A, paragraphs [0012] to [0021] of JP 2002-023360 A, and paragraphs [0012] to [0037] of JP 2002-040638 A.

Other preferred examples of the cyanine dyes include the specific indolenine cyanine dyes mentioned in JP 2002-278057 A.

Pigments which may be used include commercial pigments and pigments mentioned in the technical literatures, such as the Color Index (C.I.), Saishin Ganryo Binran [Latest Handbook of Pigments] (Japan Association of Pigment Technology, 1977), Saishin Ganryo Oyo Gijutsu [Recent Pigment Applications Technology] (CMC Publishing Co., Ltd., 1986), and Insatsu Inki Gijutsu [Printing Ink Technology] (CMC Publishing Co., Ltd., 1984). Exemplary pigments that may be preferably used include compounds described in paragraphs [0072] to [0076] of JP 2008-195018 A.

These sensitizing dyes are preferably added in an amount of 0.05 to 30 wt %, more preferably 0.1 to 20 wt % and most preferably 0.2 to 10 wt % based on the total solids content of the photosensitive layer.

(B) Polymerization Initiator

The photosensitive layer in the first aspect of the invention contains a polymerization initiator (hereinafter also referred to as "initiator compound"). In the first aspect of the invention, a radical polymerization initiator is preferably used.

In the first aspect of the invention, initiator compounds known to those skilled in the art may be used without limitation. Specific examples thereof include a trihalomethyl compound, a carbonyl compound, an organic peroxide, an azo compound, an azide compound, a metallocene compound, a hexaarylbiimidazole compound, an organic boron compound, a disulfone compound, an oxime ester compound, an onium salt compound and an iron arene complex. Of these, at least one compound selected from the group consisting of a hexaarylbiimidazole compound, an onium salt, a trihalomethyl compound and a metallocene compound is preferred, and a hexaarylbiimidazole compound is particularly preferred. The polymerization initiators may be appropriately used in combination of two or more thereof.

Examples of the hexaarylbiimidazole compound include lophine dimers described in JP 45-37377 B and JP 44-86516 B, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

It is particularly preferred to use the hexaarylbiimidazole compound in combination with a sensitizing dye having an absorption maximum in a wavelength range from 300 to 450 nm.

Examples of the onium salt that may be preferably used in the first aspect of the invention include a sulfonium salt, an iodonium salt and a diazonium salt. Particularly, a diaryliodonium salt and a triarylsulfonium salt are preferably used. It is particularly preferred to use the onium salt in combination with an infrared absorber having an absorption maximum in a wavelength range from 750 to 1,400 nm.

Other examples of the polymerization initiator that may be preferably used include those described in paragraphs [0071] to [0129] of JP 2007-206217 A.

The polymerization initiators in the first aspect of the invention are preferably used alone or in combination of two or more.

In the first aspect of the invention, the polymerization initiators are preferably used in the photosensitive layer in an amount of 0.01 to 20 wt %, more preferably 0.1 to 15 wt % and even more preferably 1.0 wt % to 10 wt % based on the total solids content of the photosensitive layer.

(C) Polymerizable Compound

Polymerizable compounds that may be used in the first aspect of the invention are addition polymerizable compounds having at least one ethylenically unsaturated double bond, and are selected from compounds having at least one, and preferably two or more, terminal ethylenically unsaturated bonds. Such compounds have a variety of chemical forms, including monomers, prepolymers such as dimers, trimers and oligomers, and mixtures of any of the above.

Exemplary monomers include unsaturated carboxylic acids (e.g., acrylic acid, methacrylic acid, itaconic acid, crotonic acid, isocrotonic acid, maleic acid) and esters and amides thereof. Of these, it is preferable to use an ester of an unsaturated carboxylic acid with a polyol compound or an amide of an unsaturated carboxylic acid with a polyamine compound. Preferred use can also be made of the addition reaction product of an unsaturated carboxylic acid ester or amide having a nucleophilic substituent such as a hydroxyl, amino or mercapto group with a monofunctional or polyfunctional isocyanate or epoxy compound; the dehydration condensation reaction product of the foregoing ester or amide with a monofunctional or polyfunctional carboxylic acid; the addition reaction product of an unsaturated carboxylic acid ester or amide having an electrophilic substituent such as an isocyanate or epoxy group with a monofunctional or polyfunctional alcohol, amine or thiol; or the substitution reaction product of an unsaturated carboxylic acid ester or amide having a removable substituent such as a halogen atom or a tosyloxy group with a monofunctional or polyfunctional alcohol, amine or thiol. Moreover, use can also be made of compound groups in which a suitable compound such as unsaturated phosphonic acid, styrene or vinyl ether is, substituted for the above-mentioned unsaturated carboxylic acid.

Specific examples of esters of polyol compounds with unsaturated carboxylic acids that may be used as monomers include acrylic acid esters such as ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer; and methacrylic acid esters such as tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxyethoxy)phenyl]dimethylmethane. Specific examples of amides of polyamine compounds with unsaturated carboxylic acids that may be used as monomers include methylenebis(acrylamide), methylenebis(methacrylamide), 1,6-hexamethylenebis(acrylamide), 1,6-hexamethylenebis(methacrylamide), diethylenetriaminetris(acrylamide), xylylenebis(acrylamide) and xylylenebis(methacrylamide).

Urethane-type addition polymerizable compounds prepared using an addition reaction between an isocyanate group and a hydroxyl group are also suitable. Specific examples include the vinylurethane compounds having two or more polymerizable vinyl groups per molecule that are obtained by adding a hydroxyl group-bearing vinyl monomer of general formula (A) below to the polyisocyanate compounds having two or more isocyanate groups per molecule as mentioned in JP 48-41708 B.

$$CH_2=C(R_4)COOCH_2CH(R_5)OH \tag{A}$$

In general formula (A), $R_4$ and $R_5$ are each H or $CH_3$.

Urethane acrylates such as those mentioned in JP 51-37193 A, JP 2-32293 B and JP 2-16765 B, and the urethane compounds having an ethylene oxide-type skeleton mentioned in JP 58-49860 B, JP 56-17654 B, JP 62-39417 B and JP 62-39418 B are also suitable.

Polymerizable compounds capable of undergoing photo-oxidation as described in JP 2007-506125 A are also preferable and polymerizable compounds containing at least one urea group and/or tertiary amino group are particularly preferred. Specific examples thereof include the following compounds.

[Chemical Formula 6]

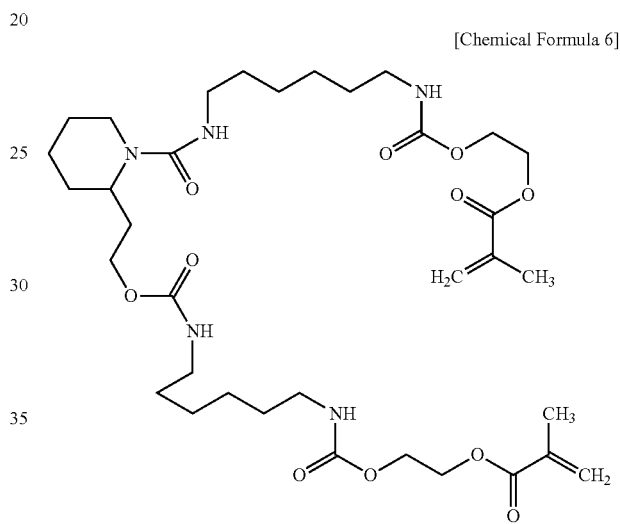

Details concerning use of the polymerizable compound, for example, what type of structure it should have, whether to use one such compound alone or a combination of two or more thereof, and the amount of addition can be selected as desired in accordance with the performance characteristics ultimately intended for the presensitized plate. The polymerizable compounds are preferably used in an amount of 5 to 75 wt %, more preferably 25 to 70 wt % and most preferably 30 to 60 wt % based on the total solids content of the photosensitive layer.

(D) Binder Polymer

The photosensitive layer according to the first aspect of the invention contains a binder polymer. A polymer capable of holding the ingredients of the photosensitive layer on the support and being removed with a developer is used as the binder polymer. Examples of the binder polymer that may be used include a (meth)acrylic polymer, polyurethane resin, polyvinyl alcohol resin, polyvinyl butyral resin, polyvinyl formal resin, polyamide resin, polyester resin and epoxy resin. In particular, a (meth)acrylic polymer, polyurethane resin and polyvinyl butyral resin are preferably used.

The term "(meth)acrylic polymer" as used in the first aspect of the invention means a copolymer containing as a polymerization ingredient, (meth)acrylic acid or a (meth) acrylic acid derivative, for example, a (meth)acrylate (including, for example, an alkyl ester, aryl ester and allyl ester), (meth)acrylamide or a (meth)acrylamide derivative. The term "polyurethane resin" as used herein means a polymer formed by a condensation reaction of a compound having two or more isocyanate groups with a compound having two or more hydroxyl groups. The term "polyvinyl butyral resin" as used herein means a polymer synthesized by a reaction (acetalization reaction) of polyvinyl alcohol obtained by partial or full saponification of polyvinyl acetate with butylaldehyde under an acidic condition and includes a polymer wherein an acid group or the like is introduced by a method of reacting the remaining hydroxy group with a compound having an acid group or the like.

One preferable example of the binder polymer according to the first aspect of the invention includes a' copolymer containing an acid group-containing repeating unit. Examples of the acid group include a carboxylate group, a sulfonate group, a phosphonate group, a phosphate group and a sulfonamido group, and a carboxylate group is particularly preferred. A repeating unit derived from (meth)acrylic acid or a repeating unit represented by general formula (I) below is preferably used.

[Chemical Formula 7]

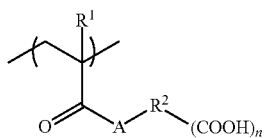

(I)

In general formula (I), $R^1$ represents a hydrogen atom or a methyl group, $R^2$ represents a single bond or an (n+1) valent linking group, A represents an oxygen atom or $-NR^3-$, wherein $R^3$ represents a hydrogen atom or a monovalent hydrocarbon group having 1 to 10 carbon atoms, and n represents an integer of 1 to 5.

The linking group represented by $R^2$ in general formula (I) preferably includes one or more atoms selected from hydrogen atom, oxygen atom, nitrogen atom, sulfur atom and halogen atoms and the number of atoms is preferably from 1 to 80. Specific examples of the linking group include an alkylene, a substituted alkylene, an arylene and a substituted arylene. The linking group may have a structure in which a plurality of such divalent groups are connected to each other via an amide bond or an ester bond. $R^2$ is preferably a single bond, an alkylene or a substituted alkylene, more preferably a single bond, an alkylene having 1 to 5 carbon atoms, or a substituted alkylene having 1 to 5 carbon atoms, and most preferably a single bond, an alkylene having 1 to 3 carbon atoms, or a substituted alkylene having 1 to 3 carbon atoms.

Examples of the substituent include a monovalent nonmetallic atomic group exclusive of a hydrogen atom, for example, a halogen atom ($-F$, $-Br$, $-Cl$ or $-I$), a hydroxyl group, an alkoxy group, an aryloxy group, a mercapto group, an acyl group, a carboxyl group and a conjugate base group thereof, an alkoxycarbonyl group, an aryloxycarbonyl group, a carbamoyl group, an aryl group, an alkenyl group and an alkynyl group.

$R^3$ is preferably a hydrogen atom or a hydrocarbon group having 1 to 5 carbon atoms, more preferably a hydrogen atom or a hydrocarbon group having 1 to 3 carbon atoms, and most preferably a hydrogen atom or a methyl group. n is preferably 1 to 3, more preferably 1 or 2, and most preferably 1.

The ratio (mol %) of the carboxylic acid group-containing copolymerization ingredient to the total copolymerization ingredients of the binder polymer is preferably 1 to 70% in terms of developability. Considering good compatibility between the developability and press life, the ratio is more preferably from 1 to 50%, and most preferably from 1 to 30%. Preferable specific examples of the carboxylic acid group-containing unit include the following.

[Chemical Formula 8]

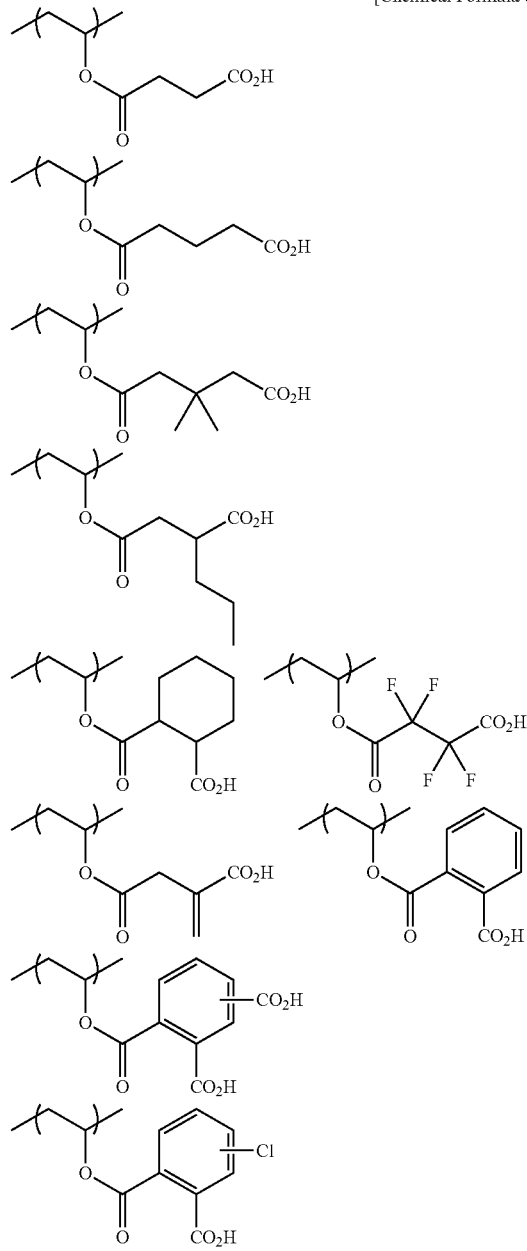

In addition, the acid group in the acid group-containing polymer which is a preferred example of the binder polymer in the first aspect of the invention may be neutralized with a basic compound and is preferably neutralized particularly with a compound containing a basic nitrogen such as an amino group, an amidine group or a guanidine group. The basic nitrogen-containing compound preferably also has an ethylenically unsaturated group. Specific examples of such compound include those described in WO 2007/057442.

In the first aspect of the invention, a copolymer of (meth) acrylic acid and an alkyl(meth)acrylate is preferably used. It is particularly preferred to use a copolymer of (meth)acrylic acid and methyl(meth)acrylate.

The binder polymer that may be used in the first aspect of the invention preferably further contains a crosslinkable group. The crosslinkable group as used herein refers to a group that may crosslink the binder polymer in the process of a radical polymerization reaction which is caused in the photosensitive layer upon exposure of the presensitized plate. The crosslinkable group is not particularly limited as long as it has such a function and exemplary functional groups that may undergo an addition polymerization reaction include a group having an ethylenically unsaturated bond, amino group and epoxy group. A functional group that may form a radical upon exposure to light may be used and examples of such a crosslinkable group include a thiol group and a halogen group. Of these, a group having an ethylenically unsaturated bond is preferred. Examples of the group having an ethylenically unsaturated bond include styryl group, (meth)acryloyl group and allyl group.

The binder polymer is cured by, for example, the addition of free radicals (polymerization initiating radicals, or propagation radicals during polymerization of the polymerizable compound) to the crosslinkable functional groups on the polymer to effect addition polymerization, either directly between polymers or via chain polymerization of the polymerizable compounds, so as to form crosslinks between the polymer molecules. Alternatively, the binder polymer having crosslinkability is cured when atoms in the polymer (e.g., hydrogen atoms on carbon atoms adjacent to the crosslinkable functional groups) are pulled off by free radicals, thereby forming polymer radicals which bond together, resulting in the formation of crosslinks between the polymer molecules.

The crosslinkable group content in the binder polymer (content of radical-polymerizable unsaturated double bonds, as determined by iodometry) is preferably 0.01 to 10.0 mmol, more preferably 0.05 to 5.0 mmol, and most preferably 0.1 to 2.0 mmol, per gram of the binder polymer.

In addition to the acid group-containing polymerization unit and a crosslinkable group-containing polymerization unit, the binder polymer that may be used in the first aspect of the invention may contain a polymerization unit of alkyl (meth)acrylate or aralkyl(meth)acrylate. The alkyl group in the alkyl(meth)acrylate is preferably an alkyl group having 1 to 5 carbon atoms, and more preferably methyl group. Benzyl (meth)acrylate is used as the aralkyl(meth)acrylate.

The binder polymer has a weight-average molecular weight of preferably at least 5,000, and more preferably from 10,000 to 300,000, and has a number-average molecular weight of preferably at least 1,000, and more preferably from 2,000 to 250,000. The polydispersity (weight-average molecular weight/number-average molecular weight) is preferably from 1.1 to 10.

The binder polymers may be used alone or in combination of two or more. In terms of high strength in image areas and good image-forming property, the content of the binder polymer is preferably 5 to 75 wt %, more preferably 10 to 70 wt %, and even more preferably 10 to 60 wt % based on the total solids content of the photosensitive layer.

The total content of the polymerizable compound and the binder polymer is preferably up to 80 wt % based on the total solids content of the photosensitive layer. A total content exceeding 80 wt % may reduce the sensitivity and developability. The total content is more preferably from 35 to 75 wt %.

According to the first aspect of the invention, the permeability of developer into the photosensitive layer and the developability are further improved by controlling the ratio of the polymerizable compound to the binder polymer contained in the photosensitive layer of the presensitized plate. Specifically, the weight ratio of the radical polymerizable compound to the binder polymer in the photosensitive layer is preferably 1.2 or more, more preferably 1.25 to 4.5, and most preferably 2 to 4.

(Other Ingredients for Photosensitive Layer)

The photosensitive layer may further contain a chain transfer agent. For example, compounds having SH, PH, SiH or GeH in their molecules are used for the chain transfer agent. These compounds donate hydrogen to a less active radical species to generate a radical or is oxidized and then deprotonized to generate a radical.

In particular, thiol compounds (e.g., a 2-mercaptobenzimidazole, a 2-mercaptobenzothiazole, a 2-mercaptobenzoxazole, a 3-mercaptotriazole and a 5-mercaptotetrazole) may be preferably used for the chain transfer agent in the photosensitive layer according to the first aspect of the invention.

The photosensitive layer according to the first aspect of the invention may optionally further contain various additives. Examples of the additives include a surfactant for promoting the developability and improving the surface state of coated layer, a microcapsule for providing good compatibility between developability and press life, a hydrophilic polymer for improving the developability and dispersion stability of the microcapsule, a coloring agent or print-out agent for visually distinguishing the image area from the non-image area, a polymerization inhibitor for preventing undesirable thermal polymerization of the radical polymerizable compound during the production and storage of the photosensitive layer, a higher fatty acid derivative for avoiding the polymerization inhibition due to oxygen, inorganic fine particles for increasing the strength of the image area in the cured film, a hydrophilic low molecular weight compound for improving the developability, a co-sensitizer for increasing the sensitivity, a chain transfer agent and a plasticizer for improving the plasticity. Known compounds, for example, compounds described in paragraphs [0161] to [0215] of JP 2007-206217 A may be used for the additives.

<Formation of Photosensitive Layer>

The photosensitive layer in the first aspect of the invention is formed by dispersing or dissolving the necessary ingredients described above in a solvent to prepare a coating liquid and applying the thus prepared coating liquid to the support. Examples of the solvent that may be used include, but are not limited to, methyl ethyl ketone, ethylene glycol monomethyl ether, 1-methoxy-2-propanol, 2-methoxyethyl acetate, 1-methoxy-2-propyl acetate and γ-butyrolactone. These solvents may be used alone or as mixtures of two or more thereof. The coating liquid has a solids concentration of preferably 1 to 50 wt %.

The photosensitive layer obtained on the support after coating and drying has a coating weight (solids content) of 0.3 to 3.0 g/m$^2$. At a coating weight within this range, good coating properties are obtained. Any of various coating methods may be used. Examples of suitable methods of coating include bar coating, spin coating, spray coating, curtain coating, dip coating, air knife coating, blade coating and roll coating.

[Protective Layer]

In the presensitized plate in the first aspect of the invention, a protective layer (oxygen shield layer) is provided on the photosensitive layer in order to prevent diffusion and penetration of oxygen which may inhibit the polymerization reaction at the time of exposure. Exemplary materials that may be used in the protective layer include water-soluble polymer compounds having relatively high crystallizability. Specifically, when polyvinyl alcohol is used as the main ingredient, the best results can be obtained in the fundamental characteristics, for example, oxygen barrier properties and removability of the protective layer during development.

So long as the polyvinyl alcohol for use in the protective layer includes unsubstituted vinyl alcohol units which provide the protective layer with the required oxygen barrier properties and water solubility, some of the vinyl alcohol units may be substituted with esters, ethers or acetals. Polyvinyl alcohol may also partly have other copolymer ingredient. Polyvinyl alcohol is obtained by hydrolysis of polyvinyl acetate. Specific examples of the polyvinyl alcohol include those having a hydrolysis degree from 71 to 100 mol % and a number of repeating polymer units from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (Kuraray Co., Ltd.). The polyvinyl alcohols may be used alone or as a mixture. In a preferred embodiment, the polyvinyl alcohol content in the protective layer is 20 to 95 wt % and more preferably 30 to 90 wt %.

Known modified polyvinyl alcohol may also be preferably used. Particularly, an acid-modified polyvinyl alcohol having a carboxylate group or a sulfonate group is preferably used. An ingredient such as polyvinyl pyrrolidone or its modified product is preferably used as a mixture with polyvinyl alcohol in terms of the oxygen barrier properties and removability of the protective layer during development. The content in the protective layer is from 3.5 to 80 wt %, preferably from 10 to 60 wt % and even more preferably from 15 to 30 wt %.

Flexibility may be imparted to the protective layer by adding, for example, glycerin, dipropylene glycol or the like to the (co)polymer in an amount of several wt %. In addition, anionic surfactants such as sodium alkyl sulfate and sodium alkyl sulfonate; amphoteric surfactants such as alkylaminocarboxylate and alkylaminodicarboxylate; and nonionic surfactants such as polyoxyethylene alkyl phenyl ether may be added in an amount of several wt % with respect to the (co)polymer.

The protective layer of the presensitized plate in the first aspect of the invention contains an inorganic layered compound as described in paragraphs [0018] to [0024] of JP 2006-106700 A in order to improve the oxygen barrier properties and the surface protection properties of the photosensitive layer. Of the inorganic layered compounds, a fluorine-containing swelling synthetic mica which is a synthetic inorganic layered compound is particularly useful.

The coating weight after drying of the protective layer is preferably from 0.05 to 10 g/m$^2$, more preferably from 0.1 to 0.5 g/m$^2$ when an inorganic layered compound is included, and even more preferably from 0.5 to 5 g/m$^2$ when no inorganic layered compound is included.

[Undercoat Layer]

In the presensitized plate in the first aspect of the invention, an undercoat layer (also referred to as "intermediate layer") may be provided between the photosensitive layer and the support.

An undercoat layer containing a compound having an acid group such as phosphonic acid, phosphoric acid or sulfonic acid is preferably used. The compound preferably further contains a polymerizable group in order to improve the adhesion to the photosensitive layer. A compound having a hydrophilizing group such as ethylene oxide group may also be a preferred compound.

The compound may be a low molecular weight polymer or a high molecular weight polymer. Preferred examples include a silane coupling agent having an addition-polymerizable, ethylenic double bond reactive group as described in JP 10-282679 A and a phosphorus compound having an ethylenic double bond reactive group as described in JP 2-304441 A.

An undercoat layer containing a low molecular weight compound or a high molecular weight compound having a crosslinkable group (preferably an ethylenically unsaturated bond group), a functional group capable of interacting with the surface of support and a hydrophilic group as described in JP 2005-238816 A, JP 2005-125749 A, JP 2006-239867 A and JP 2006-215263 A is the most preferred undercoat layer.

The coating weight (solids content) of the undercoat layer is preferably from 0.1 to 100 mg/m$^2$ and more preferably from 1 to 30 mg/m$^2$.

<Backcoat Layer>

A backcoat layer may optionally be formed on the back surface of the support after surface treatment on the support or formation of the undercoat layer on the support.

The backcoat layer preferably includes, for example, a layer comprising an organic polymer compound described in JP 5-45885 A and a coating layer comprising a metal oxide obtained by hydrolysis and polycondensation of an organic metal compound or inorganic metal compound as described in JP 6-35174 A. Of these, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Plate-Making Method]

The lithographic printing plate is prepared by subjecting the presensitized plate in the first aspect of the invention to image exposure and development. Development is performed by a method (1) which involves development with a developer and a method (2) which involves developing on a printing press as fountain solution and/or ink is added (on-press development) but is not particularly limited in the first aspect of the invention.

[Developer]

The developer that may be used in the method of making the lithographic printing plate is not particularly limited and a developer containing an inorganic alkali salt and a surfactant and having a pH of 11 to 13 (or a developer containing a surfactant and/or a water-soluble polymer and having a pH of 2 to 11 (described in JP 2007-079136 A) are preferably used.

Inorganic alkali agents such as sodium hydroxide, potassium hydroxide, ammonium hydroxide, lithium hydroxide, sodium silicate, potassium silicate, ammonium silicate, lithium silicate, sodium tertiary phosphate, potassium tertiary phosphate, ammonium tertiary phosphate, sodium carbonate, potassium carbonate, ammonium carbonate, sodium hydrogen carbonate, potassium hydrogen carbonate, ammonium hydrogen carbonate, sodium borate, potassium borate and ammonium borate can be appropriately used as the inorganic alkali salts. These may be used alone or in combination of two or more.

When a silicate is to be used, the developability can be easily adjusted by varying the ratio between the silicate ingredients silicon dioxide $SiO_2$ and alkali oxide $M_2O$ (M represents an alkali metal or ammonium group) and the concentrations thereof. The mixing ratio between the silicon dioxide $SiO_2$ and the alkali oxide $M_2O$ in the aqueous alkali solution (molar ratio of $SiO_2$ to $M_2O$) is preferably from 0.5 to 3.0 and more preferably from 1.0 to 2.0. At a $SiO_2/M_2O$ ratio of less than 0.5, the concentration with respect to the weight of the aqueous alkali solution is preferably from 1 to 10 wt %, more preferably from 3 to 8 wt % and most preferably from 4 to 7 wt %. A concentration of 1 wt % or more does not reduce the developability and processing capacity, whereas a concentration of 10 wt % or less hardly causes precipitation or crystallization and has no problem in the wastewater disposal because the wastewater is more unlikely to gelate upon its neutralization.

An organic alkali agent may be supplementarily used in combination in order to assist the fine adjustment of the alkali concentration and the solubility of the photosensitive layer. Examples of the organic alkali agent include monoethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethyl ammonium hydroxide. These alkali agents are used alone or in combination of two or more.

The surfactant may be appropriately used. The anionic surfactant that may be used in the developer according to the first aspect of the invention is not particularly limited and examples thereof include fatty acid salts, abietic acid salts, hydroxyalkanesulfonic acid salts, alkanesulfonic acid salts, dialkylsulfosuccinic acid salts, straight-chain alkylbenzene sulfonic acid salts, branched alkylbenzene sulfonic acid salts, alkylnaphthalene sulfonic acid salts, alkyldiphenylether (di)sulfonic acid salts, alkylphenoxy polyoxyethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil, sulfated tallow oil, sulfate ester salts of fatty acid alkyl esters, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymers, partially saponified products of olefin-maleic anhydride copolymers and naphthalene sulfonate formalin condensates. Of these, alkylbenzenesulfonic acid salts, alkylnaphthalenesulfonic acid salts, and alkyldiphenylether (di)sulfonic acid salts are most preferably used.

The cationic surfactant that may be used in the developer according to the first aspect of the invention is not particularly limited and a conventionally known surfactant may be used. Examples thereof include alkylamine salts, quaternary ammonium salts, polyoxyethylene alkylamine salts and polyethylene polyamine derivatives.

The nonionic surfactant that may be used in the developer according to the first aspect of the invention is not particularly limited and examples thereof include polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of fats and oils, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Of the compounds, those having an aromatic ring and an ethylene oxide chain are preferred, and alkyl-substituted or unsubstituted phenol ethylene oxide adducts and alkyl-substituted or unsubstituted naphthol ethylene oxide adducts are more preferred.

The amphoteric surfactant is not particularly limited and examples thereof include amine oxide type surfactants including alkyldimethylamine oxide, betaine type surfactants including alkyl betaine and amino acid type surfactants including sodium salt of alkylamino fatty acid.

In particular, an alkyldimethylamine oxide which may have a substituent, an alkyl carboxybetaine which may have a substituent and an alkyl sulfobetaine which may have a substituent are preferably used. Specific examples of the surfactant that may be used are described, for example, in paragraphs [0255] to [0278] of JP 2008-203359 A and paragraphs [0028] to [0052] of JP 2008-276166 A.

Two or more of the surfactants may be used in combination, and the content of the surfactant in the developer is preferably from 0.01 to 20 wt %, and more preferably from 0.1 to 10 wt %.

The water-soluble polymer compounds described in JP 2007-079136 A may be used in the developer.

The pH of the developer that may be used to manufacture the lithographic printing plate in the first aspect of the invention is not particularly limited and is preferably from 11.0 to 12.7 and more preferably from 11.5 to 12.5.

The developer preferably has an electrical conductivity of 3 to 30 mS/cm. An electrical conductivity of 3 mS/cm or more makes it possible to reliably dissolve the photopolymerizable photosensitive layer on the surface of the aluminum support and there is no stain in printing. An electrical conductivity of 30 mS/cm or less does not excessively increase the salt concentration to prevent the dissolution rate of the photopolymerizable photosensitive layer from being extremely reduced, nor does a residual film occur in the unexposed areas. It is particularly preferred for the developer to have an electrical conductivity of 5 to 20 mS/cm.

The lithographic printing plate according to the first aspect of the invention is developed by an ordinary method, for example, by immersing the exposed lithographic printing plate in a developer at a temperature of 0 to 60° C. and preferably about 15 to 40° C. and rubbing it with a brush.

Further, when the lithographic printing plate is developed using an automatic developing machine, the developer is fatigued depending on the treated amount and therefore the treating ability may be recovered by using a replenisher or a fresh developer.

The lithographic printing plate developed in this manner is further subjected to post-treatments using rinsing water, a rinsing solution containing a surfactant or a desensitizing solution containing gum arabic or a starch derivative as described in JP 54-8002 A, JP 55-115045 A and JP 59-58431 A. In the first aspect of the invention, the post-treatments of the lithographic printing plate may be used in various combinations.

The photosensitive layer of the lithographic printing plate may also be solubilized in neutral water or weakly alkaline water by using a highly water-soluble ingredient and the lithographic printing plate having such a structure may also be developed with a developer at a pH of 2 to 11. The post-treatment using rinsing water or a desensitizing solution may not be performed in the case of using a developer at a pH of 2 to 10.

In addition, when the photosensitive layer is rendered soluble in neutral water or weakly alkaline water, on-press development is possible and the photosensitive layer can also be used in a system in which it is exposed and developed on a printing press after being mounted thereon. Such a system is described in detail in JP 2005-119273 A, JP 2006-256035 A and JP 2005-14347 A.

In addition, in the process of making the lithographic printing plate from the presensitized plate in the first aspect of the invention, the entire surface of the plate may optionally be heated before exposure, during exposure or in the period from exposure to development. Such heating may be advantageous in the promotion of the image forming reaction in the photosensitive layer, improvement of the sensitivity and press life, and stabilization of the sensitivity. In addition, it is also effective for the whole surface of the developed image to be subjected to post heating or exposure in order to improve the image strength and press life. In general, pre-development heating is preferably performed under a mild condition of 150° C. or less. Too high a temperature causes curing of the unexposed areas or other problem. A very severe condition is used in post-development heating. The heating temperature is usually in a range of 100 to 500° C. Too low a temperature does not have a sufficient image enhancing effect, whereas too high a temperature causes problems such as deterioration of the support and thermal decomposition of the image areas.

Prior to the development process, the presensitized plate is exposed to a laser beam through a transparent original having, for example, a line image or a halftone dot image, or is imagewise exposed by laser beam scanning using digital data.

The wavelength of the desirable light source that may be preferably used is in a range of 300 nm to 450 nm or 750 nm to 1,400 nm. The presensitized plate used in a wavelength range of 300 nm to 450 nm has a photosensitive layer containing a sensitizing dye having an absorption maximum in this range and the presensitized plate used in a wavelength range of 750 nm to 1,400 nm contains an infrared absorber which is a sensitizing dye having an absorption in this range. A semiconductor laser and particularly an AlGaInN semiconductor laser (commercially available InGaN semiconductor laser; 5 to 30 mW) are suitable for the 300 nm-450 nm light source in terms of wavelength properties and cost. A solid-state laser and a semiconductor laser emitting infrared radiation are suitable for the 750 nm-1,400 nm light source. The exposure mechanism used may be of any of inner surface drum type, outer surface drum type and flat bed type.

The lithographic printing plate obtained after the foregoing treatments is mounted on an offset printing press and used to print a large number of impressions.

Next, the second aspect of the invention is described.

The presensitized plate in the second aspect of the invention includes an image recording layer containing (E) an infrared absorbing dye and (F) hydrophobic thermoplastic particles and formed on a support and is characterized in that the support is prepared from an aluminum alloy plate in which a surface density of intermetallic compounds with a circle equivalent diameter of 0.2 μm or more is 35,000 pcs/mm$^2$ or more.

As described above, the image recording layer having the hydrophobic thermoplastic polymer particles is the one in which the hydrophobic thermoplastic polymer particles are arrayed and therefore moisture is easily incorporated in the image recording layer by ambient air or other factor. The presence of moisture included in the image recording layer due to ambient air or the like and hydrophilic ingredients anionized by the moisture (hereinafter referred to simply as "anion") causes corrosion of the aluminum alloy plate, thus developing corrosive micro-stains.

The inventors of the invention have found that, in cases where large amounts of hydrophilic ingredients are included in the image recording layer, intermetallic compounds with a large circle equivalent diameter which are present at the surface of the aluminum alloy plate are more likely to serve as starting points for corrosion of the aluminum alloy plate and this tendency is remarkable when intermetallic compounds with a circle equivalent diameter exceeding 1 μm are present.

In the aluminum alloy plate containing intermetallic compound particles with a circle equivalent diameter of 0.2 μm or more at a surface density of 35,000 pcs/mm$^2$ or more, the number of intermetallic compound particles with a circle equivalent diameter of more than 1 μm which are present at the surface of the aluminum alloy plate is extremely small and therefore the corrosion of the aluminum alloy plate and the corrosive micro-stains resulting therefrom can be suppressed in cases where the image recording layer contains large amounts of hydrophilic ingredients.

Intermetallic compounds with a circle equivalent diameter of 0.2 μm or more are preferably present at the surface of the aluminum alloy plate at a density of 50,000 pcs/mm$^2$ or more in terms of suppressing the corrosive micro-stains.

The uniformity of the electrolytically grained surface is improved by using the aluminum alloy plate containing intermetallic compound particles with a circle equivalent diameter of 0.2 μm or more at a surface density of 35,000 pcs/mm$^2$ or more as described in the first aspect of the invention.

As described above, the number of intermetallic compound particles with a circle equivalent diameter of more than 1 μm which are present at the surface of the aluminum alloy plate is preferably small in terms of suppressing the corrosive micro-stains. More specifically, the number of intermetallic compound particles with a circle equivalent diameter of 1.0 μm or more at the surface of the aluminum alloy plate is preferably up to 2,500 pcs/mm$^2$ and more preferably up to 1,500 pcs/mm$^2$.

The number and density of the intermetallic compound particles at the surface of the aluminum alloy plate can be measured by the methods described in the first aspect of the invention.

As in the first aspect of the invention, the aluminum alloy plate that may be used in the second aspect of the invention contains at least 99 wt % of aluminum and also contains as trace elements at least one element selected from the group consisting of Si, Fe, Ni, Mn, Cu, Mg, Cr, Zn, Bi, Ti and V. In a preferred embodiment, the aluminum alloy plate contains Al, Si and Fe as its essential ingredients.

As in the first aspect of the invention, in the preferred embodiment of the aluminum alloy plate containing Al, Si and Fe as its essential ingredients, specific examples of the intermetallic compounds present in the aluminum alloy plate include Al—Fe intermetallic compounds such as Al$_3$Fe and Al$_6$Fe and AlFeSi intermetallic compounds such as α-AlFeSi and β-AlFeSi.

As described above, in the preferred embodiment of the aluminum alloy plate containing Al, Si and Fe as its essential ingredients, one or both of the Al—Fe intermetallic compounds such as Al$_3$Fe and Al$_6$Fe and AlFeSi intermetallic compounds such as α-AlFeSi and β-AlFeSi are present in the aluminum alloy plate.

It has been found that, of these intermetallic compounds, the Al—Fe intermetallic compounds serve as starting points for corrosion of the aluminum alloy plate in cases where the image recording layer contains large amounts of hydrophilic ingredients, and the aluminum alloy plate preferably contains the Al—Fe intermetallic compounds in small amounts in terms of suppressing the corrosive micro-stains. More specifically, the Al—Fe intermetallic compounds of the aluminum alloy plate preferably have peak count values as measured with an X-ray diffractometer (XRD) of up to 400 cps and particularly both of $Al_3Fe$ and $Al_6Fe$ preferably have peak count values of up to 400 cps.

The peak count value of the Al—Fe intermetallic compounds was determined by setting the aluminum alloy plate in the X-ray diffractometer (e.g., RAD-rR (12 kW rotary pair cathode type; Rigaku Corporation) and measuring under the following conditions.

Set tube voltage: 50 kV;
Set tube current: 200 mA;
Sampling interval: 0.01°;
Scanning rate: 1°/min;
2θ Scan range: 10° to 70°; and
A graphite monochromator was used.

In terms of suppressing the corrosive micro-stains, the Al—Fe intermetallic compounds of the aluminum alloy plate preferably have peak count values of up to 200 cps and particularly both of $Al_3Fe$ and $Al_6Fe$ preferably have peak count values of up to 200 cps.

On the other hand, it is found that the Al—Fe—Si intermetallic compounds such as α-AlFeSi and β-AlFeSi do not easily serve as starting points for corrosion of the aluminum alloy plate compared to the Al—Fe intermetallic compounds.

It has been found that, of these intermetallic compounds, the Al—Fe intermetallic compounds serve as starting points for corrosion of the aluminum alloy plate in cases where the image recording layer contains large amounts of hydrophilic ingredients, and the aluminum alloy plate preferably contains the Al—Fe—Si intermetallic compounds (in particular α-AlFeSi) in large amounts in terms of suppressing the corrosive micro-stains. More specifically, the Al—Fe—Si intermetallic compounds (in particular α-AlFeSi) of the aluminum alloy plate preferably have peak count values as measured with an X-ray diffractometer (XRD) of 30 cps or more and more preferably 50 cps or more.

<Aluminum Alloy Plate (Rolled Aluminum)>

The preferred embodiment of the aluminum alloy plate that may be used in the second aspect of the invention and its manufacturing procedure (continuous casting and rolling process) are the same as those in the first aspect of the invention and therefore their description is omitted.

<Surface Roughening Treatment>

The support that may be used in the presensitized plate according to the second aspect of the invention can be manufactured by subjecting the surface of the aluminum alloy plate obtained by the continuous casting step and various steps carried out as desired (e.g., intermediate annealing step, cold rolling step) to surface roughening treatment.

The surface roughening treatment and various other treatments following the surface roughening treatment (e.g., anodizing treatment) are the same as those in the first aspect of the invention and therefore their description is omitted.

In the second aspect of the invention, a phosphoric acid solution is preferably used as the electrolytic solution in anodizing treatment as described in JP 2-57391 A. According to the method described in JP 2-57391 A, a phosphoric acid solution is used as the electrolytic solution and anodizing treatment is performed using a phosphoric acid solution as the electrolytic solution under the following conditions: a phosphoric acid concentration of 15 to 45 wt %; an electrolytic solution temperature of 20 to 70° C.; a current density of 2.0 A·min/dm$^2$ or more; a voltage of 50 V or more; and an electrolysis time of 15 seconds to 3 minutes.

By performing the above-described procedure, an anodized film can be formed in which the average pore size in the surface layer of the anodized film (average surface pore size) is from 10 to 75 nm and preferably from 20 to 50 nm and the ratio of the average of the maximum diameter inside the pores (average of the pore maximum diameter) to the average surface pore size is 1.1 to 3.0.

[Image Recording Layer]

In the second aspect of the invention, the image recording layer is formed on the support formed according to the above-described procedure. As described above, the image recording layer of the presensitized plate in the second aspect of the invention contains (E) an infrared absorbing dye and (F) hydrophobic thermoplastic particles.

(E) Infrared Absorbing Dye

The image recording layer in the second aspect of the invention contains an infrared absorbing dye. Particularly, an infrared absorbing dye having an absorption maximum in a wavelength range from 760 to 1,200 nm is preferably used. Particularly, an infrared absorbing dye which is a dye having an absorption maximum in a wavelength range from 760 to 1,200 nm is preferably used.

Preferred examples of the infrared absorbing dye include the infrared absorbers described in the first aspect of the invention. The infrared absorbing dyes that may be used are the compounds described in paragraphs [0058] to [0087] of JP 2008-195018 A.

These infrared absorbing dyes may be used alone or in combination of two or more thereof, or in combination with infrared absorbers other than the infrared absorbing dyes such as pigments. Exemplary pigments that may be preferably used include compounds described in paragraphs [0072] to [0076] of JP 2008-195018 A.

The image recording layer in the second aspect of the invention preferably contains a sensitizing dye in an amount of 0.1 to 10.0 wt % and more preferably 0.5 to 5.0 wt % based on the total solids content of the image recording layer.

(F) Hydrophobic Thermoplastic Particles

The image recording layer in the second aspect of the invention contains hydrophobic thermoplastic particles (also referred to as "hydrophobic thermoplastic polymer particles"). Specific examples of the suitable hydrophobic polymer include polyethylene, poly(vinyl chloride), poly(methyl (meth)acrylate), poly(ethyl(meth)acrylate), poly(vinilidene chloride), poly(meth)acrylonitrile, poly(vinylcarbazole), polystyrene and copolymers thereof. Polystyrene and poly (meth)acrylonitrile or derivatives thereof are very preferred embodiments.

In particular, the thermoplastic polymer preferably contains polystyrene in an amount of at least 50 wt % and more preferably at least 60 wt %.

In order to obtain high resistance to organic chemicals such as hydrocarbons that may be used in a cleaner, the thermoplastic polymer preferably contains a nitrogen-containing monomer unit, or a monomer unit characterized by a solubility parameter of more than 20, for example, (meth)acrylonitrile in an amount of at least 5 wt % and more preferably at least 30 wt %. Such nitrogen-containing monomer unit is described in JP 2002-251005 A.

The hydrophobic thermoplastic polymer is most preferably a copolymer including a styrene unit and an acrylonitrile unit at a weight ratio of styrene to acrylonitrile of 1/1 to 5/1, for example, 2/1.

The hydrophobic thermoplastic polymer particles preferably have a weight-average molecular weight of 5,000 to 1,000,000 g/mol. The hydrophobic thermoplastic polymer particles preferably have a number-average particle size of less than 200 nm and more preferably 10 to 100 nm. The amount of the hydrophobic thermoplastic polymer particles with respect to the solids contained in the image recording layer is preferably from 20 wt % to 65 wt %, more preferably from 25 wt % to 55 wt % and most preferably from 30 wt % to 45 wt %.

It is preferred for the hydrophobic thermoplastic polymer particles to be present as a dispersion in the image recording layer-forming coating liquid and to be prepared by the method disclosed in U.S. Pat. No. 3,476,937. Another preferred method of preparing the aqueous dispersion of the thermoplastic polymer particles involves dissolving the hydrophobic thermoplastic polymer in a water-immiscible organic solvent, dispersing the resulting solution in water or an aqueous medium and removing the organic solvent by evaporation.

(Hydrophobic Resin)

A hydrophilic resin may be added to the image recording layer in the second aspect of the invention. Addition of the hydrophilic resin improves not only the developability but also the film strength of the image recording layer itself. Preferred hydrophilic resins include those having hydrophilic groups such as hydroxyl, carboxyl, hydroxyethyl, hydroxypropyl, amino, aminoethyl, aminopropyl and carboxymethyl.

Specific examples of the hydrophilic resin include gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetates having a degree of hydrolysis of at least 60 wt %, and preferably at least 80 wt %, polyvinyl formal, polyvinyl butyral, polyvinyl pyrrolidone, acrylamide homopolymers and copolymers, methacrylamide homopolymers and copolymers, and N-methylolacrylamide homopolymers and copolymers.

The hydrophilic resin is preferably added to the image recording layer in an amount of 5 to 40 wt % and more preferably 10 to 30 wt % of the solids content of the image recording layer. Good developability and film strength are achieved when the amount of addition is within this range.

When the particulate polymer having a heat-reactive functional group as described above is used, the image recording layer in the second aspect of the invention may further contain a low-molecular compound having a functional group capable of reacting with the heat-reactive functional group in the particulate polymer and its protective group. The compound is preferably added to the image recording layer in an amount of 5 wt % to 40 wt % and most preferably 5 wt % to 20 wt %. An amount below this range is less effective in crosslinking and shortens the press life, whereas an amount above this range deteriorates the developability with time. Usable compounds are described below.

Exemplary low molecular weight compounds include those having a polymerizable unsaturated group, a hydroxyl group, a carboxyl group, a carboxylate group, an acid anhydride group, an amino group, an epoxy group, an isocyanate group or a blocked isocyanate group in the molecule. The compounds described in JP 2003-316021 A may be preferably used as the low molecular weight compounds.

(Other Ingredients)

Various other compounds than those mentioned above may optionally be added to the image recording layer in the second aspect of the invention. For example, dyes having a large absorption in the visible light range may be used as image colorants after image formation in order to facilitate the distinction between the image areas and the non-image areas. Specific examples include Oil Yellow #101, Oil Yellow #103, Oil Pink #312, Oil Green BG, Oil Blue BOS, Oil Blue #603, Oil Black BY, Oil Black BS and Oil Black T-505 (Orient Chemical Industries Co., Ltd.); and Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), and the dyes mentioned in JP 62-293247 A. Preferred use may also be made of pigments such as phthalocyanine pigments, azo pigments, and titanium oxide. The amount of addition based on the total solids content of the image recording layer-forming coating liquid is preferably from 0.01 wt % to 10 wt %. In addition, a color forming compound or a color fading compound is preferably added to the image recording layer in the second aspect of the invention in order to increase the sharpness of the exposed image areas and non-image areas. Leuco dyes (e.g., Leucomalachite Green, Leuco Crystal Violet, Crystal Violet in lactone form) and pH discoloration dyes (e.g., dyes such as Ethyl Violet and Victoria Pure Blue BOH) are used together with thermal acid generators such as a diazo compound and a diphenyliodonium salt.

In the second aspect of the invention, a small amount of a thermal polymerization inhibitor is desirably added to prevent unnecessary thermal polymerization of an ethylenically unsaturated compound during the preparation or storage of the image recording layer-forming coating liquid. Suitable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and aluminum N-nitroso-N-phenylhydroxylamine. The thermal polymerization inhibitor is preferably added in an amount of about 0.01 to 5 wt % based on the total weight of the composition.

To prevent oxygen from inhibiting polymerization, a higher fatty acid such as behenic acid or behenamide may be optionally added to the image recording layer and induced to concentrate primarily at the surface of the image recording layer as the layer dries after coating. The higher fatty acid or its derivative is preferably added in an amount of about 0.1 wt % to about 10 wt % of the total solids content of the image recording layer.

A plasticizer may optionally be added to the image recording layer in the second aspect of the invention in order to impart flexibility to the coated film. For example, polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate may be used.

(Formation of Image Recording Layer)

The image recording layer in the second aspect of the invention may be formed in the same procedure as that for the photosensitive layer in the first aspect of the invention. Specific examples of the solvent that may be used to prepare the coating liquid include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water. These solvents may be used alone or as mixtures of two or more thereof. The coating liquid has a solids concentration of preferably 1 to 50 wt %.

A surfactant for enhancing the coating properties such as a fluorosurfactant as described in JP 62-170950 A may be added to the image recording layer-forming coating liquid. The amount of addition is preferably from 0.01 to 1 wt % and more preferably 0.05 to 0.5 wt % of the total solids content of the image recording layer.

The image recording layer coating weight (solids content) on the support obtained after coating and drying varies depending on the intended application, although an amount of 0.4 to 5.0 g/m$^2$ is generally preferred. A coating weight below this range increases the apparent sensitivity but reduces the film properties of the image recording layer having the function of image recording.

(Overcoat Layer)

In the presensitized plate according to the second aspect of the invention, an overcoat layer may be formed on the image recording layer in order to prevent the surface of the image recording layer from being contaminated with lipophilic substances or being scratched. The overcoat layer that may be used in the second aspect of the invention can be easily removed during printing by a hydrophilic printing liquid such as fountain solution and contains a resin selected from hydrophilic organic polymer compounds. The hydrophilic organic polymer compounds as used herein have a film-forming ability after drying of the coated film and specific examples thereof include polyvinyl acetate (with a degree of hydrolysis of 65% or more), a polyacrylamine salt, a polyacrylic acid copolymer and an alkali metal salt or amine salt thereof, polymethacrylic acid and an alkali metal salt or amine salt thereof, a polymethacrylic acid copolymer and an alkali metal salt or amine salt thereof, polyacrylamide and a copolymer thereof, polyhydroxyethyl acrylate, polyvinyl pyrrolidone and a copolymer thereof, polyvinylmethyl ether, a vinylmethyl ether/maleic anhydride copolymer, poly-2-acrylamide-2-methyl-1-propane sulfonic acid and an alkali metal salt or amine salt thereof, a poly-2-acrylamide-2-methyl-1-propane sulfonic acid copolymer and an alkali metal salt or amine salt thereof, gum arabic, fibrin derivatives (for example, carboxymethyl cellulose, carboxyethyl cellulose, methyl cellulose etc.) and modifications thereof, white dextrin, pullulan, and enzyme-decomposed etherified dextrin. These resins may be used in combination of two or more depending on the intended purpose.

The hydrophilic photothermal conversion agent may also be added to the overcoat layer. In the case of applying an aqueous solution, nonionic surfactants such as polyoxyethylene nonylphenyl ether and polyoxyethylene dodecyl ether may be added to the overcoat layer in order to ensure the coating uniformity. The overcoat layer preferably has a dry coating weight of 0.1 to 2.0 g/m$^2$. At a coating weight within this range, the surface of the image recording layer can be prevented from being contaminated with lipophilic substances (e.g., fingerprints) or being scratched without deteriorating the developability.

(Image Formation and Plate Making)

Images are formed by the action of heat on the presensitized plate in the second aspect of the invention. More specifically, the image formation can be performed by direct imagewise recording with a thermal recording head, scanning exposure with an infrared laser, high intensity flash exposure with xenon discharge bulbs, or exposure with an infrared lamp. Exposure with a semiconductor laser or a high-power solid-state infrared laser such as a YAG laser emitting infrared radiation at wavelengths of 700 to 1,200 nm is suitable.

The surface of the presensitized plate in the second aspect of the invention having an image formed thereon is then rubbed with a rubbing member in the presence of a treatment solution to remove the image recording layer in the non-image areas (the overcoat layer is also simultaneously removed in cases where the overcoat layer is formed). The surface of the hydrophilic support is exposed in the non-image areas, whereby a lithographic printing plate is prepared.

Examples of the rubbing member that may be used in the second aspect of the invention include unwoven cloth, cotton cloth, cotton pad, moulton, rubber blade and brush.

The treatment solution suitable to be used in the second aspect of the invention is a hydrophilic treatment solution and, for example, water or an aqueous solution containing water as its main ingredient is preferred, and in general an aqueous solution having the same composition as that of a known fountain solution and an aqueous solution containing a surfactant (of anionic, nonionic, cationic or other nature) are particularly preferred. The treatment solution of the invention may contain an organic solvent. Examples of the solvent that may be contained include aliphatic hydrocarbons (e.g., hexane, heptane, Isopar-E, H, G (Esso Chemical Ltd.), gasoline and kerosene), aromatic hydrocarbons (e.g., toluene and xylene), halogenated hydrocarbons (e.g., trichloroethylene) and polar solvents as described below.

Examples of the polar solvents include alcohols (e.g., methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol and tetraethylene glycol), ketones (e.g., acetone and methyl ethyl ketone), esters (e.g., ethyl acetate, methyl lactate, butyl lactate, propylene glycol monomethyl ether acetate, diethylene glycol acetate and diethyl phthalate), and other solvents (e.g., triethyl phosphate and tricresyl phosphate).

When the organic solvent used is not soluble in water, it may be used after being solubilized in water with a surfactant. The solvent to be contained in the treatment solution desirably has a concentration of less than 40 wt % in terms of safety and flammability. In the second aspect of the invention, one of an anionic surfactant and a nonionic surfactant may be advantageously used as the surfactant for use in the treatment solution in order to suppress foaming.

Examples of the anionic surfactant that may be used in the treatment solution according to the second aspect of the invention include alkyl diphenyl ether disulphonates, aliphates, abietates, hydroxy alkane sulfonates, alkane sulfonates, dialkylsulfosuccinates, straight-chain alkylbenzene sulfonates, branched alkylbenzene sulfonates, alkyl naphthalene sulfonates, alkylphenoxypolyoxyethylenepropylsulfonates, salts of polyoxyethylene alkylsulfophenyl ethers, sodium N-methyl-N-oleyl taurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylene alkyl ethers, salts of sulfuric esters of aliphatic monoglycerides, salts of sulfuric esters of polyoxyethylene alkyl phenyl ethers, salts of sulfuric esters of polyoxyethylene styrylphenyl ethers, salts of alkylphosphoric esters, salts of phosphoric esters of polyoxyethylene alkyl ethers, salts of phosphoric esters of polyoxyethylene alkylphenyl ethers, partially saponified compounds of styrene-maleic anhydride copolymers, partially saponified compounds of olefin-maleic anhydride copolymers, and naphthalenesulfonateformalin condensates. Of these anionic surfactants, alkyl diphenyl ether sulphonates, dialkylsulfosuccinates, salts of alkylsulfuric esters and alkyl naphthalene sulfonates are particularly preferred.

Specific examples of suitable anionic surfactants include sodium dodecylphenoxybenzene disulfonate, sodium salt of alkylated naphthalene sulfonate, disodium methylene-dinaphtalene-disulfonate, sodium dodecylbenzenesulfonate, sodium dodecyl diphenyl ether disulfonate, ammonium or potassium perfluoroalkyl sulfonate and sodium dioctylsulfosuccinate.

Examples of the nonionic surfactant that may be used in the treatment solution according to the second aspect of the invention include polyethylene glycol type higher alcohol ethylene oxide adducts, alkylphenol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of fats and oils, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. These nonionic surfactants may be used alone or in combination of two or more. In the second aspect of the invention, sorbitol and/or sorbitan fatty acid ester ethylene oxide adducts, polypropylene glycol ethylene oxide adducts, dimethylsiloxane-ethylene oxide block copolymers, dimethylsiloxane-(propylene oxide-ethylene oxide) block copolymers, and fatty acid esters of polyhydric alcohols are more preferred.

In terms of the stable solubility or turbidity with respect to water, the nonionic surfactant for use in the treatment solution according to the second aspect of the invention preferably has an HLB (hydrophile-lipophile balance) of 6 or more and more preferably 8 or more. The nonionic surfactant is preferably contained in the treatment solution in a ratio of 0.01 to 10 wt % and more preferably 0.01 to 5 wt %.

Use can be made of treatment solutions containing alkaline agents (e.g., sodium carbonate, triethanolamine, diethanolamine, sodium hydroxide, silicates) or acidic agents (e.g., citric acid, phosphoric acid, phosphorous acid, metaphosphoric acid, pyrophosphoric acid, oxalic acid, malic acid, tartaric acid, boric acid, amino acids), preservatives (e.g., benzoic acid and a derivative thereof, sodium dehydroacetate, a 3-isothiazolone compound, 2-bromo-2-nitro-1,3-propanediol, sodium 2-pyridinethiol-1-oxide), and other additives (e.g., citrates). The treatment solution can be used at any temperature but the temperature is preferably from 10° C. to 50° C.

Figure 7:
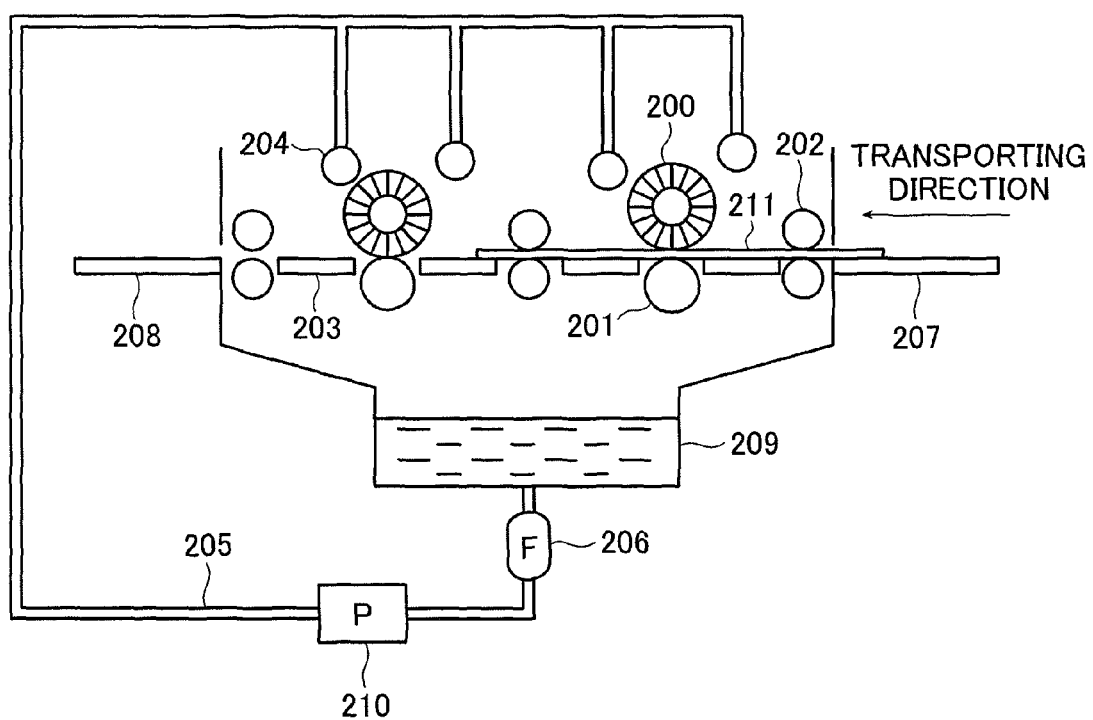
FIG. 7 is a layout drawing illustrating the configuration of an automatic processor suitable to a development process in the methods of manufacturing the lithographic printing plates of the invention.

In the second aspect of the invention, the image recording layer in the non-image areas can be suitably removed by an automatic processor equipped with a treatment solution supply means and a rubbing member. Examples of the automatic processor include those described in JP 2-220061 A and JP 60-59351 A in which a presensitized plate after image recording is subjected to a rubbing treatment while being transported, and those described in U.S. Pat. No. 5,148,746, U.S. Pat. No. 5,568,768 and GB 2,297,719 in which a presensitized plate after image recording is placed on a cylinder and subjected to a rubbing treatment while rotating the cylinder. Of these, an automatic processor using a rotating brush roll as the rubbing member is particularly preferred. An example of the automatic processor suitable to the development process in the second aspect of the invention was shown in FIG. 7. In the automatic processor shown in FIG. 7, a treatment solution 209 is fed to spray pipes 204 by a circulation pump 210 and showered onto rotating brush rolls 200 and a plate surface 211 (presensitized plate) to rub the plate surface 211 with the rotating brush rolls 200. FIG. 7 shows backing rolls 201, transport rolls 202, a transport guide plate 203, a pipe line 205, a filter 206, a plate feed table 207, a plate discharge table 208 and a treatment solution (tank) 209.

In the second aspect of the invention, the rubbed lithographic printing plate can be optionally rinsed with water and dried in the subsequent process.

The rotating brush roll that may be used can be appropriately selected by taking account of, for example, the scratch resistance of the image areas and the stiffness of the support of the presensitized plate. A known rotating brush roll formed by implanting a brush material in a plastic or metal roll may be used as the rotating brush roll. For example, a brush roll described in JP 58-159533 A and JP 3-100554 A, or a brush roll described in JP 62-167253 U in which a metal or plastic groove-shaped member having implanted in rows therein a brush material is closely and radially wrapped around a plastic or metal roll acting as a core, may be used. As the brush material, plastic fibers (for example, synthetic fibers made of polyester materials such as polyethylene terephthalate and polybutylene terephthalate, polyamide materials such as nylon 6,6 and nylon 6,10, polyacrylic materials such as polyacrylonitrile and polyalkyl(meth)acrylate; and polyolefin-materials such as polypropylene and polystyrene) may be used. For example, a brush material having a fiber bristle diameter of 20 to 400 µm and a bristle length of 5 to 30 mm may be advantageously used. The external diameter of the rotating brush roll is preferably from 30 to 200 mm, and the rotation speed at the tip of the brush which rubs the surface of the plate is preferably from 0.1 to 5 m/s.

The direction of rotation of the rotating brush roll for use in the second aspect of the invention may be the same direction or the opposite direction with respect to the transport direction of the presensitized plate in the second aspect of the invention, but when two or more rotating brush rolls are used in an automatic processor as illustrated in FIG. 7, it is preferable that at least one rotating brush roll rotate in the same direction and at least one rotating brush roll rotate in the opposite direction. By such an arrangement, the image recording layer in the non-image areas can be more reliably removed. Furthermore, rocking the rotating brush roll in the rotational axis direction of the brush roll is also effective.

Next, the third aspect of the invention is described.

The presensitized plate in the third aspect of the invention includes an image recording layer containing (G) a sensitizing dye, (H) a polymerization initiator, (I) a polymerizable compound, and (J) a polymer and formed on a support, unexposed portions of the image recording layer removed with printing ink and/or fountain solution and is characterized in that the support is prepared from an aluminum alloy plate in which a surface density of intermetallic compounds with a circle equivalent diameter of 0.2 µm or more is 35,000 pcs/mm$^2$ or more.

As described above, the image recording layer which can be removed by printing ink and/or fountain solution is provided in the so-called on-press development type presensitized plate and therefore contains large amounts of hydrophilic ingredients. When large amounts of hydrophilic ingredients are present in the image recording layer, the presence of moisture included in the image recording layer under the influence of ambient air or the like and anions may cause corrosive micro-stains on the aluminum alloy plate, as also described in the second aspect of the invention.

In contrast, in the aluminum alloy plate including intermetallic compound particles with a circle equivalent diameter of 0.2 µm or more at a surface density of 35,000 pcs/mm$^2$ or more, the number of intermetallic compound particles with a circle equivalent diameter of more than 1 µm which are present at the surface of the aluminum alloy plate is extremely small and therefore the corrosive micro-stains of the aluminum alloy plate can be suppressed.

Intermetallic compound particles with a circle equivalent diameter of 0.2 µm or more are preferably present at the surface of the aluminum alloy plate at a density of 50,000 pcs/mm$^2$ or more in terms of suppressing the corrosive micro-stains.

The uniformity of the electrolytically grained surface is improved by using the aluminum alloy plate containing intermetallic compound particles with a circle equivalent diameter of 0.2 µm or more at a surface density of 35,000 pcs/mm$^2$ or more as described in the first aspect of the invention.

As in the second aspect of the invention, the number of intermetallic compound particles with a circle equivalent diameter of 1.0 µm or more at the surface of the aluminum alloy plate is preferably up to 2,500 pcs/mm$^2$ and more preferably up to 1,500 pcs/mm$^2$ in terms of suppressing the corrosive micro-stains.

The number and density of the intermetallic compound particles at the surface of the aluminum alloy plate can be measured by the methods described in the first aspect of the invention.

As in the first aspect of the invention, the aluminum alloy plate that may be used in the third aspect of the invention contains at least 99 wt % of aluminum and also contains as trace elements at least one element selected from the group consisting of Si, Fe, Ni, Mn, Cu, Mg, Cr, Zn, Bi, Ti and V. In a preferred embodiment, the aluminum alloy plate preferably contains Al, Si and Fe as its essential ingredients.

As in the first aspect of the invention, in the preferred embodiment of the aluminum alloy plate containing Al, Si and Fe as its essential ingredients, specific examples of the intermetallic compounds present in the aluminum alloy plate include Al—Fe intermetallic compounds such as Al$_3$Fe and Al$_6$Fe and AlFeSi intermetallic compounds such as α-AlFeSi and β-AlFeSi.

In the aluminum alloy plate that may be used in the third aspect of the invention, the Al—Fe intermetallic compounds of the aluminum alloy plate preferably have peak count values as measured with an XRD of up to 400 cps and more preferably up to 200 cps for the same reason as described in the second aspect of the invention. In particular, both of Al$_3$Fe and Al$_6$Fe preferably have peak count values of up to 400 cps and more preferably up to 200 cps.

The Al—Fe—Si intermetallic compounds (in particular α-AlFeSi) of the aluminum alloy plate preferably have peak count values of 30 cps or more and more preferably 50 cps or more.

<Aluminum Alloy Plate (Rolled Aluminum)>

The preferred embodiment of the aluminum alloy plate that may be used in the third aspect of the invention and its manufacturing procedure (continuous casting and rolling process) are the same as those in the first aspect of the invention and therefore their description is omitted.

<Surface Roughening Treatment>

The support that may be used in the presensitized plate according to the third aspect of the invention can be manufactured by subjecting the surface of the aluminum alloy plate obtained by the continuous casting step and various steps carried out as desired (e.g., intermediate annealing step, cold rolling step) to surface roughening treatment.

The surface roughening treatment and various other treatments following the surface roughening treatment (e.g., anodizing treatment) are the same as those in the first aspect of the invention and therefore their description is omitted.

In the third aspect of the invention, a phosphoric acid solution is also preferably used as the electrolytic solution for anodizing treatment for the same reason as described in the second aspect of the invention. The conditions of anodizing treatment performed using a phosphoric acid solution as the electrolytic solution are the same as those in the second aspect of the invention and therefore their description is omitted.

[Image Recording Layer]

In the third aspect of the invention, the image recording layer is formed on the support prepared according to the above-described procedure. As described above, the image recording layer of the presensitized plate according to the third aspect of the invention contains (G) a sensitizing dye, (H) a polymerization initiator, (I) a polymerizable compound and (J) a polymer.

(G) Sensitizing Dye

The sensitizing dyes (G) are the same as the sensitizing dyes (A) in the first aspect of the invention and their description is omitted.

Of the sensitizing dyes (A) in the first aspect of the invention, those described as the infrared absorbers are preferably used as the sensitizing dyes (G). The infrared absorbing dyes that may be used are the compounds described in paragraphs [0058] to [0087] of JP 2008-195018 A.

The image recording layer in the third aspect of the invention preferably contains the sensitizing dye (G) in an amount of 0.1 to 10.0 wt % and more preferably 0.5 to 5.0 wt % based on the total solids content of the image recording layer.

(H) Polymerization Initiator

The polymerization initiator for use in the third aspect of the invention is a compound which initiates and promotes the polymerization of a polymerizable compound. The polymerization initiator that may be used in the third aspect of the invention is preferably a radical polymerization initiator and, for example, a known thermal polymerization initiator, a compound having a bond with small bond dissociation energy and a photopolymerization initiator can be used.

Examples of the radical polymerization initiator in the third aspect of the invention include (a) organic halides, (b) carbonyl compounds, (c) azo compounds, (d) organic peroxides, (e) metallocene compounds, (f) azide compounds, (g) hexaarylbiimidazole compounds, (h) organic borate compounds, (i) disulfone compounds, (j) oxime ester compounds and (k) onium salt compounds.

As the organic halides (a), compounds described in paragraphs [0022] to [0023] of JP 2008-195018 A are preferred.

As the carbonyl compounds (b), compounds described in paragraph [0024] of JP 2008-195018 A are preferred.

As the azo compounds (c), for example, azo compounds described in JP 8-108621 A can be used.

As the organic peroxides (d), for example, compounds described in paragraph [0025] of JP 2008-195018 A are preferred.

As the metallocene compounds (e), for example, compounds described in paragraph [0026] of JP 2008-195018 A are preferred.

Examples of the azido compounds (f) include compounds such as 2,6-bis(4-azidobenzylidene)-4-methylcyclohexanone.

As the hexaarylbiimidazole compounds (g), for example, compounds described in paragraph [0027] of JP 2008-195018 A are preferred.

As the organic borate compounds (h), for example, compounds described in paragraph [0028] of JP 2008-195018 A are preferred.

Examples of the disulfone compounds (i) include compounds described in, for example, JP 61-166544 A and JP 2003-328465 A.

As the oxime ester compounds (j), for example, compounds described in paragraphs [0028] to [0030] of JP 2008-195018 A are preferred.

Examples of the onium salt compounds (k) include onium salts, such as diazonium salts described in S. I. Schlesinger, Photogr. Sci. Eng., 18, 387 (1974) and T. S. Bal et al., Polymer, 21, 423 (1980); ammonium salts described in U.S. Pat. No. 4,069,055 and JP 4-365049 A; phosphonium salts described in U.S. Pat. No. 4,069,055 and U.S. Pat. No. 4,069,056; iodonium salts described in EP 104,143, U.S. Pat. No. 339,049, U.S. Pat. No. 410,201, US 2008/0311520, JP 2-150848 A, JP 2-296514 A and JP 2008-195018 A; sulfonium salts described in EP 370,693, EP 390, 214, EP 233,567, EP 297,443, EP 297,442, U.S. Pat. No. 4,933,377, U.S. Pat. No. 161,811, U.S. Pat. No. 410,201, U.S. Pat. No. 399,049, U.S. Pat. No. 4,760,013, U.S. Pat. No. 4,734,444, U.S. Pat. No. 2,833,827, DE 2,904,626, DE 3,604,580 and DE 3,604,581; selenonium salts described in J. V. Crivello et al., Macromolecules, 10 (6), 1307 (1977) and J. V. Crivello et al., J. Polymer Sci., Polymer Chem. Ed., 17, 1047 (1979); arsonium salts described in C. S. Wen et al., Teh, Proc. Conf. Rad. Curing ASIA, p. 478, Tokyo, October (1988); and azinium salts described in JP 2008-195018 A.

Of these, onium salts and particularly, iodonium salts, sulfonium salts and azinium salts are more preferable. Specific examples of these compounds are set forth below, but the invention should not be construed as being limited thereto.

Of the iodonium salts, diphenyliodonium salts are preferred, diphenyliodonium salts substituted with an electron donating group, for example, an alkyl group or an alkoxy group are more preferred, and asymmetric diphenyliodonium salts are even more preferred. Specific examples thereof include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4 octyloxyphenyl-2,4,6-trimethoxyphenyliodonium hexafluorophosphate and bis(4-tert-butylphenyl)iodonium tetraphenylborate.

Examples of the sulfonium salts include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate and tris(4-chlorophenyl)sulfonium 3,5-bis(methoxycarbonyl)benzenesulfonate.

Examples of the azinium salts include 1-cyclohexylmethyloxypyridinium hexafluorophosphate, 1-cyclohexyloxy-4-phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopyridinium hexafluorophosphate, 3,4-dichloro-1-(2-ethylhexyloxy)pyridinium hexafluorophosphate, 1-benzyloxy-4-phenylpyridinium hexafluorophosphate, 1-phenethyloxy-4-phenylpyridinium hexafluorophosphate, 1-(2-ethylhexyloxy)-4-phenylpyridinium p-toluenesulfonate, 1-(2-ethylhexyloxy)-4-phenylpyridinium perfluorobutanesulfonate, 1-(2-ethylhexyloxy)-4-phenylpyridinium bromide and 1-(2-ethylhexyloxy)-4-phenylpyridinium tetrafluoroborate.

The polymerization initiator can be preferably added to the image recording layer in an amount of 0.1 to 50 wt %, more preferably 0.5 to 30 wt %, and most preferably 0.8 to 20 wt % based on the total solids content constituting the image recording layer. An excellent sensitivity and high resistance to scumming in non-image areas during printing are achieved at a polymerization initiator content within the above-defined range.

(I) Polymerizable Compound

Polymerizable compounds that may be used in the third aspect of the invention are addition polymerizable compounds having at least one ethylenically unsaturated double bond, and are selected from compounds having at least one, and preferably two or more, terminal ethylenically unsaturated bonds. Such compounds are widely known in the field of art and they can be used in the third aspect of the invention without any particular limitation. Such compounds have a variety of chemical forms, including monomers, prepolymers such as dimers, trimers and oligomers, mixtures of any of the above, and copolymers of any of the above.

Use may also be made of compounds described in paragraphs [0089] to [0098] of JP 2008-105018 A. Of these, esters of aliphatic polyhydric alcohol compounds with unsaturated carboxylic acids (e.g., acrylic acid, methacrylic acid, itaconic acid, crotonic acid, isocrotonic acid and maleic acid) are preferred. Other preferable radical polymerizable compounds include polymerizable compounds containing an isocyanuric acid structure described in JP 2005-329708 A.

Of these, isocyanuric acid ethylene oxide-modified acrylates, such as tris(acryloyloxyethyl) isocyanurate and bis(acryloyloxyethyl)hydroxyethyl isocyanurate are particularly preferred because they are excellent in balance between hydrophilicity relating to the on-press developability and polymerization ability relating to the press life.

In the third aspect of the invention, the polymerizable compound is preferably used in an amount of 5 to 80 wt %, and more preferably 25 to 75 wt % based on the total solids content of the image recording layer.

(J) Polymer

The image recording layer according to the third aspect of the invention contains a polymer so as to have the on-press developability. In particular, a polymer having a polyalkylene oxide chain (EO chain) is preferred. The polymer having a polyalkylene oxide chain, particularly a polymer having a polyalkylene oxide chain in its side chain may be incorporated into the image recording layer in the form of fine particles or as a medium for compatibilizing or binding various materials of the image recording layer without having a specific shape such as a particle shape. In any case, introduction of a polyalkylene oxide chain in the side chain of such a polymer improves the permeability of fountain solution while enhancing the on-press developability. In particular, it is preferred that the alkylene oxide chain be an ethylene oxide chain and that the number of repeating units of ethylene oxide chain be from 9 to 250 and particularly from 9 to 50.

(J-1) Particulate Polymer

According to the third aspect of the invention, a particulate polymer, that is, polymer fine particles can be used in order to improve the on-press developability. The polymer fine particle for use in the third aspect of the invention is preferably at least one type of polymer particle selected from a hydrophobic thermoplastic polymer fine particle, a thermo-reactive polymer fine particle, a microcapsule having a hydrophobic compound encapsulated therein and a crosslinked polymer fine particle (microgel).

In the third aspect of the invention, the polymer fine particle preferably has the polyalkylene oxide chain. The polyalkylene oxide chain interacts with the polyalkylene oxide group of a specific copolymer in the fountain solution to improve the on-press developability. In particular, it is preferred that the alkylene oxide chain be an ethylene oxide chain and that the number of repeating units of ethylene oxide chain be from 9 to 250 and particularly from 9 to 50.

In the case of the hydrophobic thermoplastic polymer fine particle or the thermo-reactive polymer fine particle, the polyalkylene oxide chain is introduced in the polymer fine particle, for example, by a method in which a vinyl monomer or an acrylic monomer having the polyalkylene oxide chain is subjected to emulsion polymerization or suspension polymerization. In such a case, specific examples of the polymer making up the polymer fine particles include homopolymers or copolymers of copolymerizable monomers such as ethylene, styrene, vinyl chloride, methyl acrylate, ethyl acrylate, methyl methacrylate, ethyl methacrylate, vinylidene chloride, acrylonitrile, vinyl carbazole, and acrylate or methacrylate having the polyalkylene oxide chain or mixtures thereof. Of these, polystyrene, copolymers containing styrene and acrylonitrile and polymethyl methacrylate are more preferred.

The hydrophobic thermoplastic polymer fine particle means a fine particle which is fused by heat generated upon exposure to infrared laser radiation to be hydrophobized, as described, for example, in Research Disclosure, No. 33303, January (1992), JP 9-123387 A, JP 9-131850 A, JP 9-171249 A, JP 9-171250 A and EP 931,647.

The thermo-reactive polymer fine particle means a polymer fine particle forming a hydrophobized region by crosslinkage due to thermal reaction and change in the functional group upon the crosslinkage and includes a polymer fine particle having a thermo-reactive group.

The thermo-reactive group in the polymer fine particle having the thermo-reactive group for use in the third aspect of the invention may be a functional group performing any reaction as long as a chemical bond is formed. Preferred examples thereof include an ethylenically unsaturated group (e.g., an acryloyl group, a methacryloyl group, a vinyl group or an allyl group) performing a radical polymerization reaction, a cationic polymerizable group (e.g., a vinyl group or a vinyloxy group), an isocyanate group performing an addition reaction or a blocked form thereof, an epoxy group, a vinyloxy group and a functional group having an active hydrogen atom (e.g., an amino group, a hydroxy group or a carboxy group) as the reaction partner thereof, a carboxy group performing a condensation reaction and a hydroxy group or an amino group as the reaction partner thereof, and an acid anhydride performing a ring opening addition reaction and an amino group or a hydroxy group as the reaction partner thereof.

In the case of the microcapsule or microgel, the polyalkylene oxide chain is introduced into the polymer fine particle according to a known method, such as a method involving adding polyalkylene oxide monoalkyl ether to the ingredients of interfacial polymerization using a polyfunctional isocyanate, by applying the description of the polymer fine particle below.

An example of the microcapsule for use in the third aspect of the invention includes one in which all or part of the constituents of the image recording layer are encapsulated therein, as described in, for example, JP 2001-277740 A and JP 2001-277742 A. The constituents making up the image recording layer may also be contained outside the microcapsules. In a preferred embodiment, the microcapsule type image recording layer contains hydrophobic constituents in the microcapsules and hydrophilic constituents outside the microcapsules.

In the third aspect of the invention, the image recording layer may contain crosslinked resin particles, that is, a microgel. The microgel can contain part of the constituents of the image recording layer inside and/or on the surface thereof. In particular, an embodiment of a reactive microgel containing the polymerizable compound (J) on the surface thereof is particularly preferred in terms of the image-forming sensitivity and press life.

Known methods may be used in the microencapsulation or microgelation of the constituents of the image recording layer.

The average particle size of the polymer fine particles is preferably from 0.01 to 3.0 µm, more preferably from 0.05 to 2.0 µm, and most preferably from 0.10 to 1.0 µm. Within this range, good resolution and good temporal stability are achieved.

The content of the polymer fine particles is preferably in a range of 5 to 90 wt % based on the total solids content of the image recording layer.

(J-2) Binder Polymer

In the image recording layer according to the third aspect of the invention, a binder polymer can be used as a binder for each ingredient of the image recording layer and for the purpose of improving the film strength of the image recording layer. Conventionally known binder polymers may be used without any particular limitation in the third aspect of the invention and polymers having film forming properties are preferred. Of these, acrylic resins, polyvinyl acetal resins and polyurethane resins are preferred.

It is particularly preferred that the binder polymer have an alkylene oxide chain as the hydrophilic group in terms of improving the on-press developability. In particular, it is preferred that the alkylene oxide chain be an ethylene oxide chain and that the number of repeating units of ethylene oxide chain be from 9 to 250 and particularly from 9 to 50. An acrylic resin obtained by copolymerizing an acrylic monomer having a polyalkylene oxide chain is particularly preferred.

It is considered that the alkylene oxide chain of the binder polymer interacts with the alkylene oxide group of a specific polymer in the fountain solution for use in the third aspect of the invention to improve the on-press developability.

In order to control the ink-receptive property, a lipophilic group such as an alkyl group, an aryl group, an aralkyl group or an alkenyl group may be introduced into the binder polymer according to the third aspect of the invention. Specifically, a lipophilic group-containing monomer such as an alkyl methacrylate may be copolymerized.

Examples of the binder polymer suitable in the third aspect of the invention include polymers having a crosslinkable functional group for increasing the film strength of the image areas in its main chain or side chain, preferably in its side chain, as described in JP 2008-195018 A. A crosslinkable group causes a crosslink to be formed between polymer molecules, thus promoting curing.

Preferable examples of the crosslinkable functional group include ethylenically unsaturated groups such as (meth)acryl group, vinyl group and allyl group, and epoxy group. The crosslinkable functional groups can be introduced into the polymer by a polymer reaction or copolymerization. For example, a reaction between an acrylic polymer or polyurethane having a carboxy group in its side chain and glycidyl methacrylate or a reaction between a polymer having an epoxy group and a carboxylic acid containing an ethylenically unsaturated group such as methacrylic acid can be utilized.

The content of the crosslinkable groups in the binder polymer is preferably from 0.1 to 10.0 mmol, more preferably from 1.0 to 7.0 mmol, and most preferably from 2.0 to 5.5 mmol per g of the binder polymer.

Moreover, the binder polymer may further contain a hydrophilic group other than the polyalkylene oxide chain. Other examples of the hydrophilic group include hydroxy group, carboxy group, amino group, ammonium group, amido group, sulfo group and phosphate group. The hydrophilic group contributes to imparting the on-press developability to the image recording layer. In particular, coexistence of the crosslinkable group and the hydrophilic group enables good balance to be achieved between the press life and the developability.

In order to introduce the hydrophilic group into the binder polymer, a monomer having the hydrophilic group may be copolymerized.

Specific examples (1) to (11) of the binder polymer for use in the third aspect of the invention are set forth below, but the invention should not be construed as being limited thereto.

[Chemical Formula 9]

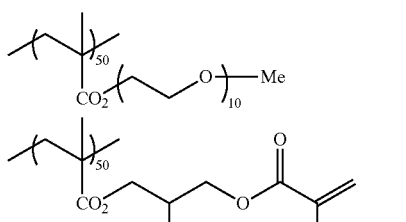

(1)

(2)

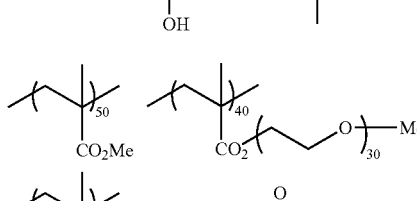

(3)

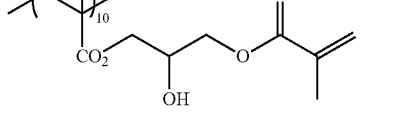

(4)

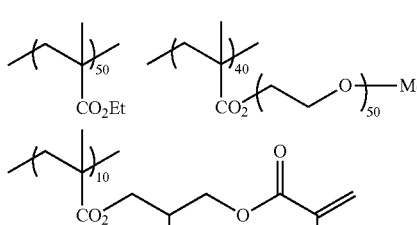

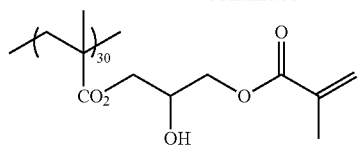

(5)

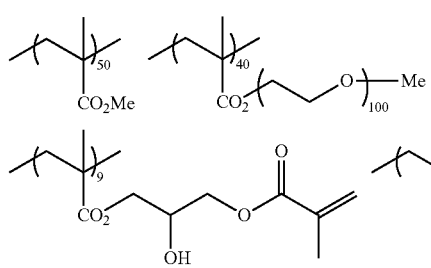

(6)

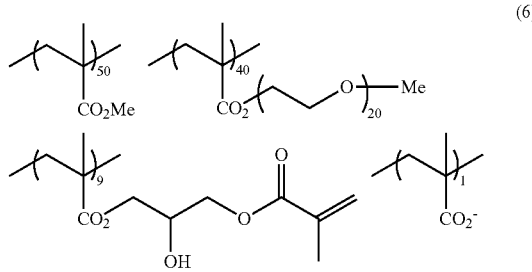

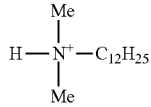

[Chemical Formula 10]

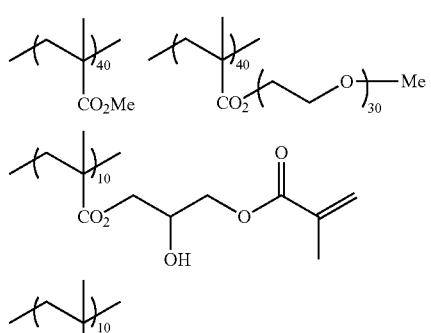

(7)

(8)

(9)

The weight-average molar weight (Mw) of the binder polymer according to the third aspect of the invention is preferably 2,000 or more, more preferably 5,000 or more, and even more preferably from 10,000 to 300,000.

According to the third aspect of the invention, hydrophilic polymers such as polyacrylic acid and polyvinyl alcohol described in JP 2008-195018 A may be used as desired. A lipophilic binder polymer may also be used together with a hydrophilic binder polymer.

The content of the binder polymer is generally from 5 to 90 wt %, preferably from 5 to 80 wt % and more preferably from 10 to 70 wt % based on the total solids content of the image recording layer.

(Other Ingredients)

The image recording layer according to the third aspect of the invention may further contain other ingredients as desired. Other ingredients including a hydrophobized precursor, a low-molecular-weight hydrophilic compound, a sensitizer, a surfactant, a coloring agent, a print-out agent, a polymerization inhibitor, a higher fatty acid derivative, a plasticizer, inorganic fine particles, an inorganic layered compound, a co-sensitizer and a chain transfer agent may be added to the image recording layer. Specifically, compounds and amounts of addition thereof as described in paragraphs [0114] to [0159] of JP 2008-284817 A, paragraphs [0023] to [0027] of JP 2006-091479 A and paragraph [0060] of US 2008/0311520 A are preferable.

(Formation of Image Recording Layer)

The image recording layer according to the third aspect of the invention is formed by dispersing or dissolving each of the necessary ingredients in a known solvent to prepare a coating liquid and applying the liquid onto a support by a known method such as bar coating and drying the applied liquid as described in, for example, paragraphs [0142] to [0143] of JP 2008-195018 A. The image recording layer coating weight (solids content) on the support obtained after application and drying varies depending on the intended purpose, although an amount of 0.3 to 3.0 g/m$^2$ is generally preferred. At an image recording layer coating weight within this range, a good sensitivity and good image recording layer film properties are obtained.

(Undercoat Layer)

In the presensitized plate according to the third aspect of the invention, an undercoat layer (also referred to as "intermediate layer") is preferably provided between the image recording layer and the support. The undercoat layer enhances adhesion between the support and the image recording layer in the exposed area and facilitates delamination of the image recording layer from the support in the unexposed area and therefore contributes to improving the developability without reducing the press life. In the case of exposure to infrared laser radiation, the undercoat layer serves as the heat insulating layer to prevent the sensitivity from being reduced due to diffusion of heat generated upon exposure into the support.

Specific examples of the compound for use in the undercoat layer include a silane coupling agent having an addition-polymerizable ethylenic double bond reactive group as described in JP 10-282679 A and a phosphorus compound having an ethylenic double bond reactive group as described in JP 2-304441 A. A polymer resin having an adsorbing group capable of adsorbing to the surface of the support, a hydrophilic group and a crosslinkable group as described in JP 2005-125749 A and JP 2006-188038 A is more preferred. The polymer resin is preferably a copolymer of a monomer having an adsorbing group, a monomer having a hydrophilic group and a monomer having a crosslinkable group. More specifically, a polymer resin which is a copolymer of a monomer having an adsorbing group such as a phenolic hydroxy group, a carboxy group, —PO$_3$H$_2$, —OPO$_3$H$_2$, —CONHSO$_2$—, —SO$_2$NHSO$_2$— or —COCH$_2$COCH$_3$, a monomer having a hydrophilic sulfo group and a monomer having a polymerizable crosslinkable group such as a methacryl group or an allyl group is used. The polymer resin may contain a crosslinkable group introduced by a salt formation between a polar substituent of the polymer resin and a compound containing a substituent having a counter charge to the polar substituent of the polymer resin and an ethylenically unsaturated bond and may be further copolymerized with a monomer other than those described above, preferably a hydrophilic monomer.

The content of the unsaturated double bonds in the polymer resin for undercoat layer is preferably from 0.1 to 10.0 mmol and most preferably from 2.0 to 5.5 mmol per g of the polymer resin.

The weight average molar weight of the polymer resin for undercoat layer is preferably 5,000 or more and more preferably from 10,000 to 300,000.

In addition to the compounds for the undercoat layer described above, the undercoat layer according to the third aspect of the invention may contain a chelating agent, a secondary or tertiary amine, a polymerization inhibitor or a compound containing an amino group or a functional group having polymerization inhibition ability and a group capable of interacting with the surface of aluminum support (for example, 1,4-diazobicyclo[2,2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in order to prevent staining from occurring with time.

The undercoat layer is formed by a known coating method. The coating weight (solids content) of the undercoat layer is preferably from 0.1 to 100 mg/m$^2$ and more preferably from 1 to 30 mg/m$^2$.

(Oxygen Shield Layer)

An oxygen shield layer may be provided on the image recording layer in the presensitized plate according to the third aspect of the invention. In addition to the function of blocking oxygen to suppress a reaction which may inhibit image formation, the oxygen shield layer also serves as a protective layer in terms of preventing scratching of the image recording layer and ablation during exposure to high-intensity laser radiation.

The oxygen shield layer (protective layer) having such properties is described in, for example, U.S. Pat. No. 3,458, 311 and JP 55-49729 B. The polymer having low oxygen permeability for use in the oxygen shield layer can be appropriately selected from a water-soluble polymer and a water-insoluble polymer and be used. Specific examples thereof include polyvinyl alcohol, a modified polyvinyl alcohol, polyvinyl pyrrolidone, a water-soluble cellulose derivative and poly(meth)acrylonitrile.

In addition, the oxygen shield layer preferably contains an inorganic layered compound such as natural mica or synthetic mica as described in JP 2005-119273 A in order to enhance the oxygen blocking properties.

Further, the oxygen shield layer may contain known additives such as a plasticizer for imparting flexibility, a surfactant for improving the coatability and inorganic fine particles for controlling the surface lubricity. The sensitizer described in connection with the image recording layer may also be incorporated into the oxygen shield layer.

The oxygen shield layer is formed by a known coating method. The coating weight after drying of the oxygen shield layer is preferably from 0.01 to 10 g/m$^2$, more preferably from 0.02 to 3 g/m$^2$, and most preferably from 0.02 to 1 g/m$^2$.

[Plate-Making Method]

The lithographic printing plate is preferably formed from the presensitized plate in the third aspect of the invention by an on-press development method. The on-press development method includes a step in which the presensitized plate is imagewise exposed and a printing step in which oily ink and an aqueous ingredient are supplied to the exposed presensitized plate without any development process to perform printing, and it is characterized in that the unexposed areas of the presensitized plate are removed in the course of the printing step. The imagewise exposure may be performed on a printing press after the presensitized plate is mounted on the printing press or may be separately performed using a platesetter or the like. In the latter case, the exposed presensitized plate is directly mounted on the printing press without passing through the development step. Then, the printing press is used to start printing with supplied oily ink and aqueous ingredient to thereby perform on-press development at an early stage of the printing. Specifically, the image recording layer in the unexposed areas is removed and the hydrophilic support surface is exposed to form non-image areas. As the oily ink and aqueous ingredient, common printing ink and fountain solution for use in lithographic printing are employed, respectively.

The on-press development method is described in more detail below.

The light source used for the image exposure in the third aspect of the invention is preferably a laser. The laser for use in the invention is not particularly limited and preferably includes, for example, a solid-state laser and a semiconductor laser emitting an infrared ray having a wavelength of 760 to 1,200 nm.

The infrared laser preferably has a power of 100 mW or more, an exposure time of up to 20 microseconds per pixel and an amount of irradiation energy of 10 to 300 mJ/cm$^2$. A multi-beam laser device is preferably used in the laser in order to shorten the exposure time.

The exposed presensitized plate is mounted on the plate cylinder of a printing press. In the case of a printing press equipped with a laser exposure apparatus, the presensitized plate is imagewise exposed after being mounted on the plate cylinder of the printing press.

When fountain solution and printing ink are supplied to the imagewise exposed presensitized plate to perform printing, the image recording layer in the exposed areas is cured by exposure to light to form printing ink receptive areas having the lipophilic surface. On the other hand, in the unexposed areas, the uncured image recording layer is removed by dissolution or dispersion in the fountain solution and/or printing ink supplied, whereby the hydrophilic surface is exposed in these areas. As a result, the fountain solution adheres to the exposed hydrophilic surface and the printing ink adheres to the exposed areas of the image recording layer, whereby printing is started.

While either the fountain solution or the printing ink may be first supplied onto the plate surface, it is preferred to first supply the printing ink in terms of preventing the fountain solution from being contaminated with the removed ingredients of the image recording layer.

Thus, the presensitized plate according to the third aspect of the invention is subjected to the on-press development on an offset printing press and used to print a large number of impressions.

Next, the fourth aspect of the invention is described.

The presensitized plate in the fourth aspect of the invention includes an image recording layer containing (K) an infrared absorber and (L) an alkali-soluble resin and formed on a support, exposed portions of the image recording layer having an increased alkali solubility after exposure to infrared radiation, and the support is formed from an aluminum alloy plate containing intermetallic compound particles with a circle equivalent diameter of 0.2 μm or more at a surface density of more than 35,000 pcs/mm$^2$.

As described above, the inventors of the invention have found that relatively large intermetallic compound particles serve as starting points of relatively large pits to be formed by surface roughening treatment and also found that a presensitized plate capable of suppressing the occurrence of residual film spots and development scum and obtaining a lithographic printing plate having excellent scumming resistance can be obtained by using an aluminum alloy plate containing intermetallic compound particles with a circle equivalent diameter of 0.2 μm or more at the surface thereof in an amount of more than 35,000 pcs/mm$^2$.

As in the first aspect of the invention, the aluminum alloy plate that may be used in the fourth aspect of the invention contains at least 99 wt % of aluminum and also contains as trace elements at least one element selected from the group consisting of Si, Fe, Ni, Mn, Cu, Mg, Cr, Zn, Bi, Ti and V. In a preferred embodiment, the aluminum alloy plate contains Al, Si and Fe as its essential ingredients.

Specific Examples of the intermetallic compounds that may be included in the aluminum alloy plate of the foregoing composition include $Al_3Fe$, $Al_6Fe$, $Al_mFe$, α-AlFeSi and β-AlFeSi.

Of these, metastable intermetallic compounds (α-AlFeSi, β-AlFeSi, $Al_6Fe$) are preferred and α-AlFeSi is particularly preferred.

In the fourth aspect of the invention, residual film spots and development scum can be prevented from occurring by including intermetallic compound particles with a circle equivalent diameter of 0.2 μm or more in an amount of more than 35,000 pcs/mm$^2$ irrespective of the intermetallic compounds included. As described above, this is presumably because the intermetallic compound particles are present in a large amount and as a result relatively large intermetallic compound particles which serve as starting points for the residual film spots and development scum are reduced.

The intermetallic compound particles with a circle equivalent diameter of 0.2 μm or more are preferably included in an amount of more than 35,000 pcs/mm$^2$ and more preferably 40,000 to 70,000 pcs/mm$^2$ because occurrence of residual film spots and development scum can be further suppressed.

In addition, the intermetallic compound particles preferably have an average diameter of 0.2 to 1.0 μm and more preferably 0.3 to 0.5 μm for the same reason as above.

In the fourth aspect of the invention, the intermetallic compound particles with a circle equivalent diameter of 1.0 μm or more are preferably included in an amount of up to 2,500 pcs/mm$^2$, more preferably up to 2,000 pcs/mm$^2$ and even more preferably up to 1,500 pcs/mm$^2$ because occurrence of residual film spots can be further suppressed.

The number and density of the intermetallic compound particles at the surface of the aluminum alloy plate can be measured by the methods described in the first aspect of the invention.

<Aluminum Alloy Plate (Rolled Aluminum)>

The preferred embodiment of the aluminum alloy plate that may be used in the fourth aspect of the invention and its manufacturing procedure (continuous casting and rolling process) are the same as those in the first aspect of the invention and therefore their description is omitted.

<Surface Roughening Treatment>

The support that may be used in the presensitized plate according to the fourth aspect of the invention can be manufactured by subjecting the surface of the aluminum alloy plate obtained by the continuous casting step and various steps carried out as desired (e.g., intermediate annealing step, cold rolling step) to surface roughening treatment.

The surface roughening treatment and various other treatments following the surface roughening treatment (e.g., anodizing treatment) are the same as those in the first aspect of the invention and therefore their description is omitted.

[Image Recording Layer]

In the fourth aspect of the invention, the presensitized plate can be obtained by forming on the lithographic printing plate support a thermal positive type image recording layer in which the alkali-solubility of the exposed portions increases after exposure to infrared radiation.

The image recording layer contains (K) an infrared absorber and (L) an alkali-soluble resin, and the infrared absorber (K) converts optical energy of infrared radiation into heat and the heat efficiently eliminates the interaction for reducing the alkali solubility of the alkali-soluble resin.

In the fourth aspect of the invention, the image recording layer may be of a single layer structure but is preferably of a multilayer structure including at least two layers (upper recording layer and lower recording layer).

(K) Infrared Absorber

The image recording layer contains an infrared absorber which is a constituent having a function of converting light to heat. This infrared absorber has the ability to convert absorbed infrared radiation to heat, and laser scanning eliminates interaction, decompose a development inhibitor and generates an acid, thereby considerably increasing the solubility in the developer. Further, the infrared absorber itself may interact with the alkali-soluble resin to suppress the alkali-solubility.

When the image recording layer is of a multilayer structure, such an infrared absorber may be contained in at least one of the upper recoding layer and the lower recording layer, but is preferably contained in the upper recording layer in terms of sensitivity.

The infrared absorber for use in the fourth aspect of the invention is a dye or pigment which efficiently absorbs infrared radiation having a wavelength from 760 nm to 1,200 nm and is preferably a dye or pigment having an absorption maximum in a wavelength range from 760 nm to 1,200 nm.

The infrared absorber which may be advantageously used in the presensitized plate according to the fourth aspect of the invention is described below in detail.

Dyes which may be used include commercial dyes and known dyes that are mentioned in the technical literature, such as Senryo Binran [Handbook of Dyes] (The Society of Synthetic Organic Chemistry, Japan, 1970). Illustrative examples of suitable dyes include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal-thiolate complexes.

Preferred dyes include the cyanine dyes mentioned in JP 58-125246 A, JP 59-84356 A, JP 59-202829 A and JP 60-78787 A; the methine dyes mentioned in JP 58-173696 A, JP 58-181690 A and JP 58-194595 A; the naphthoquinone dyes mentioned in JP 58-112793 A, JP 58-224793 A, JP 59-48187 A, JP 59-73996 A, JP 60-52940 A and JP 60-63744 A; the squarylium dyes mentioned in JP 58-112792 A; and cyanine dyes mentioned in GB 434,875.

Other examples of the dyes that may be advantageously used include the near-infrared absorbers/sensitizers mentioned in U.S. Pat. No. 5,156,938. Other compounds that may be preferably used include the substituted arylbenzo(thio) pyrylium salts mentioned in U.S. Pat. No. 3,881,924; the trimethinethiapyrylium salts mentioned in JP 57-142645 A (U.S. Pat. No. 4,327,169); the pyrylium compounds mentioned in JP 58-181051 A, JP 58-220143 A, JP 59-41363 A, JP 59-84248 A, JP 59-84249 A, JP 59-146063 A and JP 59-146061 A; the cyanine dyes mentioned in JP 59-216146 A; the pentamethinethiopyrylium salts mentioned in U.S. Pat. No. 4,283,475; and the pyrylium compounds mentioned in JP 5-13514 B and JP 5-19702 B.

Other exemplary dyes that may be preferably used include the near-infrared absorbing dyes mentioned in U.S. Pat. No. 4,756,993 as represented by formulae (I) and (II).

Of these dyes, cyanine dyes, squarylium dyes, pyrylium salts and nickel-thiolate complexes are particularly preferred.

Pigments which may be used in the fourth aspect of the invention include commercial pigments and pigments mentioned in the technical literatures, such as the Color Index (C.I.), Saishin Ganryo Binran [Latest Handbook of Pigments] (Japan Association of Pigment Technology, 1977), Saishin Ganryo Oyo Gijutsu [Recent Pigment Applications Technology] (CMC Publishing Co., Ltd., 1986), and Insatsu Inki Gijutsu [Printing Ink Technology] (CMC Publishing Co., Ltd., 1984).

Suitable pigments include black pigments, yellow pigments, orange pigments, brown pigments, red pigments, violet pigments, blue pigments, green pigments, fluorescent pigments, metal powder pigments and polymer-bonded dyes. Specific examples of such pigments include insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, lake pigments, azine pigments, nitroso pigments, nitro pigments, natural pigments, fluorescent pigments, inorganic pigments and carbon black.

These pigments may be used without being surface treated or may be used after surface treatment. Examples of surface treatment methods include surface coating with a resin or wax, surfactant deposition, and bonding a reactive substance (e.g., a silane coupling agent, an epoxy compound or a polyisocyanate) to the pigment surface. Surface treatment methods that may be used include those described in Kinzoku Sekken no Seishitsu to Oyo [Properties and Applications of Metallic Soaps] (Saiwai Shobo), Insatsu Inki Gijutsu [Printing Ink Technology] (CMC Publishing Co., Ltd., 1984), and Saishin Ganryo Oyo Gijutsu [Recent Pigment Applications Technology] (CMC Publishing Co., Ltd., 1986).

In terms of the stability of the recording layer-forming coating liquid and the uniformity of recording layer to be formed, the pigments preferably have a particle size of 0.01 µm to 10 µm, more preferably 0.05 µm to 1 µm and most preferably 0.1 µm to 1 µm.

Known dispersion techniques, such as those which can be used in ink production or toner production, may be employed as the method for dispersing the pigment. Illustrative examples of equipment that may be used for this purpose include an ultrasonic disperser, a sand mill, an attritor, a pearl mill, a super mill, a ball mill, an impeller, a disperser, a KD mill, a colloid mill, a dynatron, a three-roll mill and a pressure kneader. These methods of dispersion and dispersion apparatuses are described in Saishin Ganryo Oyo Gijutsu [Recent Pigment Applications Technology] (CMC Publishing Co., Ltd., 1986).

In the fourth aspect of the invention, it is particularly preferred for the infrared absorber to contain an onium salt structure, because use is made of an infrared absorber which interacts with the alkali-soluble resin to generate a positive action (dissolution of the unexposed portions in the alkali developer is suppressed, whereas the action of suppressing the dissolution of the exposed portions is released) and this action is excellent. More specifically, of those illustrated above, cyanine dyes and pyrylium salts are particularly preferred.

In the fourth aspect of the invention, an anionic infrared absorber as described in JP 11-338131 A can also be advantageously used. The anionic infrared absorber refers to one which does not have a cationic structure but an anionic structure on the scaffold of the dye which substantially absorbs infrared radiation.

Examples of the anionic infrared absorber include (K-1) an anionic metal complex and (K-2) an anionic phthalocyanine.

The anionic metal complex (K-1) as used herein refers to a compound in which the central metal and the ligands in the complex part that substantially absorbs light form an anion as a whole.

The anionic phthalocyanine (K-2) refers to a compound in which an anionic group such as a sulfonate group, a carboxylate group or a phosphonate group serves as a substituent to be bonded to a phthalocyanine skeleton to form an anion as a whole.

Other examples thereof include anionic infrared absorbers represented by the formula $[Ga^--M-Gb]_m X^{m+}$ as described in paragraphs [0014] to [0105] of JP 11-338131 A.

In this formula, $Ga^-$ represents an anionic substituent and Gb represents a neutral substituent, $X^{m+}$ represents a cation having a valence of 1 to m (where m represents an integer from 1 to 6) including a proton).

The infrared absorber is preferably a dye. Preferable examples of the dye include those having an onium salt structure as described in paragraphs [0018] to [0034] of JP 11-291652 A.

Infrared absorbers such as cyanine dyes, pyrylium salts and anionic dyes which exhibit dissolution suppressing ability can also be used in combination with other dyes or pigments in the image recording layer in order to further improve the sensitivity and development latitude.

In the fourth aspect of the invention, the content of the infrared absorber in the image recording layer of a single layer type is preferably from 2 wt % to 20 wt %, and more preferably from 3 wt % to 15 wt %, based on the total solids content of the image recording layer. When the image recording layer is of a multilayer structure, the content of the infrared absorber in each of the lower recording layer and the other recording layer(s) is preferably from 0.01 wt % to 50 wt %, more preferably 0.1 wt % to 20 wt %, and even more preferably 0.5 wt % to 15 wt %, based on the total solids content of each of the recording layers, in terms of image formability and suppression of scumming in non-image areas.

When the infrared absorber is to be contained in the recording layer having a dispersion phase formed by using two or more polymers in combination as will be described later, the infrared absorber may be contained in each of a matrix phase and the dispersion phase or both of them. When desired ingredients such as an initiator and an infrared absorber are to be contained in a latex making up the dispersion phase, they may be added with the material during the formation of latex particles or be introduced after the latex is formed.

An example of the method of introducing after the latex is formed includes a method which involves dissolving desired ingredients such as an initiator, a dye and a crosslinking agent in an organic solvent and adding them to a dispersion medium to introduce in the latex dispersed in an aqueous system.

(L) Alkali-Soluble Resin

An example of the alkali-soluble resin contained in the image recording layer includes a phenolic resin.

(Phenolic Resin)

The phenolic resin refers to a polymer compound having a phenolic hydroxyl group as an alkali-soluble group in the molecule.

Specific examples of the polymer compound having a phenolic hydroxyl group include novolac resins such as phenol-formaldehyde resin, xylenol-cresol-formaldehyde resin (3,5-, 2,3-, 2,4-, 2,5-xylenol), m-cresol-formaldehyde resin, p-cresol-formaldehyde resin, m-/p-mixed cresol-formaldehyde resin, and phenol/cresol (m-, p-, or m-/p-mixture)-formaldehyde resin; and a pyrogallol-acetone resin.

Of these, novolac resins having high bonding properties at an ortho position, for example, xylenol-cresol-formaldehyde resin, m-cresol-formaldehyde resin, and p-cresol-formaldehyde resin are preferably contained in a large amount. More specifically, these resins are preferably contained in the total alkali-soluble resin in an amount of 10 wt % or more and more preferably 30 wt % or more.

Other polymer compounds having a phenolic hydroxyl group that may be preferably used are those having a phenolic hydroxyl group at the side chain.

Examples of the polymer compound having a phenolic hydroxyl group at the side chain include polymer compounds obtained by homopolymerizing a polymerizable monomer containing a low molecular weight compound having one or more phenolic hydroxyl groups and one or more polymerizable unsaturated bonds, and those obtained by copolymerizing the polymerizable monomer with any other polymerizable monomer.

Examples of the polymerizable monomer having a phenolic hydroxyl group include acrylamides, methacrylamides, acrylic esters, methacrylic esters and hydroxystyrenes each having a phenolic hydroxyl group.

Specific examples of the polymerizable monomer which may be preferably used include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate and 2-(4-hydroxyphenyl)ethyl methacrylate.

Exemplary monomer ingredients to be copolymerized with the polymerizable monomer having a phenolic hydroxyl group include compounds illustrated in (m1)-(m12).

(m1) acrylic esters and methacrylic esters having aliphatic hydroxyl groups such as 2-hydroxyethyl acrylate and 2-hydroxyethyl methacrylate;

(m2) alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate and glycidyl acrylate;

(m3) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate and glycidyl methacrylate;

(m4) acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide;

(m5) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(m6) vinyl esters such as vinyl acetate, vinyl chloroacetate, vinyl butylate and vinyl benzoate;

(m7) styrenes such as styrene, α-methylstyrene, methylstyrene and chloromethylstyrene;

(m8) vinyl ketones such as methyl vinyl ketone, ethyl vinyl ketone, propyl vinyl ketone and phenyl vinyl ketone;

(m9) olefins such as ethylene, propylene, isobutylene, butadiene and isoprene;

(m10) N-vinylpyrrolidone, acrylonitrile and methacrylonitrile;

(m11) Unsaturated imides such as maleimide N-acryloylacrylamide, N-acetylmethacrylamide, N-propionylmethacrylamide and N-(p-chlorobenzoyl)methacrylamide; and (m12) unsaturated carboxylic acids such as acrylic acid, methacrylic acid, maleic anhydride and itaconic acid.

Examples of the alkali water-soluble polymer compound having a phenolic hydroxyl group of the invention which is a phenolic resin include condensation polymers of phenol and formaldehyde having an alkyl group containing 3 to 8 carbon atoms as a substituent, such as tert-butylphenol formaldehyde resin and octylphenol formaldehyde resin as described in U.S. Pat. No. 4,123,279.

Conventionally known methods such as graft copolymerization method, block copolymerization method and random copolymerization method may be used to synthesize the phenolic resins.

Since the phenolic resin has a strong hydrogen bonding property in an unexposed portion, whereas some of hydrogen bonds are easily released in an exposed portion, the phenolic resin is suitable for a positive type recording layer and is more preferably a novolac resin.

The phenolic resin preferably has a weight-average molecular weight and a number-average molecular weight as measured by a GPC method of 500 to 20,000 and 200 to 10,000, respectively.

The content of the phenolic resin in the image recording layer is preferably from 3 wt % to 50 wt %, and more preferably 5 wt % to 40 wt % based on the total solids content, when the recording layer is of a single layer type.

When the image recording layer is of a multilayer structure, the phenolic resin is preferably contained in the upper recording layer positioned in the proximity of the surface (exposed surface), and in such an embodiment, the content of the phenolic resin in the upper recording layer is preferably from 2 wt % to 20 wt %, and more preferably 3 wt % to 15 wt % based on the total solids content of the upper recording layer.

(Other Polymer)

Exemplary alkali-soluble resins other than the foregoing phenolic resins which are contained in the image recording layer include known polymers (resins) soluble in an aqueous alkaline solution and they may be used according to the intended purpose. In particular when the presensitized plate in the fourth aspect of the invention has a multilayer type image recording layer, they are preferably added to the lower recording layer.

The polymers which are soluble in an aqueous alkali solution (hereinafter referred to as "other polymers") preferably include at least functional groups such as carboxy group, sulfonate group, phosphate group, phosphonate group, active imino group and sulfonamide group.

Therefore, other polymers may be suitably prepared by polymerizing a monomer mixture containing at least one ethylenically unsaturated monomer having a functional group such as carboxy group, sulphonate group, phosphate group, phosphonate group, active imino group, sulfonamide group or a combination thereof.

Examples of the ethylenically unsaturated monomer include acrylic acid, methacrylic acid, N-(4-carboxyphenyl) acrylamide, N-(4-hydroxyphenyl)acrylamide, vinyl phosphonic acid, 1,3-propylene glycol methacrylate phosphate, and 1,4-n-butylene glycol methacrylate phosphate.

A mixture of these monomers may contain other ethylenically unsaturated comonomer. Examples of such other ethylenically unsaturated comonomer include the following monomers:

acrylic esters such as methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate and tetrahydro acrylate;

aryl acrylates such as phenyl acrylate and furfuryl acrylate;

methacrylic esters such as methyl methacrylate, ethyl methacrylate, propyl methacrylate, isopropyl methacrylate, allyl methacrylate, amyl methacrylate hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate;

aryl methacrylates such as phenyl methacrylate, cresyl methacrylate and naphthyl methacrylate;

N-alkylacrylamides such as N-methylacrylamide, N-ethylacrylamide, N-propylacrylamide, N-butylacrylamide, N-t-butylacrylamide, N-heptylacrylamide, N-octylacrylamide, N-cyclohexylacrylamide and N-benzylacrylamide;

N-arylacrylamides such as N-phenylacrylamide, N-tolylacrylamide, N-nitrophenylacrylamide, N-naphthylacrylamide and N-hydroxyphenylacrylamide;

N,N-dialkylacrylamides such as N,N-dimethylacrylamide, N,N-diethylacrylamide, N,N-dibutylacrylamide, N,N-dibutylacrylamide, N,N-diisobutylacrylamide, N,N-diethylhexylacrylamide and N,N-dicyclohexylacrylamide;

N,N-arylacrylamides such as N-methyl-N-phenylacrylamide, N-hydroxyethyl-N-methylacrylamide and N-2-acetamidoethyl-N-acetylacrylamide;

N-alkylmethacrylamides such as N-methylmethacrylamide, N-ethylmethacrylamide, N-propylmethacrylamide, N-butylmethacrylamide, N-t-butylmethacrylamide, N-ethylhexylmethacrylamide, N-hydroxyethylmethacrylamide and N-cyclohexylmethacrylamide;

N-arylmethacrylamides such as N-phenylmethacrylamide and N-naphthylmethacrylamide;

N,N-dialkylmethacrylamides such as N,N-diethylmethacrylamide, N,N-dipropylmethacrylamide and N,N-dibutylmethacrylamide;

N,N-diarylmethacrylamides such as N,N-diphenylmethacrylamide;

methacrylamide derivatives such as N-hydroxyethyl-N-methylmethacrylamide, N-methyl-N-phenylmethacrylamide and N-ethyl-N-phenylmethacrylamide;

allyl compounds such as allyl acetate, allyl caproate, allyl caprylate, allyl laurate, allyl palmitate, allyl stearate, allyl benzoate, allyl acetoacetate, allyl lactate and allyloxyethanol;

vinyl ethers such as hexyl vinyl ether, octyl vinyl ether, dodecyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, vinyl phenyl ether, vinyl tolyl ether, vinyl chlorophenyl ether, vinyl-2,4-dichlorophenyl ether, vinyl naphthyl ether and vinyl anthranil ether;

vinyl esters such as vinyl butyrate, vinyl isobutyrate, vinyl trimethylacetate, vinyl diethylacetate, vinyl valeate, vinyl caproate, vinyl chloroacetate, vinyl methoxyacetate, vinyl butoxyacetate, vinyl phenylacetate, vinyl acetoacetate, vinyl lactate, vinyl-β-phenylbutyrate, vinyl cyclohexylcarboxylate, vinyl benzoate, vinyl salicylate, vinyl chlorobenzoate, vinyl tetrachlorobenzoate and vinyl naphthoate;

styrenes such as styrene, methylstyrene, dimethylstyrene, trimethylstyrene, ethylstyrene, diethylstyrene, isopropylstyrene, butylstyrene, hexylstyrene, cyclohexylstyrene, dodecyl styrene, benzylstyrene, chloromethylstyrene, trifluoromethylstyrene, ethoxymethylstyrene, acetoxymethylstyrene, methoxystyrene, 4-methoxy-3-methylstyrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, 2-bromo-4-trifluoromethylstyrene and 4-fluoro-3-trifluoromethylstyrene;

crotonic esters such as butyl crotonate, hexyl crotonate, crotonic acid and glycerin monocrotonate;

dialkyl itaconates such as dimethyl itaconate, diethyl itaconate and dibutyl itaconate;

dialkyls of maleic acid and fumaric acid, such as dimethyl maleate and dibutyl fumarate;

maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide and N-hydroxyphenylmaleimide; and other nitrogen atom-containing monomers such as N-vinylpyrrolidone, N-vinylpyridine, acrylonitrile and methacrylonitrile.

Of these other ethylenically unsaturated comonomers, for example, (meth)acrylic esters, (meth)acrylamides, maleimides and (meth)acrylonitriles are preferably used.

In the fourth aspect of the invention, these other polymers preferably have a weight-average molecular weight as measured by GPC of 20,000 to 100,000. A weight-average molecular weight of less than 20,000 tends to reduce the solvent resistance and wear resistance, whereas a weight-average molecular weight in excess of 100,000 tends to reduce the alkali developability.

In the fourth aspect of the invention, such other polymers are preferably incorporated in the lower recording layer in an amount of 20 to 95 wt % based on the solids content of the lower recording layer. A content below 20 wt % is not convenient in terms of chemical resistance and a content above 95 wt % is not preferred in terms of exposure speed. Two or more other polymers may optionally be used in combination.

In addition, in cases where any other polymer is used in combination with the phenolic resin in the lower recording layer according to the fourth aspect of the invention, the use of the phenolic resin in combination with the other polymer which is not compatible with the phenolic resin will form a dispersion phase in the lower recording layer.

In the case of using in such an embodiment, the content ratio of the phenolic resin as the resin making up the matrix phase in the lower recording layer to the other polymer making up the dispersion phase (specific polymer/other polymer) in terms of weight ratio is preferably 95/5 to 60/40.

The thus formed lower recording layer including the dispersion phase and matrix phase contains, in the dispersion phase, the above-described infrared absorber and a compound which changes the solubility in an alkaline solution due to the action of heat in large amounts, thereby efficiently improving the solubility of the matrix phase in the alkaline solution.

Next, compounds other than the infrared absorber which may be contained in the dispersion phase are described.

<Acid Generator>

The dispersion phase may contain an acid generator that is decomposed by the action of light or heat to generate an acid, in order to improve the alkali solubility of the alkali-soluble resin in the exposed portions.

The "acid generator" means a compound that may generate an acid by irradiation with light having a wavelength of 200 nm to 500 nm or by heating at 100° C. or more. Specific examples of the acid generator include a photoinitiator for photo-cationic polymerization, a photoinitiator for photo-radical polymerization, a photo-achromatizing agent for dyes, a photo-discoloring agent, known acid generators used for micro-resist; known compounds which are thermally decomposed to generate an acid; and mixtures thereof.

The acids that may be generated are preferably strong acids having a pKa of 2 or less such as sulfonic acid and hydrochloric acid.

Examples of the acid generator that may be advantageously used in the fourth aspect of the invention include the triazine compounds described in JP 11-95415 A and the latent Bronsted acids described in JP 7-20629 A.

The latent Bronsted acid means a precursor which may be decomposed to generate a Bronsted acid. It is assumed that the Bronsted acid catalyzes a matrix generating reaction between a resol resin and a novolac resin. Examples of the Bronsted acid suitable to this purpose include trifluoromethanesulfonic acid and hexafluorophosphonic acid.

Of the latent Bronsted acids, an ionic latent Bronsted acid may be preferably used in the fourth aspect of the invention.

Examples of the ionic latent Bronsted acid include onium salts (e.g., iodonium, sulfonium, phosphonium, selenonium, diazonium and arsonium salts).

Particularly useful onium salts include diphenyliodonium hexafluorophosphate, triphenylsulfonium hexafluoroantimonate, phenylmethyl-ortho-cyanobenzylsulfonium trifluoromethane sulfonate and 2-methoxy-4-aminophenyldiazonium hexafluorophosphate.

Useful ionic latent Bronsted acids are those represented by the following formula.

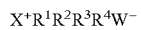  [Chemical Formula 11]

In the formula, when X is iodine, $R^3$ and $R^4$ each represent a lone electron pair and $R^1$ and $R^2$ each represent an aryl or substituted aryl group. When X is S or Se, $R^4$ represents a lone electron pair and $R^1$, $R^2$ and $R^3$ each may represent an aryl group, a substituted aryl group, an aliphatic group or a substituted aliphatic group. When X is P or As, $R^4$ may represent an aryl group, a substituted aryl group, an aliphatic group or a substituted aliphatic group. W may represent $BF_4$, $CF_3SO_3$, $SbF_6$, $CCl_3CO_2$, $ClO_4$, $AsF_6$, $PF_6$ or any corresponding acid having a pH of less than 3.

All the onium salts described in U.S. Pat. No. 4,708,925 may also be used as the latent Bronsted acids. Examples of the onium salts include indonium, sulfonium, phosphonium, bromonium, chloronium, oxysulfoxonium, oxysulfonium, sulfoxonium, selenonium, telluronium and arsonium salts.

Nonionic latent Bronsted acids are also appropriately used in the fourth aspect of the invention.

Examples of the nonionic latent Bronsted acids include compounds represented by the following formulae:

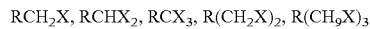

wherein X represents Cl, Br, F or $CF_3SO_3$ and R represents an aromatic group, an aliphatic group or a combination of an aromatic group and an aliphatic group.

In the fourth aspect of the invention, it is particularly preferable to use a diazonium salt as the latent Bronsted acid.

In the fourth aspect of the invention, the content of the acid generator is preferably from 0.01 to 50 wt %, more preferably from 0.1 to 25 wt % and even more preferably 0.5 to 20 wt % based on the total solids content of the lower recording layer in terms of image formability and prevention of scumming in non-image areas.

(Additives)

Not only the ingredients described above but also a wide variety of known additives can be used in combination in the image recording layer according to the intended purpose.

When the image recording layer is a multilayer type recording layer, the dispersion phase is preferably formed in the lower recording layer as described above. Regarding other additives, the same additives may be used in the lower recording layer and the other recording layers.

For example, a fluorine-containing polymer is preferably added to the image recording layer for the purpose of improving the resistance to development in image areas. Examples of the fluorine-containing polymer that may be used in the image recording layer include copolymers formed from fluorine-containing monomers as described in JP 11-288093 A and JP 2000-187318 A.

Specific examples of the fluorine-containing polymer that may be preferably used include fluorine-containing acryl polymers P-1 to P-13 as described in JP 11-288093 A and fluorine-containing polymers obtained by copolymerizing fluorine-containing acryl monomers A-1 to A-33 as described in JP 2000-187318 A with any acryl monomer.

The fluorine-containing polymer used preferably has a weight-average molecular weight of 2,000 or more and a number-average molecular weight of 1,000 or more. The fluorine-containing polymer more preferably has a weight-average molecular weight of 5,000 to 300,000 and a number-average molecular weight of 2,000 to 250,000.

Commercially available fluorosurfactants may also be used for the fluorine-containing polymer having a preferable molecular weight. Specific examples of such surfactants include MEGAFACE F-171, F-173, F-176, F-183, F-184, F-780 and F-781 (all are trade names, manufactured by Dainippon Ink and Chemicals, Inc.).

These fluorine-containing polymers may be used alone or in combination of two or more. The fluorine-containing polymers are added in an amount of 1.4 wt % or more and more preferably 1.4 to 5.0 wt % based on the solids content of image recording layer. At an amount of less than 1.4 wt %, the purpose of the addition of the fluorine-containing polymers, namely, the effect of improving the development latitude of the image recording layer may not be sufficiently achieved. At an amount exceeding 5.0 wt %, the effect of improving the development latitude cannot be fully exerted and the surface of the image recording layer is less likely to solubilize under the influence of the fluorine-containing polymers, resulting in a decrease in sensitivity.

A dissolution inhibitor which is a thermally decomposable material and substantially lowers the solubility of the alkali-soluble resin in the undecomposed state may further be optionally used in the recording layer. Examples of the dissolution inhibitor include an onium salt, an o-quinonediazide compound, an aromatic sulfone compound and an aromatic sulfonate compound.

The addition of the dissolution inhibitor makes it possible to improve the resistance to dissolution of the image areas in a developer and to use, as an infrared absorber, a compound which does not interact with the alkali-soluble resin.

Examples of the onium salt include diazonium salts, ammonium salts, phosphonium salts, iodonium salts, sulfonium salts, selenonium salts and arsonium salts.

Preferable examples of the onium salt that may be used in the fourth aspect of the invention include diazonium salts described in S. I. Schlesinger, Photogr. Sci. Eng., 18, 387 (1974), T. S. Bal et al., Polymer, 21, 423 (1980), and JP 5-158230 A; ammonium salts described in U.S. Pat. No. 4,069,055, U.S. Pat. No. 4,069,056, and JP 3-140140 A; phosphonium salts described in D. C. Necker et al., Macromolecules, 17, 2468 (1984), C. S. Wen et al., Teh, Proc. Conf. Rad. Curing ASIA, p. 478, Tokyo, October (1988), U.S. Pat. No. 4,069,055 and U.S. Pat. No. 4,069,056; iodonium salts described in J. V. Crivello et al., Macromolecules, 10 (6), 1307 (1977), Chem. & Eng. News, November 28, p. 31, (1988), EP 104,143, U.S. Pat. No. 5,041,358, U.S. Pat. No. 4,491,628, JP 2-150848 A and JP 2-296514 A;

sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP 370,693, EP 233,567, EP 297,443, EP 297,442, U.S. Pat. No. 4,933,377, U.S. Pat. No. 3,902, 114, U.S. Pat. No. 4,491,628, U.S. Pat. No. 5,041,358, U.S. Pat. No. 4,760,013, U.S. Pat. No. 4,734,444, U.S. Pat. No. 2,833,827, DE 2,904,626, DE 3,604,580 and DE 3,604,581; selenonium salts described in J. V. Crivello et al., Macromolecules, 10 (6), 1307 (1977), J. V. Crivello et al., J. Polymer Sci., Polymer Chem. Ed., 17, 1047 (1979); and arsonium salts described in C. S. Wen et al., and Teh Proc. Conf. Rad. Curing ASIA, p. 478, Tokyo, October (1988).

A diazonium salt is particularly preferable as the dissolution inhibitor that may be used in the fourth aspect of the invention. Particularly preferable examples of the diazonium salt include those described in JP 5-158230 A.

Examples of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and p-toluenesulfonic acid. Of these, hexafluorophosphoric acid, and alkyl aromatic sulfonic acids such as triisopropylnaphthalenesulfonic acid and 2,5-dimethylbenzenesulfonic acid are particularly preferable.

Preferable examples of the quinonediazide include an o-quinonediazide compound. The o-quinonediazide compound for use in the invention is a compound which has at least one o-quinonediazide group and is thermally decomposed to increase the alkali-solubility, and compounds having various structures may be used. In other words, the o-quinonediazide compound enhances the solubility of the photosensitive system by both of the effect that the function of suppressing the dissolution of the binder is lost by the thermal decomposition of the o-quinonediazide and the effect that the o-quinonediazide itself changes to an alkali-soluble material.

Examples of the o-quinonediazide compound that may be used in the fourth aspect of the invention include compounds described in J. Koser, "Light-Sensitive Systems" (John Wiley & Sons. Inc.), pp. 339-352. Sulfonic acid esters or sulfonic acid amides of o-quinonediazide formed by allowing to react with various aromatic polyhydroxy compounds or with aromatic amino compounds are preferable. Preferable examples of the o-quinonediazide compound further include an ester of benzoquinone-(1,2)-diazidesulfonic acid chloride or naphthoquinone-(1,2)-diazide-5-sulfonic acid chloride and a pyrogallol-acetone resin, as described in JP 43-28403 B; and an ester of benzoquinone-(1,2)-diazidesulfonic acid chloride or naphthoquinone-(1,2)-diazide-5-sulfonic acid chloride and a phenol-formaldehyde resin, as described in U.S. Pat. No. 3,046,120 and U.S. Pat. No. 3,188,210.

Further examples of the o-quinonediazide compound that may be preferably used include an ester of naphthoquinone-(1,2)-diazide-4-sulfonic acid chloride and a phenol-formaldehyde resin or cresol-formaldehyde resin; and an ester of naphthoquinone-(1,2)-diazide-4-sulfonic acid chloride and a pyrogallol-acetone resin. Other useful o-quinonediazide compounds are reported in many patent documents, examples of which include JP 47-5303 A, JP 48-63802 A, JP 48-63803 A, JP 48-96575 A, JP 49-38701 A, JP 48-13354 A, JP 41-11222 B, JP 45-9610 B, JP 49-17481 B, U.S. Pat. No. 2,797,213, U.S. Pat. No. 3,454,400, U.S. Pat. No. 3,544,323, U.S. Pat. No. 3,573,917, U.S. Pat. No. 3,674,495, U.S. Pat. No. 3,785,825, GB 1,227,602, GB 1,251,345, GB 1,267,005, GB 1,329,888, GB 1,330,932, and DE 854,890.

The o-quinonediazide compound is preferably added in an amount of 1 to 50 wt %, more preferably 5 to 30 wt % and most preferably 10 to 30 wt % based on the total solids content of each recording layer. These compounds can be used singly but may be used as mixtures of two or more thereof.

The additives other than the o-quinonediazide compound are preferably added in amounts of 1 to 50 wt %, more preferably 5 to 30 wt % and most preferably 10 to 30 wt %.

The additives and binder used in the fourth aspect of the invention are preferably contained in the same layer.

A polymer containing a (meth)acrylate monomer having two or three perfluoroalkyl groups containing 3 to 20 carbon atoms in the molecule as a polymerization ingredient, as described in the specification of JP 2000-87318 A may be used together for the purpose of enhancing the discrimination of an image to be formed and resistance to scratch on the surface.

In order to increase the sensitivity, the recording layer may further contain a cyclic acid anhydride, a phenolic compound, an organic acid or the like.

Examples of the cyclic acid anhydride include phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride, as described in U.S. Pat. No. 4,115,128.

Examples of the phenolic compound include bisphenol A, p-nitrophenol, p-ethoxyphenol, 2,4,4'-trihydroxybenzophenone, 2,3,4-trihydroxybenzophenone, 4-hydroxybenzophenone, 4,4',4''-trihydroxytriphenylmethane and 4,4',3'',4''-tetrahydroxy-3,5,3',5'-tetramethyltriphenylmethane.

Examples of the organic acid include sulfonic acids, sulfinic acids, alkylsulfuric acids, phosphonic acids, phosphates, and carboxylic acids, as described in JP 60-88942 A and JP 2-96755 A. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

The content of the cyclic acid anhydrides, the phenol compounds and the organic acids in the material of the printing plate is preferably from 0.05 to 20 wt %, more preferably from 0.1 to 5 wt %, and most preferably from 0.1 to 10 wt %.

For example, dyes having a large absorption in the visible light range can be further added to the image recording layer as image colorants. Specific examples include those described in JP 62-293247 A, such as Oil Yellow #101, Oil Yellow #103, Oil Pink #312, Oil Green BG, Oil Blue BOS, Oil Blue #603, Oil Black BY, Oil Black BS and Oil Black T-505 (Orient Chemical Industries Co., Ltd.); and Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), and Aizen Spilon Blue C-RH (Hodogaya Chemical Co., Ltd.).

These dyes are preferably added to clarify the distinction between an image area and a non-image area after an image is formed. The amount of addition based on the total solids content of the recording layer is preferably from 0.01 wt % to 10 wt %.

In order to increase the processing stability against development conditions, nonionic surfactants as described in JP 62-251740 A and JP 3-208514 A, amphoteric surfactants as described in JP 59-121044 A and JP 4-13149 A, siloxane compounds as described in EP 950517 A, or copolymers of fluorine-containing monomers as described in JP 11-288093 A may be added to the image recording layer.

Specific examples of nonionic surfactants include sorbitan tristearate, sorbitan monopalmitate, sorbitan trioleate, stearyl acid monoglyceride and polyoxyethylene nonyl phenyl ether.

Specific examples of amphoteric surfactants include alkyldi(aminoethyl)glycine, alkylpolyaminoethylglycine hydrochloride, 2-alkyl-N-carboxyethyl-N-hydroxyethylimidazolinium betaine and N-tetradecyl-N,N-betaine type surfactants (for example, "AMOGEN K" (trade name), manufactured by Dai-ichi Kogyo Seiyaku Co., Ltd.).

The siloxane compounds are preferably block copolymers of dimethylsiloxane and polyalkylene oxide. Specific examples thereof include polyalkylene oxide modified silicones such as DBE-224, DBE-621, DBE-712, DBP-732 and DBP-534 (Chisso Corporation) and Tego Glide 100 (Evonik Tego Chemie GmbH, Germany).

The nonionic surfactants and the amphoteric surfactants preferably account for 0.05 wt % to 15 wt %, and more preferably 0.1 wt % to 5 wt % of the recording layer.

A printing-out agent which is a material for obtaining a visible image immediately after heating by exposure to light, or a dye or pigment as an image colorant, may be added to the presensitized plate in the fourth aspect of the invention.

A typical example of the printing-out agent is a combination of an organic dye which may form a salt with a compound which can release an acid due to heating upon exposure to light (photo-acid releasing agent).

Specific examples of the combination include combinations of o-naphthoquinonediazide-4-sulfonic acid halogenides with salt-formable organic dyes, as described in JP 50-36209 A and JP 53-8128 A; and combinations of trihalomethyl compounds with salt-formable organic dyes, as described in JP 53-36223 A, JP 54-74728 A, JP 60-3626 A, JP 61-143748 A, JP 61-151644 A and JP 63-58440 A. The trihalomethyl compounds are classified into oxazol compounds and triazine compounds. Both of the compounds have excellent temporal stability and produce a clear print-out image. Other examples of the photo-acid releasing agent include various o-naphthoquinonediazide compounds as described in JP 55-62444 A, 2-trihalomethyl-5-aryl-1,3,4-oxadiazole compounds as described in JP 55-77742 A, and diazonium salts.

A plasticizer may optionally be added to the recording layer-forming coating liquid in the fourth aspect of the invention in order to impart flexibility to the coated film. For example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid may be used.

The presensitized plate in the fourth aspect of the invention may be usually manufactured by sequentially applying recording layer-forming coating liquids each obtained by dissolving the ingredients in a solvent onto an appropriate support.

Those illustrated in the second aspect of the invention may be used at illustrated concentrations as solvents suitable to form the recording layer.

It is preferable that the lower recording layer and the upper recording layer (or other recording layer) on the lower recording layer be essentially separately formed from each other.

Examples of the method of separately forming the two layers from each other include a method which makes use of a difference between the solubility of the ingredients contained in the lower recording layer in a solvent and that of the ingredients contained in the upper recording layer in a solvent, and a method in which a solvent is dried and removed quickly after the upper recording layer is applied. However, the method is not limited thereto.

An example of the method which makes use of the difference between the solubility of the ingredients contained in the lower recording layer in a solvent and that of the ingredients contained in the upper recording layer in a solvent includes a method using a solvent which does not dissolve the alkali-soluble resin contained in the lower recording layer when the coating liquid for the upper recording layer is applied. In this way, coated films formed by two-layer coating can be clearly separated from each other. For example, an ingredient insoluble in solvents such as methyl ethyl ketone and 1-methoxy-2-propanol, which dissolve the alkali-soluble resin as the ingredient in the upper recording layer, is selected as the ingredient of the lower recording layer, the lower recording layer is coated using a solvent system which dissolves the ingredient contained in the lower recording layer, and the coated film is dried, thereafter, upper recording layer-forming coating liquid containing the alkali-soluble polymer as the primary ingredient is dissolved in methyl ethyl ketone, 1-methoxy-2-propanol or the like, and applied and dried, whereby two layers can be formed.

When a method using a solvent which does not dissolve the alkali-soluble resin contained in the lower recording layer is used upon application of the upper recording layer-forming coating liquid, a solvent which dissolves the alkali-soluble resin contained in the lower recording layer may be mixed with a solvent which does not dissolve this alkali-soluble resin. The mixing ratio between the upper recording layer and the lower recording layer can be arbitrarily controlled by changing the mixing ratio of both the solvents. If the ratio of the solvent that dissolves the alkali-soluble polymer contained in the lower recording layer is increased, part of the lower recording layer is dissolved upon application to form the upper recording layer and the dissolved ingredients are contained in the upper recording layer as particulate ingredients after being dried. The particulate ingredients form projections on the surface of the upper recording layer, thereby improving the scratch resistance. On the other hand, the ingredients in the lower recording layer dissolve into the upper recording layer, resulting in a tendency of deterioration in the film quality and chemical resistance of the lower recording layer. By thus controlling the mixing ratio in consideration of physical properties for each layer, various characteristics can be exhibited, and partial compatibility between the layers can also be developed, which will be described hereinafter.

In the fourth aspect of the invention, when a mixed solvent as mentioned above is used as a solvent for the coating liquid of the upper recording layer in terms of the effects, the amount of a solvent which may dissolve the alkali-soluble polymer in the lower recording layer is preferably 80 wt % or less based on the amount of the solvent used for the coating liquid of the upper recording layer in terms of the chemical resistance, and more preferably 10 wt % to 60 wt % in terms of the scratch resistance.

Then, examples of the method of drying a solvent very quickly after the second layer (upper recording layer) is formed include a method which involves blowing high pressure air from a slit nozzle arranged approximately perpendicular to the travel direction of a web, a method which involves supplying thermal energy as conductive heat to a web from the underside of the web through a roll (heating roll) into which a heating medium such as steam is supplied, and the combination of these methods.

In the fourth aspect of the invention, various coating methods described in connection with the formation of the thermosensitive layer in the first aspect of the invention may be used to coat each of the layers such as the recording layer.

The coating method used to form the upper recording layer is desirably carried out in a non-contact system to prevent damage to the lower recording layer upon coating of the upper recording layer. While bar coating which is a contact system may be used as the method commonly used in a solvent coating, it is desirable to carry out the coating in a forward rotation drive system to prevent damage to the lower recording layer.

In order to ensure the press life while suppressing the occurrence of residual film during development, the coating weight of the dried recording layer in the presensitized plate according to the fourth aspect of the invention is preferably in a range of 0.7 g/m$^2$ to 4.0 g/m$^2$ and more preferably 0.8 g/m$^2$ to 3.0 g/m$^2$ in the case of a single layer.

Further, in the case of a multiple layer, the coating weight of the dried lower recording layer is preferably in a range of 0.5 g/m$^2$ to 1.5 g/m$^2$ and more preferably 0.7 g/m$^2$ to 1.0 g/m$^2$ and the coating weight of the dried upper recording layer is preferably in a range of 0.05 g/m$^2$ to 1.0 g/m$^2$ and more preferably 0.07 g/m$^2$ to 0.7 g/m$^2$ in order to ensure the press life while suppressing the occurrence of residual film during development. When the upper recording layer includes two or more sublayers, the coating weight shows the total coating weight thereof.

A surfactant may be added to the coating liquid for the recording layer for the same reason as described in the second aspect of the invention. Suitable surfactants and their suitable amounts of addition are the same as those in the second aspect of the invention and therefore their description is omitted.

[Undercoat Layer]

The presensitized plate in the fourth aspect of the invention includes a support and the foregoing image recording layer formed on the support and may optionally have an undercoat layer provided between the support and the image recording layer.

Various organic compounds can be used as ingredients of the undercoat layer. Examples thereof include carboxymethylcellulose, dextrin, gum arabic, phosphonic acids having an amino group such as 2-aminoethylphosphonic acid; organic phosphonic acids which may have a substituent, such as phenyl phosphonic acid, naphthylphosphonic acid, alkylphosphonic acid, glycerophosphonic acid, methylenediphosphonic acid and ethylenediphosphonic acid; organic phosphoric acids which may have a substituent, such as phenylphosphoric acid, naphthylphosphoric acid, alkylphosphoric acid and glycerophosphoric acid; organic phosphinic acids which may have a substituent, such as phenylphosphinic acid, naphthylphosphinic acid, alkylphosphinic acid and glycerophosphinic acid; amino acids such as glycine and β-alanine; and hydrochlorides of amines having a hydroxy group, such as triethanolamine hydrochloride. These organic compounds may be used alone or in combination of two or more thereof.

The organic undercoat layer can be formed by the methods including: a method which involves applying, onto the aluminum plate, a solution in which any of the organic compounds is dissolved in water, or an organic solvent such as methanol, ethanol or methyl ethyl ketone, or a mixed solvent thereof and then drying the applied solution to form the undercoat layer; and a method which involves immersing the aluminum plate into a solution in which any of the organic compounds is dissolved in water or an organic solvent such as methanol, ethanol or methyl ethyl ketone, or a mixed solvent thereof so as to adsorb the compound thereonto, rinsing the aluminum plate with water or the like, and drying the coated film to form the undercoat layer. In the former method, the solution of the organic compound having a concentration of 0.005 to 10 wt % may be applied in various ways. In the latter method, the concentration of the organic compound in the solution is from 0.01 to 20 wt %, and preferably from 0.05 to 5 wt %, the temperature for the immersion is from 20 to 90° C., and preferably from 25 to 50° C., and the time for immersion is from 0.1 second to 20 minutes, and preferably from 2 seconds to 1 minute. The pH of the solution used in these methods can be adjusted in a range of 1 to 12 with a basic material such as ammonia, triethylamine or potassium hydroxide, or an acidic material such as hydrochloric acid or phosphoric acid. Moreover, a yellow dye may also be added to the solution in order to improve the tone reproducibility of the image recording material.

The coating weight of the undercoat layer is suitably from 2 to 200 mg/m$^2$ and preferably from 5 to 100 mg/m$^2$ in terms of press life.

[Method of Making Lithographic Printing Plate]

The method of making a lithographic printing plate according to the fourth aspect of the invention is a method including an image recording step for recording an image by imagewise exposure on the presensitized plate in the fourth aspect of the invention and a development step for developing the presensitized plate having the image recorded thereon with a developer at a pH of 9 or more to obtain the lithographic printing plate.

[Image Recording Step]

The image recording step is a step for recording an image by imagewise exposure on the presensitized plate in the fourth aspect of the invention.

Imagewise exposure as used herein refers to imagewise exposure through a transparent original having, for example, a line image or a halftone dot image, or imagewise exposure by laser beam scanning using digital data.

A light source having an emission wavelength in the near-infrared region to the infrared region is used as the light source for exposure. Specifically, the presensitized plate is preferably imagewise exposed to light from a solid-state laser or a semiconductor laser emitting infrared rays having a wavelength of 760 nm to 1,200 nm.

[Development Step]

The development step is a step for developing the presensitized plate in the fourth aspect of the invention having the image recorded in the image recording step with a developer at a pH of 9 or more to obtain the lithographic printing plate.

Although the development process may be carried out immediately after exposure, a heat treatment may be carried out between the image recording step and the development step. The heat treatment is preferably carried out at a temperature of 60° C. to 150° C. for 5 seconds to 5 minutes. Conventionally known various methods may be used for heating. Examples of the heating method include a method in which a recording material is heated as it is in contact with a panel heater or a ceramic heater, and a non-contact method using a lamp or hot air. This heat treatment enables the laser energy required for recording to be reduced upon laser irradiation.

In the fourth aspect of the invention, any conventionally known aqueous alkali solution may be used as a developer and a replenisher to be used for making a plate from the presensitized plate.

The developer which may be applied to the developing process of the presensitized plate in the fourth aspect of the invention is one having a pH of 9.0 to 14.0 and preferably 12.0 to 13.5.

A conventionally known aqueous alkali solution may be used as the developer (the replenisher is hereinafter also referred to as a developer). Exemplary inorganic alkaline salts include sodium silicate, potassium silicate, trisodium phosphate, tripotassium phosphate, triammonium phosphate, disodium hydrogen phosphate, dipotassium hydrogen phosphate, diammonium hydrogen phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Exemplary organic alkali agents include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine. These aqueous alkali solutions may be used alone or in combination of two or more thereof.

Moreover, an aqueous alkali solution containing a non-reducing sugar and a base may also be used. The non-reducing sugar refers to a sugar having no reducing ability due to lack of a free aldehyde group or ketone group, and is classified into trehalose oligosaccharides in which reducing groups are combined with one another, glycosides in which reducing groups of sugars are combined with non-sugars, and sugar alcohols in which sugars are reduced by hydrogenation. Any of these non-reducing sugars may be advantageously used in the fourth aspect of the invention.

Examples of the trehalose oligosaccharides include saccharose and trehalose. Examples of the glycosides include alkyl glucosides, phenolic glucosides, and mustard seed oil glucoside. Examples of the sugar alcohols include D, L-arabitol, ribitol, xylitol, D, L-sorbitol, D, L-mannitol, D, L-iditol, D, L-talitol, dulcitol, and allodulcitol. Furthermore, maltitol obtained by hydrogenating a disaccharide, and a reductant obtained by hydrogenating an oligosaccharide (i.e., reduced starch syrup) are preferably used. Of these, sugar alcohol and saccharose are particularly preferable. D-sorbitol, saccharose, and reduced starch syrup are preferable because they have a buffer action in an appropriate pH range and are inexpensive.

These non-reducing sugars may be used alone or in combination of two or more thereof and account for preferably 0.1 to 30 wt % and more preferably 1 to 20 wt % of the developer.

The base combined with the non-reducing sugar(s) may be a conventionally known alkali agent. Examples thereof include inorganic alkali agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogen carbonate, potassium hydrogen carbonate, ammonium hydrogen carbonate, sodium borate, potassium borate and ammonium borate; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents are used alone or in combination of two or more. Of these, sodium hydroxide and potassium hydroxide are preferable. This is because the pH can be adjusted in a wide pH range by regulating the amount of the alkali agent to be added to the non-reducing sugar. The alkali agents such as trisodium phosphate, sodium carbonate and potassium carbonate have a buffer action by nature and are therefore preferable.

It is known that, in cases where an automatic developing machine is used to perform development, a large number of presensitized plates can be processed by adding an aqueous solution (or, replenisher) having a higher alkaline strength than that of the developer without replacing the developer in the developing tank for a long period of time. This replenishment system is also preferably applied to the fourth aspect of the invention. Various surfactants and organic solvents may optionally be incorporated into the developer and the replenisher in order to promote or suppress developability, disperse scum generated during development, and enhance the ink-affinity of image areas in the printing plate. Preferable examples of the surfactants include anionic surfactants, cationic surfactants, nonionic surfactants and amphoteric surfactants. If necessary, the following may be added to the developer and the replenisher: reducing agents such as hydroquinone, resorcin, a sodium or potassium salt of an inorganic acid such as sulfurous acid or sulfurous hydracid, an organic carboxylic acid, a defoaming agent and a water softener. The printing plate developed with the developer and replenisher described above is subsequently subjected to post-treatments with washing water, a rinse solution containing a surfactant and other ingredients, and a desensitizing solution containing gum arabic and a starch derivative. In the fourth aspect of the invention, these treatments may be employed in various combinations for the post-treatment in the case of using the presensitized plate as a printing plate.

In recent years, automatic developing machines for printing plates have been widely used in order to rationalize and standardize plate-making processes in the plate-making and printing industries. These automatic developing machines are generally made up of a developing section and a post-treatment section, and include a device for transporting printing plates, various treating solution tanks, and spray devices. These machines are those for developing an exposed printing plate by spraying respective treating solutions which were pumped up, onto the exposed printing plate through spray nozzles while the printing plate is being transported horizontally. Recently, a method has also attracted attention in which a printing plate is immersed in treating solution tanks filled with treating solutions and transported by means of in-liquid guide rolls. Such automatic processing can be performed while replenishers are being added to the respective treating solutions in accordance with the amounts to be treated, operating times, and other factors. A so-called disposable system can also be used in which treatments are conducted with the use of unused treating solutions.

A method of treating the presensitized plate in the fourth aspect of the invention is described below. In cases where unnecessary image areas (e.g., film edge traces of an original image film) are present on a lithographic printing plate obtained by imagewise exposing a presensitized plate, developing the exposed plate, and subjecting the developed plate to at least one of washing with water, rinsing and gum coating, the unnecessary image areas are erased. The erasing is preferably performed by a method as described in, for example, JP 2-13293 B which involves applying an erasing solution to the unnecessary image areas, allowing to stand the printing plate for a given period of time, and washing the plate with water. This erasing may also be performed by a method as described in JP 5-174842 A which involves irradiating the unnecessary image areas with actinic rays guided through optical fibers, and then developing the plate.

The lithographic printing plate obtained as described above can be subjected to a printing step after being coated with a desensitizing gum as desired. However, burning treatment is applied to obtain a lithographic printing plate having a longer press life. Burning of the lithographic printing plate is preferably preceded by a treatment with a counter-etching solution as described in JP 61-2518 B, JP 55-28062 B, JP 62-31859 A or JP 61-159655 A.

Examples of the method of the counter-etching treatment include: a method which involves applying the counter-etching solution onto the lithographic printing plate with a sponge or absorbent cotton infiltrated with the solution; a method which involves immersing the lithographic printing plate in a vat filled with the counter-etching solution; and a method which involves applying the counter-etching solution to the lithographic printing plate with an automatic coater. When the amount of solution applied is made uniform with a squeegee or a squeegee roller after the solution is applied, a better result is obtained.

In general, the amount of the counter-etching solution applied is suitably from 0.03 g/m$^2$ to 0.8 g/m$^2$ (dry weight). The lithographic printing plate onto which the counter-etching solution is applied is heated to a high temperature in a burning processor (e.g., burning processor BP-1300 available from FUJIFILM Corporation) or the like after being dried if necessary. In this case, the heating temperature and the heating time, which may depend on the kind of ingredients forming the image, are preferably from 180° C. to 300° C. and from 1 minute to 20 minutes.

If necessary, the burned lithographic printing plate can be appropriately subjected to conventional treatments such as washing with water and gum coating. However, in cases where a counter-etching solution containing a water-soluble polymer compound or the like is used, the so-called desensitizing treatment such as gum coating may be omitted.

The lithographic printing plate obtained after the foregoing treatments is mounted on an offset printing press and used to print a large number of impressions.

EXAMPLES

The invention is described below in detail by way of examples. However, the invention should not be construed as being limited to the following examples.

Examples 1 to 12 and Comparative Examples 1 to 4 illustrated below are those concerning the first aspect of the invention.

Manufacture of Aluminum Alloy Plate

Examples 1 to 12

Each aluminum alloy melt of the composition shown in Table 1 was used to prepare an aluminum alloy plate by continuous casting including intermediate annealing under the conditions shown in Table 2.

An aluminum material with a very small carbide content was used and one or more carbon members were immersed at the exit of the melting furnace to adjust the content of the aluminum carbide in the aluminum melt by the number of carbon members in a range of 0 to 12.

More specifically, the aluminum alloy melt of each composition was first continuously cast by a twin roll process to a cast plate thickness of 5.5 mm.

Then, the resulting continuously cast plate was subjected to cold rolling to a plate thickness of 0.9 mm, then subjected to intermediate annealing heat treatment under the conditions shown in Table 2, and further subjected to cold rolling again to be finished to a thickness of 0.3 mm.

Then, a tension lever was used to correct the flatness to prepare an aluminum alloy plate. The composition of each of the prepared aluminum alloy plates is the same as that of the aluminum alloy melt used therefor.

Comparative Examples 1 and 4

Each aluminum alloy melt of the composition shown in Table 1 was used to prepare an aluminum alloy plate by DC casting. More specifically, DC (direct chill) casting was performed to form a slab with a thickness of 500 mm.

Then, both the surfaces of the resulting slab were scalped to a depth of 20 mm and soaking treatment was carried out at 500 to 600° C.

Then, hot rolling was carried out to roll the plate to a thickness of 3 mm. The plate was recrystallized by heat generated by rolling and finished to a thickness of 0.3 mm by cold rolling. Intermediate annealing was carried out at 410° C. to 550° C.

Then, a tension lever was used to correct the flatness to prepare an aluminum alloy plate. The composition of each of the prepared aluminum alloy plates is the same as that of the aluminum alloy melt used therefor.

(Number Per Unit Weight of Aluminum Carbide)

First, an aluminum sample in an amount of 1 g was taken from a rolled plate and immersed in 100 mL of dehydrated methanol (guaranteed reagent). Then, several drops of bromine (guaranteed reagent) were mixed (the whole of the vessel was cooled to prevent the temperature from exceeding 40° C.) and added in an amount of 5 mL to completely dissolve the aluminum at 40° C. in 3 hours. Then, the solution was filtered through a Teflon (registered trademark) filter with a mesh size of 1 μm, and 50 mL of 10% NaOH solution was poured through the filter at room temperature and reacted for 10 minutes. Then, the filter was washed with water and dried. A certain area of the filter was observed by SEM at 2,000× and the number of particles identified as aluminum carbide was measured from elemental analysis such as EPMA or EDX analysis. The number of aluminum carbide particles contained in 1 g of dissolved aluminum was calculated from the relation between the measured number in the given area and the total filtration area of the filter. The results are shown in Table 2.

The number per unit area of intermetallic compound particles in each of the prepared aluminum alloy plates was determined by the method described below. The results are shown in Table 2.

(Number Per Unit Area of Intermetallic Compound Particles)

First, the prepared aluminum alloy plate from which the surface oil had been wiped off was used as a measurement sample.

Then, a scanning electron microscope (PC-SEM7401F, JEOL Ltd.) was used to capture a reflected electron image of the surface of the aluminum alloy plate at an acceleration voltage of 12.0 kV and a magnification of 2,000×.

Images at five positions arbitrarily selected from the resulting reflected electron image were saved into JPEG format and converted to bmf (bitmap file) format with MS-Paint (Microsoft Corporation).

This bmf format file was read into image analysis software ImageFactroy Ver. 3.2, Japanese version (Asahi-Hitec. K.K.) to carry out image analysis. Thereafter, the images were statically binarized to count the portions corresponding to intermetallic compound white spots. The circle equivalent diameter was specified as a characteristics amount to obtain the particle size distribution.

The number of intermetallic compound particles with a circle equivalent diameter of 0.2 μm or more was calculated from the results of the particle size distribution. The numbers calculated from the respective image data (particle size distribution) at the five positions were averaged and the average was rounded to the nearest 1,000.

TABLE 1

|  | Casting method | Aluminum alloy melt | | | | | |
|---|---|---|---|---|---|---|---|
|  |  | Si (wt %) | Fe (wt %) | Cu (wt %) | Ti (wt %) | Others (wt %) | Balance |
| EX 1 | Twin-roll | 0.08 | 0.31 | 0.002 | 0.020 | 0.05 or less | Al |
| EX 2 | continuous | 0.08 | 0.31 | 0.002 | 0.020 | 0.05 or less | Al |
| EX 3 | casting | 0.08 | 0.31 | 0.002 | 0.020 | 0.05 or less | Al |
| EX 4 |  | 0.08 | 0.31 | 0.002 | 0.020 | 0.05 or less | Al |
| EX 5 |  | 0.08 | 0.31 | 0.002 | 0.020 | 0.05 or less | Al |
| EX 6 |  | 0.08 | 0.31 | 0.002 | 0.020 | 0.05 or less | Al |
| EX 7 |  | 0.08 | 0.31 | 0.002 | 0.020 | 0.05 or less | Al |
| EX 8 |  | 0.08 | 0.31 | 0.002 | 0.020 | 0.05 or less | Al |
| EX 9 |  | 0.08 | 0.36 | 0.002 | 0.020 | 0.05 or less | Al |
| EX 10 |  | 0.08 | 0.34 | 0.002 | 0.020 | 0.05 or less | Al |
| EX 11 |  | 0.08 | 0.31 | 0.002 | 0.020 | 0.05 or less | Al |
| EX 12 |  | 0.08 | 0.31 | 0.002 | 0.020 | 0.05 or less | Al |
| CE 1 | DC casting | 0.08 | 0.31 | 0.002 | 0.020 | 0.05 or less | Al |
| CE 2 |  | 0.08 | 0.31 | 0.002 | 0.020 | 0.05 or less | Al |
| CE 3 |  | 0.08 | 0.31 | 0.002 | 0.020 | 0.05 or less | Al |
| CE 4 |  | 0.08 | 0.31 | 0.002 | 0.020 | 0.05 or less | Al |

TABLE 2

|  | Number of carbon members immersed at the exit of melting furnace | Number of aluminum carbide particles with size of 1 μm or more (pcs/g) | Heat treatment condition | Intermetallic compound 0.2 μm or more (pcs/mm$^2$) |
|---|---|---|---|---|
| EX 1 | 5 | 18500 | 530° C. × 6 h | 41000 |
| EX 2 | 5 | 18500 | 530° C. × 9 h | 35500 |
| EX 3 | 5 | 18500 | 530° C. × 3 h | 76500 |
| EX 4 | 0 | 2300 | 530° C. × 6 h | 41000 |
| EX 5 | 3 | 10000 | 530° C. × 6 h | 41000 |
| EX 6 | 7 | 23000 | 530° C. × 6 h | 41000 |
| EX 7 | 9 | 27000 | 530° C. × 6 h | 41000 |
| EX 8 | 12 | 29800 | 530° C. × 6 h | 41000 |
| EX 9 | 5 | 18500 | 530° C. × 6 h | 41000 |
| EX 10 | 5 | 18500 | 530° C. × 6 h | 41000 |
| EX 11 | 12 | 29800 | 530° C. × 6 h | 41000 |
| EX 12 | 12 | 29800 | 530° C. × 6 h | 41000 |
| CE 1 | 0 | 23000 | 410° C. × 2 h | 33500 |
| CE 2 | 7 | 33000 | 410° C. × 2 h | 33500 |
| CE 3 | 12 | 45000 | 410° C. × 2 h | 33500 |
| CE 4 | 0 | 27000 | 550° C. × 12 h | 17500 |

[Manufacture of Support]

Each of the prepared aluminum alloy plates was subjected to surface roughening treatment described below to obtain a support used for a presensitized plate.

The surface roughening treatment including the following treatments (a) to (k) was carried out. Rinsing treatment was carried out among all the treatment steps.

(a) Mechanical Graining Treatment (Brush Graining)

Figure 5:
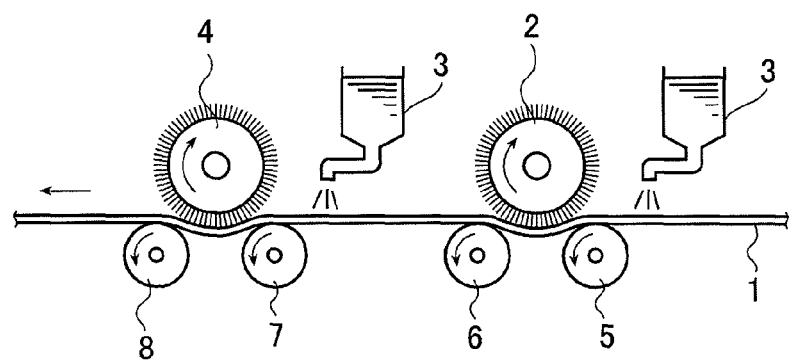
FIG. 5 is a side view illustrating the concept of a brush graining step that may be used in mechanical graining treatment.

An apparatus as schematically shown in FIG. 5 was used to perform mechanical graining treatment with a rotating roller-type nylon brush while feeding an abrasive slurry in the form of a suspension (specific gravity, 1.12 g/cm$^3$) of an abrasive (pumice) in water to the surface of the aluminum alloy plate. FIG. 5 shows an aluminum alloy plate 1, roller-type brushes 2 and 4, an abrasive-containing slurry 3, and support rollers 5, 6, 7 and 8.

The abrasive had an average particle size of 40 μm and a maximum particle size of 100 μm. The nylon brushes were made of 6/10 nylon and had a bristle length of 50 mm and a bristle diameter of 0.3 mm. Each nylon brush was constructed of a 300 mm diameter stainless steel cylinder in which holes had been formed and bristles densely set. Three rotating brushes were used. Two support rollers (200 mm diameter) were provided below each brush and spaced 300 mm apart. The brush rollers were pressed against the aluminum alloy plate until the load on the driving motor that rotates the brushes was 7 kW greater than before the brush rollers were pressed against the plate. The direction in which the brushes were rotated was the same as the direction in which the aluminum plate was moved. The speed of rotation of the brushes was 200 rpm.

(b) Alkali Etching Treatment

The aluminum alloy plate was subjected to etching treatment by spraying with an aqueous solution having a sodium hydroxide concentration of 25 wt %, an aluminum ion concentration of 100 g/L and a temperature of 60° C. so as to dissolve 3 g/m$^2$ of material from the aluminum alloy plate. The plate was then rinsed by spraying with water.

(c) Desmutting Treatment

Desmutting treatment was carried out by spraying the plate with an aqueous sulfuric acid solution (concentration: 300 g/L) having a temperature of 35° C. and an aluminum ion concentration of 0.5 wt % from a spray line for 5 seconds and the plate was then rinsed by spraying with water.

(d) Electrolytic Graining Treatment

Thereafter, an electrolytic solution (solution temperature: 35° C.) in which the aluminum ion concentration was adjusted to 4.5 g/L by dissolving aluminum chloride in a 1 wt % aqueous hydrochloric acid solution, an AC power supply at 60 Hz and a flat cell type electrolytic cell were used to continuously carry out electrochemical graining treatment. A sinusoidal waveform was used in the AC power supply. In electrochemical graining treatment, the AC peak current density during the anodic reaction of the aluminum alloy plate was 30 A/dm$^2$. The ratio of the total amount of electricity furnished for the anodic reaction on the aluminum alloy plate to the total amount of electricity furnished for the cathodic reaction thereon was 0.95. The amount of electricity, which is the total amount of electricity when the aluminum alloy plate serves as an anode, was 480 C/dm$^2$. The electrolytic solution was circulated with a pump to agitate the inside of the electrolytic cell.

(e) Alkali Etching Treatment

Etching treatment was carried out by using a spray line to spray the aluminum alloy plate with an aqueous solution having a sodium hydroxide concentration of 5 wt %, an aluminum ion concentration of 5 g/L, and a temperature of 35° C. The amount of material removed by etching from the aluminum alloy plate having undergone electrolytic graining treatment was 0.05 g/m$^2$.

(f) Desmutting Treatment

Desmutting treatment was carried out by spraying the plate with an aqueous solution having a sulfuric acid concentration of 300 g/L, an aluminum ion concentration of 5 g/L and a solution temperature of 35° C. from a spray line for 5 seconds.

(j) Anodizing Treatment

Figure 6:
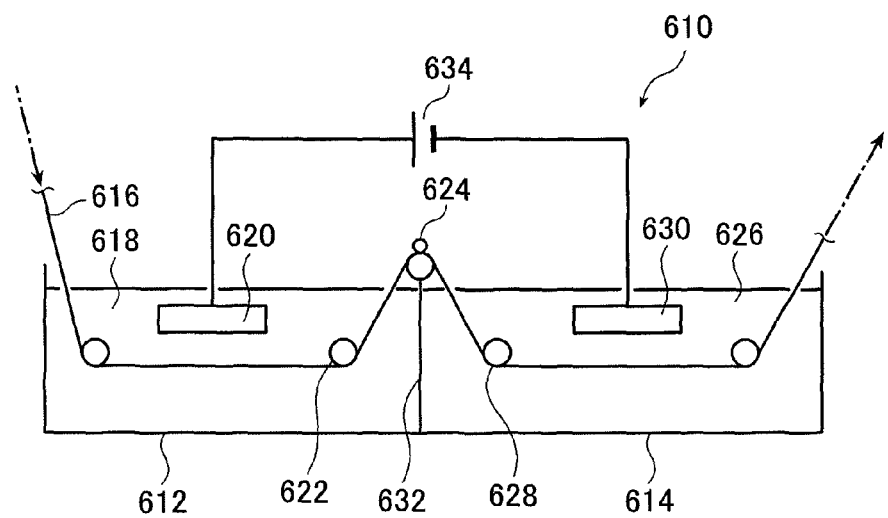
FIG. 6 is a schematic view of an anodizing apparatus that may be used to perform anodizing treatment.

An anodizing apparatus 610 of the configuration shown in FIG. 6 was used to carry out anodizing treatment. Sulfuric acid was used for the electrolytic solution 618, 626 for supplying to a first and a second electrolysis portion 612 and 614, respectively. Divider 632 separates the first and second portions. Power supply 634 supplies voltage to anode 620 and cathode 630 for anodizing treatment. Each electrolytic solution contained 170 g/L of sulfuric acid and 0.5 wt % of aluminum ions and had a temperature of 38° C. The plate was then rinsed by spraying with water. The anodization time was adjusted to obtain the final oxide film amount corresponding to the anodized film thickness shown in Table 3.

(k) Hydrophilizing Treatment (Treatment with Polyvinyl Phosphonic Acid)

The plate 616 conveyed by a set of rollers 622, 624, and 628 was immersed in an aqueous solution at 40° C. containing 4 g/L of polyvinyl phosphonic acid for 10 seconds, rinsed with pure water and dried. The temperature was 38° C. The plate was then rinsed by spraying with water.

[Manufacture of Presensitized Plate]

A photosensitive layer was formed by the following procedure on the supports in Examples and Comparative Examples obtained by the above-described procedure to thereby obtain presensitized plates.

(1) Formation of Photosensitive Layer

A photopolymerizable composition P-1 of the composition indicated below was applied onto the support to a dry coating weight of 1.4 g/m$^2$ and dried at 100° C. for 1 minute to form a photosensitive layer.

Photopolymerizable Composition P-1

| | |
|---|---|
| Polymerizable Compound (1) | 0.9 part by weight |
| Polymerizable Compound (2) | 4.5 parts by weight |
| Binder polymer (2) | 2.3 parts by weight |
| Sensitizing dye (1) | 0.4 part by weight |
| Polymerization initiator (1) | 0.9 part by weight |
| Chain transfer agent (1) | 0.5 part by weight |
| Dispersion of ε-phthalocyanine pigment | 0.9 part by weight |
| (pigment: 15 parts by weight, dispersant (allyl methacrylate/methacrylic acid copolymer (copolymerization molar ratio: 83/17)): 10 parts by weight; cyclohexanone: 15 parts by weight) | |
| Nonionic fluorosurfactant | 0.02 part by weight |
| (Megaface F780 (Dainippon Ink and Chemicals, Inc.)) | |
| Thermal Polymerization Inhibitor | 0.03 part by weight |
| (N-Nitrosophenylhydroxylamine aluminum salt) | |
| Methyl ethyl ketone | 58 parts by weight |
| Propylene glycol monomethyl ether acetate | 53 parts by weight |

[Chemical Formula 12]
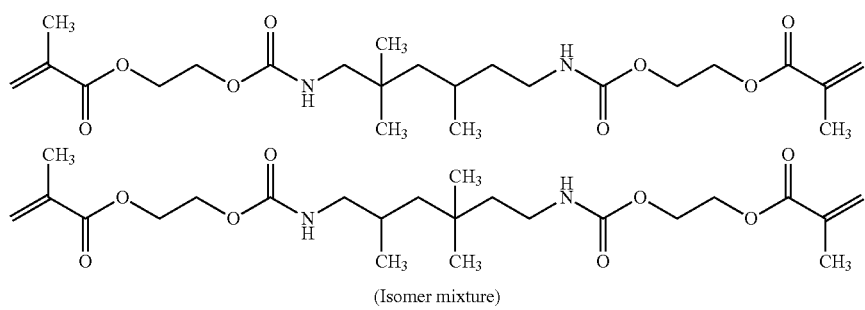
(Isomer mixture)
Polymerizable compound (1)
[Chemical Formula 13]
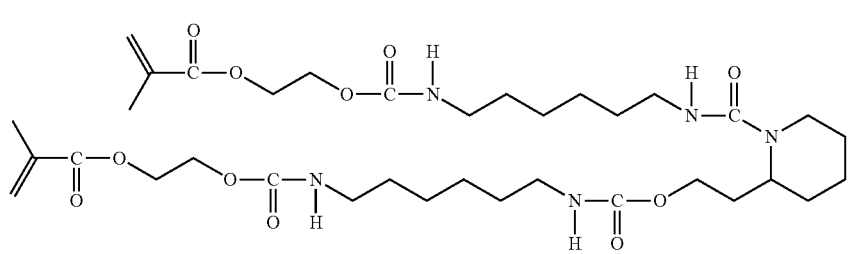
Polymerizable compound (2)
[Chemical Formula 14]
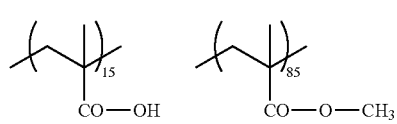
Binder polymer (2)
[Chemical Formula 15]
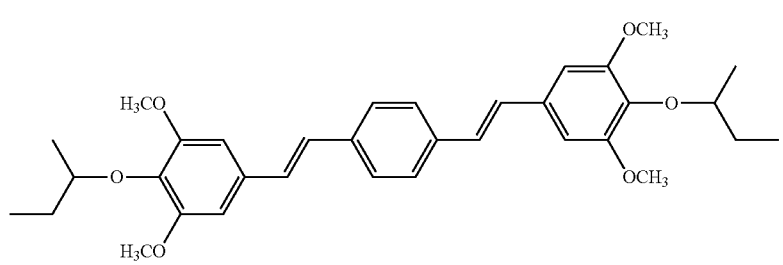
Sensitizing dye (1)
[Chemical Formula 16]
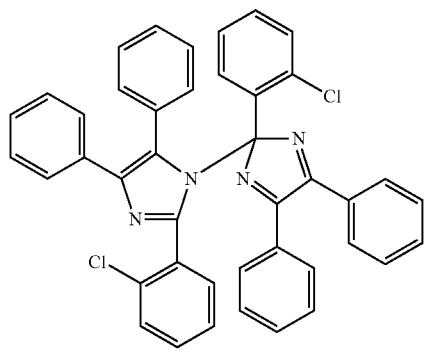
Polymerization initiator (1)
[Chemical Formula 17]
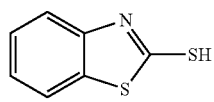

Chain Transfer Agent (1)

(2) Formation of Protective Layer

A protective layer-forming coating liquid of the composition indicated below was applied onto the photosensitive layer to a dry coating weight of 2.3 g/m² and dried at 125° C. for 75 seconds to form a protective layer to thereby obtain the presensitized plates in Examples and Comparative Examples.

Protective Layer-Forming Coating Liquid

| polyvinyl alcohol (degree of saponification: 95 mol %, degree of polymerization: 500) | 36 parts by weight |
|---|---|
| Polyvinyl pyrrolidone (molecular weight: 50,000) | 9 parts by weight |
| Poly(vinyl pyrrolidone/vinyl acetate (1/1)) molecular weight: 70,000) | 0.5 part by weight |
| Surfactant (EMALEX 710 available from Nihon Emulsion Co., Ltd.) | 0.5 part by weight |
| Water | 950 parts by weight |

[Evaluation of Presensitized Plate]

The presensitized plates obtained by the foregoing procedure were evaluated as described below. The results are shown in Table 3.

(1) Evaluation of Press Life

The presensitized plate obtained was subjected to imagewise drawing using Vx9600CTP (wavelength of light source: 405 nm, manufactured by FUJIFILM Corporation) while controlling the exposure amount on the surface of the presensitized plate to 0.05 mJ/cm². The image to be exposed was set to include a solid image. Then, the presensitized plate was preheated at a temperature of 115° C. for 12 seconds and developed using a PS processor (IP850HD, manufactured by G & J) fed with an alkali developer having the composition indicated below at the solution temperature of 25° C. for a development time of 28 seconds. As a finisher, an aqueous solution prepared by diluting FN-6 (FUJIFILM Corporation) with water at a ratio of 1:3 was used.

(Composition of Alkali Developer)

| Potassium hydroxide | 0.15 g |
|---|---|
| Polyoxyethylene naphthyl ether (n = 13) | 5.0 g |
| Chelest 400 (chelating agent) | 0.1 g |
| Water | 94.75 g |

The lithographic printing plate obtained was subjected to printing in a Lithrone printing press (Komori Corporation) using DIC-GEOS(N) black ink (Dainippon Ink and Chemicals, Inc.) and a mixture of etching solution EU-3 (FUJIFILM Corporation)/water/isopropyl alcohol=1/89/10 (volume ratio), and the press life was evaluated by the number of impressions at the time when the decrease in density of a solid image became visually recognizable. The results are shown in Table 3.

Very good: The number of impressions is 70,000 or more;
Good: The number of impressions is at least 50,000 but less than 70,000;
Fair: The number of impressions is at least 30,000 but less than 70,000;
Poor: The number of impressions is less than 30,000.

(2) Evaluation of Scumming Resistance

The blanket was visually inspected for staining after 10,000 impressions had been printed and evaluation was made based on the following criteria. The results are shown in Table 3.

Very good: The blanket is not stained;
Good: The blanket is slightly stained but is good;
Fair: The blanket is stained within a tolerable level;
Poor: The blanket is stained, causing impressions to be clearly stained;

(3) Evaluation of Resistance to White Spot Formation

The presensitized plate having the photosensitive layer and the protective layer formed therein was stored in an atmosphere having a humidity of 20 to 90% at room temperature for 3 months and evaluated as to whether or not defects occurred in the photosensitive layer. The results are shown in Table 3.

Excellent: The number of white spot defects is 120 pcs/m² or less.
Very good: The number of white spot defects is from 121 pcs/m² to 250 pcs/m².
Good: The number of white spot defects is from 251 pcs/m² to 350 pcs/m².
Fair: The number of white spot defects is from 351 pcs/m² to 500 pcs/m².
Poor: The number of white spot defects is from 501 pcs/m² to 600 pcs/m².
Very poor: The number of white spot defects is 601 pcs/m² or more.

TABLE 3

| | Thickness of anodized film (μm) | Press life | Scumming resistance | Evaluation result of white spot defect |
|---|---|---|---|---|
| EX 1 | 1.0 | Very good | Very good | Very good |
| EX 2 | 1.0 | Good | Good | Very good |
| EX 3 | 1.0 | Very good | Very good | Very good |
| EX 4 | 1.0 | Very good | Good | Excellent |
| EX 5 | 1.0 | Very good | Very good | Excellent |
| EX 6 | 1.0 | Very good | Very good | Good |
| EX 7 | 1.0 | Very good | Very good | Good |
| EX 8 | 1.0 | Very good | Very good | Fair |
| EX 9 | 1.3 | Very good | Very good | Excellent |
| EX 10 | 2.0 | Very good | Very good | Excellent |
| EX 11 | 1.0 | Very good | Very good | Good |
| EX 12 | 2.0 | Very good | Very good | Very good |
| CE 1 | 1.0 | Poor | Poor | Good |
| CE 2 | 1.0 | Poor | Poor | Poor |
| CE 3 | 1.0 | Poor | Poor | Very poor |
| CE 4 | 1.0 | Poor | Poor | Very poor |

Examples and Comparative Examples reveal that the number of white spot defects is reduced at an anodized film thickness of 1.3 μm or more compared to the number of aluminum carbide particles with a given size or more in the aluminum bulk.

Examples 13 to 27 and Comparative Examples 5 to 8 illustrated below are those concerning the second aspect of the invention.

Manufacture of Aluminum Alloy Plate

Examples 13 to 27

Each aluminum alloy melt of the composition shown in Table 4 was used to prepare an aluminum alloy plate by continuous casting including heat treatment (intermediate annealing) under the conditions shown in Table 5.

More specifically, the aluminum alloy melt of each composition was first continuously cast by a twin roll process to a cast plate thickness of 5.5 mm.

Then, the resulting continuously cast plate was subjected to cold rolling to a plate thickness of 0.9 mm, then subjected to intermediate annealing heat treatment under the conditions shown in Table 5, and further subjected to cold rolling again to be finished to a thickness of 0.3 mm.

Then, a tension lever was used to correct the flatness to prepare an aluminum alloy plate. The composition of each of the prepared aluminum alloy plates is the same as that of the aluminum alloy melt used therefor.

Comparative Examples 5 to 8

Each aluminum alloy melt of the composition shown in Table 4 was used to prepare an aluminum alloy plate by DC casting which involves no heat treatment.

More specifically, an aluminum alloy melt Al-5 was cast into a slab with a thickness of 500 mm by DC casting.

Then, both the surfaces of the resulting slab were scalped to a depth of 20 mm and heat treatment of the slab was carried out by soaking at 500 to 600° C.

Then, the slab was rolled to a thickness of 3 mm by hot rolling and subjected to intermediate annealing at 410 to 550° C. Then, the plate was finished to a thickness of 0.3 mm by cold rolling.

Then, a tension lever was used to correct the flatness to prepare an aluminum alloy plate. The composition of each of the prepared aluminum alloy plates is the same as that of the aluminum alloy melt used therefor.

The number per unit area of intermetallic compound particles in each of the prepared aluminum alloy plates was determined by the same procedure as described in Example 1. The results are shown in Table 5.

An X-ray diffractometer was used to determine the peak count of Al—Fe intermetallic compounds and α-AlFeSi in each of the prepared aluminum alloy plates under the following conditions. As for the Al—Fe intermetallic compounds, the peak count of $Al_3Fe$ and $Al_6Fe$ was determined and one of them having the maximum value was shown in Table 5 as the kind of Al—Fe intermetallic compound (kind of Al—Fe). $Al_3Fe$, $Al_6Fe$ and α-AlFeSi had peak angles of 24.1°, 18.0° and 42.0°, respectively. The peak count values are values of diffraction intensity (cps) measured at the respective angles. The results are shown in Table 5.

X-ray diffractometer: RAD-rR (12 kW rotary pair cathode type; Rigaku Corporation)

Set tube voltage: 50 kV;

Set tube current: 200 mA;

Sampling interval: 0.01°;

Scanning rate: 1°/min;

2θ Scan range: 10° to 70°; and

A graphite monochromator was used.

TABLE 4

| | | Aluminum alloy melt | | | | | |
|---|---|---|---|---|---|---|---|
| | Casting method | Si (wt %) | Fe (wt %) | Cu (wt %) | Ti (wt %) | Others (wt %) | Balance |
| EX 13 | Twin-roll | 0.08 | 0.31 | 0.002 | 0.020 | 0.05 or less | Al |
| EX 14 | continuous | 0.08 | 0.31 | 0.002 | 0.020 | 0.05 or less | Al |
| EX 15 | casting | 0.08 | 0.31 | 0.002 | 0.020 | 0.05 or less | Al |
| EX 16 | | 0.08 | 0.31 | 0.002 | 0.020 | 0.05 or less | Al |
| EX 17 | | 0.08 | 0.31 | 0.002 | 0.020 | 0.05 or less | Al |
| EX 18 | | 0.08 | 0.31 | 0.002 | 0.020 | 0.05 or less | Al |
| EX 19 | | 0.08 | 0.31 | 0.002 | 0.020 | 0.05 or less | Al |
| EX 20 | | 0.08 | 0.31 | 0.002 | 0.020 | 0.05 or less | Al |
| EX 21 | | 0.08 | 0.36 | 0.001 | 0.006 | 0.05 or less | Al |
| EX 22 | | 0.08 | 0.34 | 0.001 | 0.008 | 0.05 or less | Al |
| EX 23 | | 0.08 | 0.31 | 0.002 | 0.020 | 0.05 or less | Al |
| EX 24 | | 0.08 | 0.31 | 0.002 | 0.020 | 0.05 or less | Al |
| EX 25 | | 0.08 | 0.31 | 0.002 | 0.020 | 0.05 or less | Al |
| EX 26 | | 0.08 | 0.31 | 0.002 | 0.020 | 0.05 or less | Al |
| EX 27 | | 0.08 | 0.31 | 0.002 | 0.020 | 0.05 or less | Al |
| CE 5 | DC casting | 0.08 | 0.31 | 0.002 | 0.020 | 0.05 or less | Al |
| CE 6 | | 0.08 | 0.31 | 0.002 | 0.020 | 0.05 or less | Al |
| CE 7 | | 0.079 | 0.36 | 0.001 | 0.006 | 0.05 or less | Al |
| CE 8 | | 0.084 | 0.34 | 0.001 | 0.008 | 0.05 or less | Al |

TABLE 5

| | Heat treatment condition | Intermetallic compound | | | | |
|---|---|---|---|---|---|---|
| | | 0.2 μm or more (pcs/mm²) | 1 μm or more (pcs/mm²) | Al—Fe (cps) | Kind of Al—Fe | α-AlFeSi (cps) |
| EX 13 | 450° C. × 6 h | 41000 | 0 | 0 | — | 350 |
| EX 14 | 450° C. × 6 h | 41000 | 0 | 0 | — | 350 |
| EX 15 | 530° C. × 6 h | 41000 | 0 | 350 | $Al_3Fe$ | 20 |
| EX 16 | 530° C. × 9 h | 35500 | 0 | 350 | $Al_3Fe$ | 20 |
| EX 17 | 530° C. × 3 h | 76500 | 0 | 350 | $Al_3Fe$ | 20 |
| EX 18 | 580° C. × 3 h | 41000 | 780 | 380 | $Al_3Fe$ | 20 |
| EX 19 | 580° C. × 7 h | 39000 | 1550 | 550 | $Al_3Fe$ | 0 |
| EX 20 | 580° C. × 12 h | 37000 | 2470 | 620 | $Al_3Fe$ | 0 |
| EX 21 | 530° C. × 3 h | 47500 | 0 | 350 | $Al_3Fe$ | 20 |
| EX 22 | 550° C. × 4 h | 43000 | 0 | 350 | $Al_3Fe$ | 20 |
| EX 23 | 530° C. × 6 h | 41000 | 0 | 550 | $Al_3Fe$ | 20 |
| EX 24 | 580° C. × 12 h | 41000 | 0 | 1000 | $Al_3Fe$ | 0 |
| EX 25 | 580° C. × 12 h | 41000 | 0 | 100 | $Al_3Fe$ | 200 |

TABLE 5-continued

| | Heat treatment condition | Intermetallic compound | | | | |
|---|---|---|---|---|---|---|
| | | 0.2 μm or more (pcs/mm²) | 1 μm or more (pcs/mm²) | Al—Fe (cps) | Kind of Al—Fe | α-AlFeSi (cps) |
| EX 26 | 580° C. × 12 h | 41000 | 0 | 350 | Al₃Fe | 20 |
| EX 27 | 580° C. × 12 h | 41000 | 2470 | 350 | Al₃Fe | 20 |
| CE 5 | 410° C. × 2 h | 33500 | 50 | 350 | Al₆Fe | 20 |
| CE 6 | 550° C. × 12 h | 17700 | 2750 | 350 | Al₃Fe | 20 |
| CE 7 | 550° C. × 12 h | 15800 | 2980 | 350 | Al₃Fe | 20 |
| CE 8 | 550° C. × 12 h | 23500 | 1970 | 350 | Al₃Fe | 20 |

[Manufacture of Support]

Each of the prepared aluminum alloy plates was subjected to surface roughening treatment described below to obtain a support used for a presensitized plate.

The surface roughening treatment including the following treatments (b) to (g) was carried out. Rinsing treatment was carried out among all the treatment steps.

(b) Alkali Etching Treatment

The same procedure as that of alkali etching treatment (b) in Example 1 was carried out.

(c) Desmutting Treatment

The same procedure as that of desmutting treatment (c) in Example 1 was carried out.

(d) Electrolytic Graining Treatment

The same procedure as that of electrolytic graining treatment (d) in Example 1 was carried out.

(e) Alkali Etching Treatment

The same procedure as that of alkali etching treatment (e) in Example 1 was carried out.

(f) Desmutting Treatment

The same procedure as that of desmutting treatment (f) in Example 1 was carried out.

(g) Anodizing Treatment

Phosphoric acid was used as the electrolytic solution to carry out anodizing treatment. The electrolytic solution had a phosphoric acid concentration of 22 wt % and a temperature of 38° C. The plate was then rinsed by spraying with water. The final oxide film weight was 1.5 g/m².

As for the anodized film formed by the foregoing procedure, the average pore size in the surface layer of the anodized film (average surface pore size) and the average of the maximum diameter inside the micropores (average of the pore maximum diameter) were measured by the following procedures. The results are shown in Table 6.

Average surface pore size: An ultra-high resolution SEM (Hitachi S-900) was used to measure the pore size in the surface layer of the anodized film. A relatively low acceleration voltage of 12 V was used to observe the surface at a magnification of 150,000× without vapor deposition treatment for imparting electrical conductivity, and 50 pores were randomly selected to obtain an average. The standard deviation error was ±10% or less.

Method of measuring the average of the maximum diameter inside the pores: The maximum diameter inside the micropores was measured by folding the aluminum alloy plate having undergone anodizing treatment and observing the lateral surface (commonly called fracture surface) cracked during the folding with an ultra-high resolution SEM (Hitachi S-900). A relatively low acceleration voltage of 12V was used to observe the maximum diameter portions inside the micropores as seen on the fracture surface of the anodized film at a magnification of 150,000× without vapor deposition treatment for imparting electrical conductivity, and 50 pores were randomly selected to obtain an average. The standard deviation error was ±10% or less.

TABLE 6

| | Anodized film | |
|---|---|---|
| | Average surface pore size (nm) | Average of pore maximum diameter (nm) |
| EX 13 | 10 | 10 |
| EX 14 | 10 | 10 |
| EX 15 | 10 | 10 |
| EX 16 | 10 | 10 |
| EX 17 | 10 | 10 |
| EX 18 | 10 | 10 |
| EX 19 | 10 | 10 |
| EX 20 | 10 | 10 |
| EX 21 | 10 | 10 |
| EX 22 | 10 | 10 |
| EX 23 | 10 | 10 |
| EX 24 | 10 | 10 |
| EX 25 | 10 | 10 |
| EX 26 | 35 | 67 |
| EX 27 | 35 | 67 |
| CE 5 | 10 | 10 |
| CE 6 | 10 | 10 |
| CE 7 | 10 | 10 |
| CE 8 | 10 | 10 |

[Manufacture of Presensitized Plate]

An image recording layer was formed by the following procedure on the supports obtained by the above-described procedure to thereby obtain presensitized plates.

An image forming layer-forming coating liquid of the composition indicated below was applied to a thickness of 30 g/m² and dried.

| | |
|---|---|
| Hydrophobic thermoplastic polymer particles (styrene/acrylonitrile copolymer particles at a molar ratio of 60/40; average diameter of dried particles: 65 nm) | 2.0 g |
| Infrared absorbing dye (I) | 0.3 g |
| Polyacrylic acid (Glascol D15 available from Allied Colloids) | 0.4 g |
| Colorant (I) | 0.3 g |
| Water | 97.0 g |

[Chemical Formula 18]

Infrared absorbing dye (I)

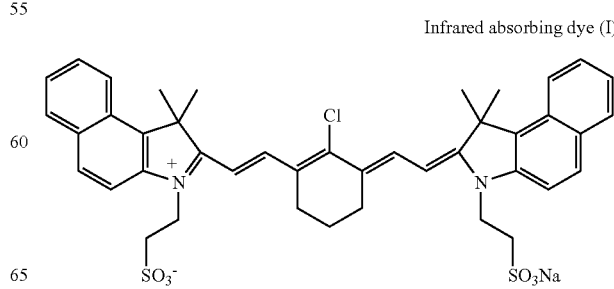

[Chemical Formula 19]

Colorant (I)

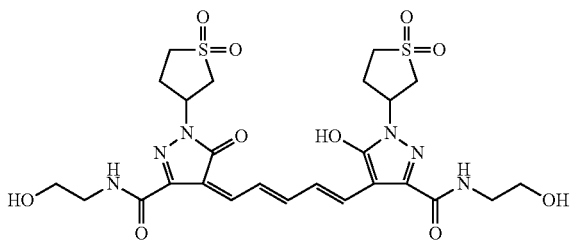

The thus obtained presensitized plate was exposed under conditions of a plate surface energy of 200 mJ/cm² and a resolution of 2,400 dpi using Trendsetter 3244VFS (Creo) equipped with a water cooling type 40 W infrared semiconductor laser and thereafter developed using an automatic processor having two rotating brush rolls of the same mechanism as that shown in FIG. 5. The image to be exposed was set to contain a solid image and a 50% halftone dot chart of a 25 μm-dot FM screen. The rotating brush rolls used included a first brush roll with an outer diameter of 90 mm in which polybutylene terephthalate fibers with a bristle diameter of 200 μm and a bristle length of 17 mm were implanted and which was rotated in the same direction as the travel direction at 200 rpm (at a brush edge peripheral speed of 0.94 m/sec) and a second brush roll with an outer diameter of 60 mm in which polybutylene terephthalate fibers with a bristle diameter of 200 μm and a bristle length of 17 mm were implanted and which was rotated in the opposite direction from the travel direction at 200 rpm (at a brush edge peripheral speed of 0.63 m/sec). The presensitized plate was transported at a travel speed of 100 cm/min. The treatment solution 1 was used. The treatment solution was showered through a spray pipe by a circulation pump to be supplied to the plate surface.

<Treatment Solution 1>

To 700 g of deionized water were added with stirring 77.3 mL of Dowfax 3B2 (alkyl diphenyl ether disulfonate available from The Dow Chemical Company), 32.6 g of trisodium citrate dihydrate and 9.8 g of citric acid. Deionized water was further added up to a weight of 1,000 g. The pH was about 5.0.

[Evaluation of Presensitized Plate]

The presensitized plates obtained by the foregoing procedure were evaluated as described below. The results are shown in Table 7.

(1) Evaluation of Press Life

The resulting lithographic printing plate was mounted on the cylinder of a printing press SOR-M (Heidelberger) and printing was performed. The fountain solution used was an aqueous solution containing 4 vol % of IF-102 (FUJIFILM Corporation) and the ink used was TK HIGH-ECO-SOYMZ black (Toyo Ink Co., Ltd.). Printing was performed on Tokubishi art paper (76.5 kg) at a printing speed of 10,000 impressions per hour.

The image recording layer was gradually worn away with increasing number of impressions, thus reducing the ink density on the printed paper. The halftone dot area ratio of the 50% halftone dot of FM screen on printed paper was measured with a Gretag densitometer and the number of impressions at which the measured value was reduced by 5% from the value measured in the 100th impression was regarded as the print end number. The press life was evaluated based on the print end number. The results are shown in Table 4 (see below for the criteria: "very good" "good" "fair" and "poor."

Very good: The number of impressions is 50,000 or more;
Good: The number of impressions is at least 40,000 but less than 50,000;
Fair: The number of impressions is at least 30,000 but less than 40,000;
Poor: The number of impressions is less than 30,000.

(2) Evaluation of Scumming Resistance

Evaluation was made in the same manner as in (2) Evaluation of Scumming Resistance in Examples 1 to 12 and Comparative Examples 1 to 4.

(4) Evaluation of Resistance to Formation of Corrosive Micro-Stains

The resulting presensitized plate was conditioned with a slip sheet at 25° C. and 70% RH for 1 hour, wrapped with aluminum kraft paper and heated in an oven set at 60° C. for 5 days.

Then, the temperature was lowered to room temperature and the presensitized plate was developed without exposure to light in the same manner as in the evaluation of the press life.

Then, the resulting lithographic printing plate was mounted on the cylinder of a printing press SOR-M (Heidelberger) and printing was performed. The fountain solution used was an aqueous solution containing 4 vol % of IF-102 (FUJIFILM Corporation) and the ink used was TK HIGH-ECO-SOYMZ black (Toyo Ink Co., Ltd.). Printing was performed on Tokubishi art paper (76.5 kg) at a printing speed of 10,000 impressions per hour to obtain 500 impressions.

The 500th impression was visually inspected and the number per 100 cm² of print stains with a size of at least 20 μm was counted. The results are shown in Table.

Excellent: The number of corrosive micro-stains is up to 20 (per 80 cm²);
Very good: The number of corrosive micro-stains is from 21 to 50 (per 80 cm²);
Good: The number of corrosive micro-stains is from 51 to 80 (per 80 cm²);
Fair: The number of corrosive micro-stains is from 81 to 100 (per 80 cm²);
Poor: The number of corrosive micro-stains is from 101 to 150 (per 80 cm²);
Very poor: The number of corrosive micro-stains is 151 or more (per 80 cm²).

At a number of stains of up to 200 per 100 cm², the presensitized plate can be rated as having good resistance to severe scumming.

TABLE 7

|       | Press life | Scumming resistance | Evaluation result of corrosive micro-stains |
|-------|-----------|---------------------|---------------------------------------------|
| EX 13 | Very good | Very good           | Excellent                                   |
| EX 14 | Very good | Very good           | Very good                                   |
| EX 15 | Very good | Very good           | Good                                        |
| EX 16 | Good      | Good                | Good                                        |
| EX 17 | Very good | Very good           | Very good                                   |
| EX 18 | Very good | Very good           | Very good                                   |
| EX 19 | Very good | Very good           | Good                                        |
| EX 20 | Very good | Very good           | Fair                                        |
| EX 21 | Very good | Very good           | Good                                        |
| EX 22 | Very good | Very good           | Good                                        |
| EX 23 | Very good | Very good           | Good                                        |
| EX 24 | Very good | Very good           | Fair                                        |
| EX 25 | Very good | Very good           | Good                                        |
| EX 26 | Very good | Very good           | Very good                                   |
| EX 27 | Very good | Very good           | Good                                        |
| CE 5  | Poor      | Poor                | Poor                                        |
| CE 6  | Poor      | Poor                | Very poor                                   |
| CE 7  | Poor      | Poor                | Very poor                                   |
| CE 8  | Poor      | Poor                | Very poor                                   |

Examples 28 to 50 and Comparative Examples 9 to 14 illustrated below are those concerning the third aspect of the invention.

Manufacture of Aluminum Alloy Plate

Examples 28 to 50

Each aluminum alloy melt of the composition shown in Table 8 was used to prepare an aluminum alloy plate by hot continuous casting including heat treatment (intermediate annealing) under the conditions shown in Table 9.

More specifically, the aluminum alloy melt of each composition was first continuously cast by a twin roll process to a cast plate thickness of 5.5 mm.

Then, the resulting continuously cast plate was subjected to cold rolling to a plate thickness of 0.9 mm, then subjected to intermediate annealing heat treatment under the conditions shown in Table 2, and further subjected to cold rolling again to be finished to a thickness of 0.3 mm.

Then, a tension lever was used to correct the flatness to prepare an aluminum alloy plate. The composition of each of the prepared aluminum alloy plates is the same as that of the aluminum alloy melt used therefor.

Comparative Examples 9 and 14

Each aluminum alloy melt of the composition shown in Table 8 was used to prepare an aluminum alloy plate by DC casting.

More specifically, an aluminum alloy melt Al-5 was cast into a slab with a thickness of 500 mm by DC casting.

Then, both the surfaces of the resulting slab were scalped to a depth of 20 mm and heat treatment of the slab was carried out by soaking at 500 to 600° C.

Then, the slab was rolled to a thickness of 3 mm by hot rolling and subjected to intermediate annealing at 410 to 550° C. Then, the plate was finished to a thickness of 0.3 mm by cold rolling.

Then, a tension lever was used to correct the flatness to prepare an aluminum alloy plate. The composition of each of the prepared aluminum alloy plates is the same as that of the aluminum alloy melt used therefor.

The number per unit area of intermetallic compound particles in each of the prepared aluminum alloy plates was determined by the same procedure as described in Example 1. The peak count of Al—Fe intermetallic compounds and α-AlFeSi in each aluminum alloy plate was determined by the same method as in Example 13. The results are shown in Table 9.

TABLE 8

| | | Aluminum alloy melt | | | | | |
|---|---|---|---|---|---|---|---|
| | Casting method | Si (wt %) | Fe (wt %) | Cu (wt %) | Ti (wt %) | Others (wt %) | Balance |
| EX 28 | Twin-roll | 0.08 | 0.31 | 0.002 | 0.020 | 0.05 or less | Al |
| EX 29 | continuous | 0.08 | 0.31 | 0.002 | 0.020 | 0.05 or less | Al |
| EX 30 | casting | 0.08 | 0.31 | 0.002 | 0.020 | 0.05 or less | Al |
| EX 31 | | 0.08 | 0.31 | 0.002 | 0.020 | 0.05 or less | Al |
| EX 32 | | 0.08 | 0.31 | 0.002 | 0.020 | 0.05 or less | Al |
| EX 33 | | 0.08 | 0.31 | 0.002 | 0.020 | 0.05 or less | Al |
| EX 34 | | 0.08 | 0.31 | 0.002 | 0.020 | 0.05 or less | Al |
| EX 35 | | 0.08 | 0.31 | 0.002 | 0.020 | 0.05 or less | Al |
| EX 36 | | 0.08 | 0.36 | 0.010 | 0.006 | 0.05 or less | Al |
| EX 37 | | 0.08 | 0.34 | 0.010 | 0.008 | 0.05 or less | Al |
| EX 38 | | 0.08 | 0.31 | 0.002 | 0.020 | 0.05 or less | Al |
| EX 39 | | 0.08 | 0.31 | 0.002 | 0.020 | 0.05 or less | Al |
| EX 40 | | 0.08 | 0.31 | 0.002 | 0.020 | 0.05 or less | Al |
| EX 41 | | 0.08 | 0.31 | 0.002 | 0.020 | 0.05 or less | Al |
| EX 42 | | 0.08 | 0.31 | 0.002 | 0.020 | 0.05 or less | Al |
| EX 43 | | 0.08 | 0.31 | 0.002 | 0.020 | 0.05 or less | Al |
| EX 44 | | 0.08 | 0.31 | 0.002 | 0.020 | 0.05 or less | Al |
| EX 45 | | 0.08 | 0.31 | 0.002 | 0.020 | 0.05 or less | Al |
| EX 46 | | 0.08 | 0.31 | 0.002 | 0.020 | 0.05 or less | Al |
| EX 47 | | 0.08 | 0.31 | 0.002 | 0.020 | 0.05 or less | Al |
| EX 48 | | 0.08 | 0.31 | 0.002 | 0.020 | 0.05 or less | Al |
| EX 49 | | 0.08 | 0.31 | 0.002 | 0.020 | 0.05 or less | Al |
| EX 50 | | 0.08 | 0.31 | 0.002 | 0.020 | 0.05 or less | Al |
| CE 9 | DC casting | 0.08 | 0.31 | 0.002 | 0.020 | 0.05 or less | Al |
| CE 10 | | 0.08 | 0.31 | 0.002 | 0.020 | 0.05 or less | Al |
| CE 11 | | 0.079 | 0.36 | 0.001 | 0.006 | 0.05 or less | Al |
| CE 12 | | 0.084 | 0.34 | 0.001 | 0.008 | 0.05 or less | Al |
| CE 13 | | 0.08 | 0.31 | 0.002 | 0.008 | 0.05 or less | Al |
| CE 14 | | 0.08 | 0.31 | 0.002 | 0.020 | 0.05 or less | Al |

TABLE 9

| | Heat treatment condition | Intermetallic compound | | | | |
|---|---|---|---|---|---|---|
| | | 0.2 μm or more (pcs/mm$^2$) | 0.1 μm or more (pcs/mm$^2$) | Al—Fe (cps) | Kind of Al—Fe | α-AlFeSi (cps) |
| EX 28 | 450° C. × 6 h | 41000 | 0 | 0 | — | 350 |
| EX 29 | 450° C. × 6 h | 41000 | 0 | 0 | — | 350 |
| EX 30 | 530° C. × 6 h | 41000 | 0 | 350 | Al$_3$Fe | 20 |

TABLE 9-continued

| | Heat treatment condition | Intermetallic compound | | | | |
|---|---|---|---|---|---|---|
| | | 0.2 μm or more (pcs/mm²) | 0.1 μm or more (pcs/mm²) | Al—Fe (cps) | Kind of Al—Fe | α-AlFeSi (cps) |
| EX 31 | 530° C. × 9 h | 35500 | 0 | 350 | Al₃Fe | 20 |
| EX 32 | 530° C. × 3 h | 76500 | 0 | 350 | Al₃Fe | 20 |
| EX 33 | 580° C. × 3 h | 41000 | 780 | 380 | Al₃Fe | 20 |
| EX 34 | 580° C. × 7 h | 39000 | 1550 | 550 | Al₃Fe | 0 |
| EX 35 | 580° C. × 12 h | 37000 | 2470 | 620 | Al₃Fe | 0 |
| EX 36 | 530° C. × 3 h | 47500 | 0 | 350 | Al₃Fe | 20 |
| EX 37 | 550° C. × 4 h | 43000 | 0 | 350 | Al₃Fe | 20 |
| EX 38 | 530° C. × 6 h | 41000 | 0 | 350 | Al₃Fe | 20 |
| EX 39 | 580° C. × 12 h | 37000 | 2470 | 620 | Al₃Fe | 0 |
| EX 40 | 580° C. × 12 h | 37000 | 2470 | 620 | Al₃Fe | 0 |
| EX 41 | 580° C. × 12 h | 37000 | 2470 | 620 | Al₃Fe | 0 |
| EX 42 | 580° C. × 12 h | 37000 | 2470 | 620 | Al₃Fe | 0 |
| EX 43 | 580° C. × 12 h | 37000 | 2470 | 620 | Al₃Fe | 0 |
| EX 44 | 570° C. × 2 h | 38000 | 70 | 550 | Al₃Fe | 20 |
| EX 45 | 570° C. × 4 h | 41000 | 1250 | 1000 | Al₃Fe | 0 |
| EX 46 | 500° C. × 6 h | 41000 | 0 | 100 | Al₃Fe | 200 |
| EX 47 | 530° C. × 6 h | 41000 | 0 | 350 | Al₃Fe | 20 |
| EX 48 | 430° C. × 8 h | 65000 | 0 | 0 | — | 350 |
| EX 49 | 430° C. × 8 h | 65000 | 0 | 0 | — | 350 |
| EX 50 | 580° C. × 12 h | 37000 | 2470 | 620 | Al₃Fe | 0 |
| CE 9 | 410° C. × 2 h | 33500 | 50 | 350 | Al₆Fe | 20 |
| CE 10 | 550° C. × 12 h | 17700 | 2750 | 430 | Al₃Fe | 0 |
| CE 11 | 550° C. × 12 h | 15800 | 2980 | 420 | Al₃Fe | 0 |
| CE 12 | 550° C. × 12 h | 23500 | 1970 | 440 | Al₃Fe | 0 |
| CE 13 | 410° C. × 2 h | 33500 | 50 | 350 | Al₆Fe | 20 |
| CE 14 | 550° C. × 12 h | 17700 | 2750 | 430 | Al₃Fe | 0 |

[Manufacture of Support]

Each of the prepared aluminum alloy plates was subjected to surface roughening treatment described below to obtain a support used for a presensitized plate.

The surface roughening treatment including the following treatments (a) to (k) was carried out. Rinsing treatment was carried out among all the treatment steps.

(a) Mechanical Graining Treatment (Brush Graining)

The same procedure as that of mechanical graining treatment (a) in Example 1 was carried out.

(b) Alkali Etching Treatment

The same procedure as that of alkali etching treatment (b) in Example 1 was carried out.

(c) Desmutting Treatment

The same procedure as that of desmutting treatment (c) in Example 1 was carried out.

(d) Electrolytic Graining Treatment

Electrochemical graining treatment was consecutively carried out using a 60 Hz AC voltage. The electrolytic solution was an aqueous solution containing 10.5 g/L of nitric acid, 5 g/L of aluminum ions and 0.007 wt % of ammonium ions and had a solution temperature of 50° C. The alternating current waveform was as shown in FIG. 1 and electrochemical graining treatment was carried out for a period of time TP until the current reached a peak from zero of 0.8 ms, at a duty ratio of 1:1, using an alternating current having a trapezoidal waveform, and with a carbon electrode as the counter electrode. A ferrite was used for the auxiliary anode. An electrolytic cell of the type shown in FIG. 2 was used.

The current density at the current peak was 30 A/dm². The amount of electricity, which is the total amount of electricity when the aluminum alloy plate serves as an anode, was 220 C/dm². Of the current that flows from the power supply, 5% was diverted to the auxiliary anode.

The plate was then rinsed by spraying with water.

(e) Alkali Etching Treatment

The same procedure as that of alkali etching treatment (e) in Example 1 was carried out.

(f) Desmutting Treatment

Desmutting treatment was carried out by spraying the plate with an aqueous solution having a sulfuric acid concentration of 15 wt % (aluminum ion content, 4.5 wt %) and a temperature of 30° C. The plate was then rinsed by spraying with water. The aqueous nitric acid solution used in desmutting treatment was wastewater from the electrolytic graining treatment step performed with alternating current in an aqueous nitric acid solution.

(g) Electrolytic Graining Treatment

Electrochemical graining treatment was consecutively carried out using a 60 Hz AC voltage. The electrolytic solution was an aqueous solution containing 7.5 g/L of hydrochloric acid and 5 g/L of aluminum ions, and had a temperature of 35° C. The alternating current waveform was as shown in FIG. 1 and electrochemical graining treatment was carried out for a period of time TP until the current reached a peak from zero of 0.8 ms, at a duty ratio of 1:1, using an alternating current having a trapezoidal waveform, and with a carbon electrode as the counter electrode. A ferrite was used for the auxiliary anode. An electrolytic cell of the type shown in FIG. 2 was used.

The current density at the current peak was 25 A/dm². The amount of electricity, which is the total amount of electricity when the aluminum alloy plate serves as an anode, was 50 C/dm². Of the current that flows from the power supply, 5% was diverted to the auxiliary anode.

The plate was then rinsed by spraying with water.

(h) Alkali Etching Treatment

The aluminum alloy plate was subjected to etching treatment by spraying with an aqueous solution having a sodium hydroxide concentration of 26 wt % and an aluminum ion concentration of 6.5 wt % at a temperature of 32° C. so as to dissolve 0.5 g/m² of material from the aluminum alloy plate. The aluminum hydroxide-based smut ingredient generated in the previous electrolytic graining treatment using alternating current was removed and the edges of the pits formed were dissolved and thereby smoothed. The plate was then rinsed by spraying with water.

(i) Desmutting Treatment

Desmutting treatment was carried out by spraying the plate with an aqueous solution having a sulfuric acid concentration of 25 wt % (aluminum ion content, 0.5 wt %) and a temperature of 60° C. The plate was then rinsed by spraying with water.

(j) Anodizing Treatment

The same procedure as that of anodizing treatment (g) in Example 13 was carried out.

As for the anodized film formed, the average pore size in the surface layer of the anodized film (average surface pore size) and the average of the maximum diameter inside the micropores (average of the pore maximum diameter) were measured by the same procedures as in Example 13. The results are shown in Table 10.

(k) Hydrophilizing Treatment

Hydrophilizing treatment (alkali metal silicate treatment) was carried out by 10 seconds of immersion in a treatment tank containing a 1 wt % aqueous solution of No. 3 sodium silicate at a solution temperature of 20° C. The plate was then rinsed by spraying with well water.

[Manufacture of Presensitized Plate]

An image recording layer was formed by the following procedure on the supports obtained by the above-described procedure to thereby obtain presensitized plates.

(1) Formation of Undercoat Layer

Then, an undercoat layer-forming coating liquid (1) indicated below was applied onto each support manufactured by the foregoing procedure to a dry coating weight of 20 mg/m² to thereby form an undercoat layer on the support.

<Undercoat Layer-Forming Coating Liquid (1)>

| | |
|---|---|
| Undercoating compound (1) of the structure shown below | 0.18 g |
| Hydroxyethylimino diacetic acid | 0.10 g |
| Methanol | 55.24 g |
| Water | 6.15 g |

[Chemical Formula 20]

Undercoating compound (1)

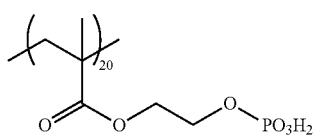

[Chemical Formula 21]

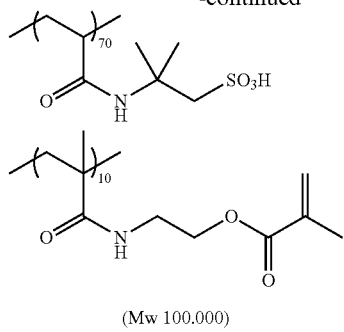

(Mw 100.000)

(2) Formation of Image Recording Layer

An image recording layer-forming coating liquid (1) indicated below was applied by bar coating onto the support having the undercoat layer formed thereon and dried in an oven at 70° C. for 60 seconds to form an image recording layer having a dry coating weight of 0.6 g/m², thereby obtaining a presensitized plate.

<Image Recording Layer-Forming Coating Liquid (1)>

| | |
|---|---|
| Aqueous dispersion of polymer fine particles (1) | 20.0 g |
| Infrared absorbing dye (2) [its structure is shown below] | 0.2 g |
| Polymerization initiator Irgacure 250 (Ciba Specialty Chemicals Inc.) | 0.5 g |
| Polymerizable compound SR-399 (Sartomer) | 1.50 g |
| Mercapto-3-triazole | 0.2 g |
| BYK 336 (Byk Chimie) | 0.4 g |
| Klucel M (Hercules) | 4.8 g |
| ELVACITE 4026 (Ineos Acrylica) | 2.5 g |
| n-Propanol | 55.0 g |
| 2-Butanone | 17.0 g |

The compounds indicated using their trade names in the above composition are shown below.

IRGACURE 250: (4-Methoxyphenyl)[4-(2-methylpropyl)phenyl]iodonium hexafluorophosphate (75 wt % propylene carbonate solution)

SR-399: Dipentaerythritol pentaacrylate

BYK 336: Modified dimethylpolysiloxane copolymer (25 wt % xylene/methoxypropyl acetate solution)

KLUCEL M: Hydroxypropyl cellulose (2 wt % aqueous solution)

ELVACITE 4026: Highly branched polymethyl methacrylate (10 wt % 2-butanone solution)

Infrared absorbing dye (2)

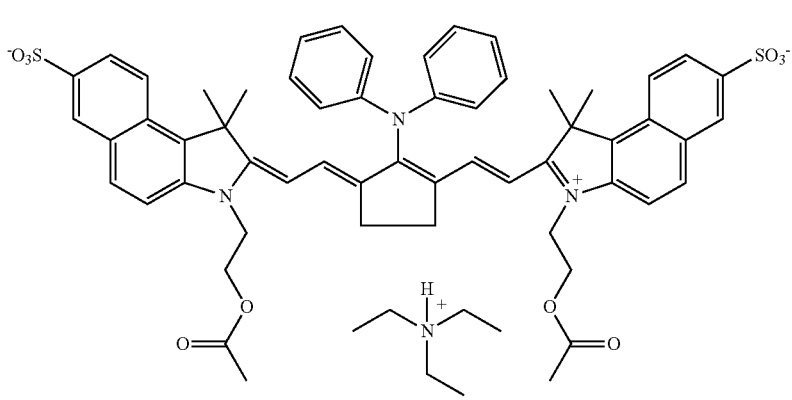

(Preparation of Aqueous Dispersion of Polymer Fine Particles (1))

A stirrer, a thermometer, a dropping funnel, a nitrogen inlet tube and a reflux condenser were attached to a 1,000 ml four-necked flask, and while carrying out deoxygenation by introduction of nitrogen gas, 20 g of polyethylene glycol methyl ether methacrylate (PEGMA, the average number of repeating units of ethylene glycol chain (EO chain) in Examples 28 to 39 and 44 to 50, and Comparative Examples 9 to 14 was 9 and that in Examples 40 to 43 was changed as shown in Table 10), 200 g of distilled water and 200 g of n-propanol were charged therein and heated until the internal temperature reached 70° C. Then, a previously prepared mixture of 10 g of styrene (St), 70 g of acrylonitrile (AN) and 0.8 g of 2,2'-azobisisobutyronitrile was added dropwise to the flask over a period of one hour. After the completion of the dropwise addition, the reaction was allowed to proceed for 5 hours. Then, 0.4 g of 2,2'-azobisisobutyronitrile was added and the internal temperature was raised to 80° C. Subsequently, 0.5 g of 2,2'-azobisisobutyronitrile was added over a period of 6 hours. 98% or more of the polymerization proceeded at the end of the reaction for in total 20 hours and an aqueous dispersion of polymer fine particles (1) (PEGMA/St/AN=20/10/80 (weight ratio)) was obtained. The particle size distribution of the polymer fine particles had a maximum value at the particle size of 150 nm.

The particle size distribution was determined by taking an electron micrograph of the polymer fine particles, measuring the particle size of in total 5,000 fine particles on the micrograph, and dividing the range from the largest value of the particle size measured to 0 on a logarithmic scale into 50 parts to obtain the occurrence rate of each particle size by plotting. The particle size of a spherical particle having the same particle area as that of an aspherical particle on the micrograph was defined as the particle size of the aspherical particle.

(3) Formation of Oxygen Shield Layer

In the supports described to have an oxygen shield layer in Table 10, an oxygen shield layer-forming coating liquid (1) of the composition indicated below was further applied by bar coating onto the image recording layer and dried in an oven at 120° C. for 60 seconds to form an oxygen shield layer having a dry coating weight of 0.15 g/m², thereby obtaining presensitized plates.

<Oxygen Shield Layer-Forming Coating Liquid (1)>

| | |
|---|---|
| Dispersion of inorganic layered compound (1) | 1.5 g |
| 6 wt % Aqueous solution of polyvinyl alcohol (CKS50 available from Nippon Synthetic Chemical Industry Co., Ltd.; modified with sulfonic acid; degree of saponification: at least 99 mol %; degree of polymerization: 300) | 0.55 g |
| 6 wt % Aqueous solution of polyvinyl alcohol (PVA-405 available from Kuraray Co., Ltd.; degree of saponification: 81.5 mol %; degree of polymerization: 500) | 0.03 g |
| 1 wt % Aqueous solution of the surfactant (EMALEX 710 available from Nihon Emulsion Co., Ltd.) | 0.86 g |
| Ion exchanged water | 6.0 g |

(Preparation of Dispersion of Inorganic Layered Compound (1))

To 193.6 g of ion-exchanged water was added 6.4 g of synthetic mica Somasif ME-100 (available from Co-Op Chemical Co., Ltd.) and the mixture was dispersed in a homogenizer to an average particle size as measured by a laser scattering method of 3 μm. The resulting dispersed particles had an aspect ratio of at least 100.

TABLE 10

| | Anodized film | | Image recording layer | |
|---|---|---|---|---|
| | Average surface pore size (nm) | Average of pore maximum diameter (nm) | Oxygen shield layer | EO chain |
| EX 28 | 10 | 10 | Formed | 9 |
| EX 29 | 10 | 10 | Unformed | 9 |
| EX 30 | 10 | 10 | Unformed | 9 |
| EX 31 | 10 | 10 | Unformed | 9 |
| EX 32 | 10 | 10 | Unformed | 9 |
| EX 33 | 10 | 10 | Unformed | 9 |
| EX 34 | 10 | 10 | Unformed | 9 |
| EX 35 | 10 | 10 | Unformed | 9 |
| EX 36 | 10 | 10 | Unformed | 9 |
| EX 37 | 10 | 10 | Unformed | 9 |
| EX 38 | 10 | 10 | Formed | 9 |
| EX 39 | 10 | 10 | Formed | 9 |
| EX 40 | 10 | 10 | Formed | 3 |
| EX 41 | 10 | 10 | Formed | 7 |
| EX 42 | 10 | 10 | Formed | 12 |
| EX 43 | 10 | 10 | Formed | 30 |
| EX 44 | 10 | 10 | Unformed | 9 |
| EX 45 | 10 | 10 | Unformed | 9 |
| EX 46 | 10 | 10 | Unformed | 9 |
| EX 47 | 35 | 67 | Unformed | 9 |
| EX 48 | 10 | 10 | Formed | 9 |
| EX 49 | 35 | 67 | Formed | 9 |
| EX 50 | 35 | 67 | Unformed | 9 |
| CE 9 | 10 | 10 | Unformed | 9 |
| CE 10 | 10 | 10 | Unformed | 9 |
| CE 11 | 10 | 10 | Unformed | 9 |
| CE 12 | 10 | 10 | Unformed | 9 |
| CE 13 | 10 | 10 | Formed | 9 |
| CE 14 | 10 | 10 | Formed | 9 |

[Evaluation of Presensitized Plate]

The presensitized plates obtained by the foregoing procedure were evaluated as described below. The results are shown in Table 11.

(1) Evaluation of Press Life

The resulting presensitized plate was exposed by Luxel PLATESETTER T-6000III from FUJIFILM Corporation equipped with an infrared semiconductor laser at an external drum rotational speed of 1,000 rpm, a laser power of 70% and a resolution of 2,400 dpi. The image to be exposed was set to contain a solid image and a 50% halftone dot chart of a 20 μm-dot FM screen.

The resulting presensitized plate after exposure was mounted without development process on the plate cylinder of a Lithrone 26 printing press (Komori Corporation). A fountain solution Ecolity-2 (FUJIFILM Corporation)/tap water at a volume ratio of 2/98 and Values-G (N) black ink (Dainippon Ink and Chemicals, Inc.) were used. The fountain solution and the ink were supplied by the standard automatic printing start-up procedure on the Lithrone 26 to perform on-press development, and printing was made on Tokubishi art paper (76.5 kg) at a printing speed of 10,000 impressions per hour.

The image recording layer was gradually worn away with increasing number of impressions, thus reducing the ink density on the printed paper. The halftone dot area ratio of the 50% halftone dot of FM screen on printed paper was measured with a Gretag densitometer and the number of impressions at which the measured value was reduced by 5% from the value measured in the 100th impression was regarded as the print end number. The press life was evaluated based on the print end number. The results are shown in Table 11 (see below for the criteria: "very good" "good" "fair" and "poor."

Very good: The number of impressions is 50,000 or more;
Good: The number of impressions is at least 40,000 but less than 50,000;
Fair: The number of impressions is at least 30,000 but less than 40,000;
Poor: The number of impressions is less than 30,000.

(2) Evaluation of Scumming Resistance

Evaluation was made in the same manner as in (2) Evaluation of Scumming Resistance in Example 1.

(4) Evaluation of Resistance to Formation of Corrosive Micro-Stains

The resulting presensitized plate was conditioned with a slip sheet at 25° C. and 70% RH for 1 hour, wrapped with aluminum kraft paper and heated in an oven set at 60° C. for 5 days.

Then, the temperature was lowered to room temperature and the plate was mounted on the plate cylinder of a Lithrone 26 printing press (Komori Corporation) without development process.

A fountain solution Ecolity-2 (FUJIFILM Corporation)/tap water at a volume ratio of 2/98 and Values-G (N) black ink (Dainippon Ink and Chemicals, Inc.) were used. The fountain solution and the ink were supplied by the standard automatic printing start-up procedure on the Lithrone 26 to perform on-press development, and 500 impressions were printed on Tokubishi art paper (76.5 kg).

The 500th impression was visually inspected and the number per 100 cm$^2$ of print stains with a size of at least 20 µm was counted. The results are shown in Table 11.

Excellent: The number of corrosive micro-stains is up to 20 (per 80 cm$^2$);
Very good: The number of corrosive micro-stains is from 21 to 50 (per 80 cm$^2$);
Good: The number of corrosive micro-stains is from 51 to 80 (per 80 cm$^2$);
Fair: The number of corrosive micro-stains is from 81 to 100 (per 80 cm$^2$);
Poor: The number of corrosive micro-stains is from 101 to 150 (per 80 cm$^2$);
Very poor: The number of corrosive micro-stains is 151 or more (per 80 cm$^2$).

At a number of stains of up to 200 per 100 cm$^2$, the presensitized plate can be rated as having good resistance to severe scumming.

TABLE 11

| | Press life | Scumming resistance | Evaluation result of corrosive micro-stains |
|---|---|---|---|
| EX 28 | Very good | Very good | Excellent |
| EX 29 | Very good | Very good | Very good |
| EX 30 | Very good | Very good | Good |
| EX 31 | Good | Good | Good |
| EX 32 | Very good | Very good | Very good |
| EX 33 | Very good | Very good | Very good |
| EX 34 | Very good | Very good | Good |
| EX 35 | Very good | Very good | Fair |
| EX 36 | Very good | Very good | Good |
| EX 37 | Very good | Very good | Good |
| EX 38 | Very good | Very good | Very good |
| EX 39 | Very good | Very good | Good |
| EX 40 | Very good | Very good | Good |
| EX 41 | Very good | Very good | Good |
| EX 42 | Very good | Very good | Very good |
| EX 43 | Good | Good | Very good |
| EX 44 | Very good | Very good | Fair |
| EX 45 | Very good | Very good | Fair |

TABLE 11-continued

| | Press life | Scumming resistance | Evaluation result of corrosive micro-stains |
|---|---|---|---|
| EX 46 | Very good | Very good | Good |
| EX 47 | Very good | Very good | Very good |
| EX 48 | Very good | Very good | Excellent |
| EX 49 | Very good | Very good | Excellent |
| EX 50 | Very good | Very good | Good |
| CE 9 | Poor | Poor | Poor |
| CE 10 | Poor | Poor | Very poor |
| CE 11 | Poor | Poor | Very poor |
| CE 12 | Poor | Poor | Very poor |
| CE 13 | Poor | Poor | Poor |
| CE 14 | Poor | Poor | Poor |

Examples 51 to 56 and Comparative Examples 15 to 16 illustrated below are those concerning the fourth aspect of the invention.

Examples 51 to 56

Each aluminum alloy melt of the composition shown in Table 12 was used to prepare an aluminum alloy plate by continuous casting including heat treatment (intermediate annealing) under the conditions shown in Table 13.

More specifically, the aluminum alloy melt was first continuously cast by a twin roll process to a cast plate thickness of 5.5 mm.

Then, the resulting continuously cast plate was subjected to cold rolling to a plate thickness of 0.9 mm, then subjected to intermediate annealing heat treatment under the conditions shown in Table 13, and further subjected to cold rolling again to be finished to a thickness of 0.3 mm.

Then, a tension lever was used to correct the flatness to prepare an aluminum alloy plate. The composition of each of the prepared aluminum alloy plates is the same as that of the aluminum alloy melt used therefor.

Comparative Examples 15 and 16

Each aluminum alloy melt of the composition shown in Table 12 was cast into a slab by DC casting and the slab was subjected to soaking treatment and heat treatment (intermediate annealing) under the conditions shown in Table 13 to prepare an aluminum alloy plate.

More specifically, an aluminum alloy melt was cast into a slab with a thickness of 500 mm by DC casting.

Then, both the surfaces of the resulting slab were scalped to a depth of 20 mm and soaking treatment was carried out at 500 to 600° C.

Then, the slab was rolled to a thickness of 3 mm by hot rolling and subjected to intermediate annealing heat treatment under the conditions shown in Table 13.

Then, cold rolling was carried out to finish the plate to a thickness of 0.3 mm and a tension lever was used to correct the flatness to prepare an aluminum alloy plate. The composition of each of the prepared aluminum alloy plates is the same as that of the aluminum alloy melt used therefor.

The number per unit area of intermetallic compound particles in each of the prepared aluminum alloy plates was determined by the method described above. The results are shown in Table 13.

TABLE 12

| | Si (wt %) | Fe (wt %) | Cu (wt %) | Ti (wt %) | Others (wt %) | Balance |
|---|---|---|---|---|---|---|
| Composition | 0.08 | 0.31 | 0.002 | 0.02 | 0.05 or less | Al |

TABLE 13

| | | Heat treatment condition | | Intermetallic compound | |
|---|---|---|---|---|---|
| | Casting method | Temp. (° C.) | Time (h) | 0.2 μm or more (pcs/mm$^2$) | 1.0 μm or more (pcs/mm$^2$) |
| EX 51 | Continuous | 530 | 6 | 41000 | 0 |
| EX 52 | Continuous | 530 | 9 | 35500 | 0 |
| EX 53 | Continuous | 530 | 3 | 76500 | 0 |
| EX 54 | Continuous | 580 | 3 | 41000 | 780 |
| EX 55 | Continuous | 580 | 7 | 39000 | 1550 |
| EX 56 | Continuous | 580 | 12 | 37000 | 2470 |
| CE 15 | DC | 410 | 2 | 33500 | 50 |
| CE 16 | DC | 550 | 12 | 17700 | 2750 |

Each of the prepared aluminum alloy plates was subjected to surface roughening treatment described below to prepare a lithographic printing plate support.

<Surface Roughening Treatment>

The surface roughening treatment including the following treatments (b) to (k) was carried out. Rinsing treatment was carried out among all the treatment steps.

(b) Alkali Etching Treatment

The same procedure as that of alkali etching treatment (b) in Example 1 was carried out.

(c) Desmutting Treatment

The same procedure as that of desmutting treatment (c) in Example 1 was carried out.

(d) Electrolytic Graining Treatment

The same procedure as that of electrolytic graining treatment (d) in Example 1 was carried out.

(e) Alkali Etching Treatment

The same procedure as that of alkali etching treatment (e) in Example 1 was carried out.

(f) Desmutting Treatment

The same procedure as that of desmutting treatment (f) in Example 1 was carried out.

(j) Anodizing Treatment

The same procedure as that of anodizing treatment (j) in Example 1 was carried out. The final oxide film weight was 2.7 g/m$^2$.

(k) Treatment with Polyvinyl Phosphonic Acid

The same procedure as that of treatment with polyvinyl phosphonic acid (k) in Example 1 was carried out.

[Manufacture of Presensitized Plate]

A thermal positive type image recording layer as described below was formed on each of the lithographic printing plate supports obtained after the surface roughening treatment to obtain a presensitized plate.

To be more specific, image recording layer-forming coating liquids (1) and (2) of the compositions indicated below were prepared, and the image recording layer-forming coating liquid (1) was first applied to a dry coating weight of 1.5 g/m$^2$ and dried at 100° C. for 1 minute. Then, the image recording layer-forming coating liquid (2) was applied to a dry coating weight of 0.5 g/m$^2$ and dried at 100° C. for 1 minute to form a thermosensitive layer (thermal positive type image recording layer) thereby obtaining a presensitized plate.

<Image Recording Layer-Forming Coating Liquid (1)>

| | |
|---|---|
| Polymer A | 6.01 g |
| IR dye | 1.06 g |
| Byk 307 | 0.21 g |
| γ-Butyrolactone | 9.27 g |
| 1-Methoxy-2-propanol | 13.9 g |
| Methyl ethyl ketone | 60.26 g |
| Water | 9.27 g |

<Image Recording Layer-Forming Coating Liquid (2)>

| | |
|---|---|
| 1,2-Naphthoquinonediazido-5-sulfonate of a pyrogallol-acetone condensate | 0.15 g |
| Novolac resin (75% m-cresol/25% p-cresol) | 0.35 g |
| Ethyl Violet | 0.0014 g |
| Byk 307 | 0.015 g |
| 1-Methoxy-2-propanol | 6.2 g |
| MEK | 3.3 g |

In the image recording layer-forming coating liquids (1) and (2), the following compounds were used as the polymer A, Byk 307 and Ethyl Violet.

(Polymer A)

Copolymer (Mw=50,000) obtained by polymerizing methacrylic acid (20 mol %), acrylonitrile (67 mol %), N-phenylmaleimide (3 mol %) and methacrylamide (10 mol %) in a 250 mL three-necked flask containing 70 g of dimethylacetamide (DMAC) and 5 g of water.

(Byk 307)

Polyether-modified polydimethylsiloxane (BYK Japan KK)

(Ethyl Violet)

CAS: 2390-59-2, λmax: 596 nm

The resulting photosensitive presensitized plate was subjected to imagewise drawing in Trendsetter (Creo) at a beam intensity of 9 W and a drum rotational speed of 150 rpm. The image to be exposed was set to include a solid image.

Then, a PS processor 900H (FUJIFILM Corporation) containing an alkali developer of the composition indicated below was used to develop the plate in a developer kept at a temperature of 30° C. for a development time of 20 seconds to obtain a presensitized plate.

<Composition of Alkali Developer>

| | |
|---|---|
| Water | 85 wt % |
| Glycerol | 4 wt % |
| Sodium methyl naphthalene sulfonate | 4 wt % |
| 2-Phenoxyethanol | 3 wt % |
| Sodium octyl sulfonate | 3 wt % |
| Diethanolamine | 1 wt % |

[Evaluation of Presensitized Plate]

The presensitized plates obtained by the foregoing procedure were evaluated as described below. The results are shown in Table 14.

(1) Evaluation of Press Life

The presensitized plate obtained above was subjected to printing in a Lithrone printing press (Komori Corporation) using DIC-GEOS(N) black ink (Dainippon Ink and Chemicals, Inc.) and the press life was evaluated based on the following criteria by the number of impressions at the time when the decrease in density of a solid image became visually recognizable. The results are shown in Table 14.

Very good: The number of impressions is 70,000 or more;
Good: The number of impressions is at least 50,000 but less than 70,000;
Fair: The number of impressions is at least 30,000 but less than 50,000;
Poor: The number of impressions is less than 30,000.

(2) Evaluation of Scumming Resistance

Printing was performed on the presensitized plate obtained above by Mitsubishi Dia type F2 printing press (Mitsubishi Heavy Industries, Ltd.) using DIC-GEOS (s) red ink. The blanket was visually inspected for staining after 10,000 impressions had been printed and evaluation was made based on the following criteria. The results are shown in Table 14.

Very good: The blanket is not stained;
Good: The blanket is slightly stained but can be rated good in practical use;
Fair: The blanket is stained within a tolerable level;
Poor: The blanket is stained, causing impressions to be clearly stained.

(5) Evaluation of Suppression of Residual Film Spots

The presensitized plate obtained above was used to observe a developed non-image area of a sample exposed in each amount of plate surface energy with an optical microscope at a magnification of 100×. The number of residual film spots per area of 1 cm² was counted and the sample was evaluated based on the following criteria. The results are shown in Table 14.

Very good: The number of residual film spots is up to 5 pcs/cm²;
Good: The number of residual film spots is from 6 to 10 pcs/cm²;
Fair: The number of residual film spots is from 11 to 20 pcs/cm²;
Poor: The number of residual film spots is from 21 to 30 pcs/cm²;
Very poor: The number of residual film spots is 31 pcs/cm² or more.

(6) Evaluation of Development Scum

The presensitized plate obtained above was used to perform imagewise drawing (exposure) of a test pattern having a chart with a halftone dot area ratio of 1 to 99% at 175 lpi/2400 dpi in Trendsetter 3244 (CREO) under conditions of a beam intensity of 10.0 W and a drum rotational speed of 250 rpm. Then, PS processor LP-940HII (FUJIFILM Corporation) was used to develop the presensitized plate at a development solution temperature of 30° C. for a development time of 12 seconds. Thereafter, gum coating was carried out to prepare a lithographic printing plate. The developer used was a solution at a pH of 13.2 obtained by diluting a developer DT-2 (FUJIFILM Corporation) with water at a ratio of 1/8 and contained no organic solvent. The gum solution used was a solution obtained by diluting FG-1 (FUJIFILM Corporation) with water at a ratio of 1/1.

The number of development scum attached to the surface of the resulting lithographic printing plate was visually inspected and the lithographic printing plate was evaluated based on the following criteria. The results are shown in Table 14.

Very good: The number of development scum is 0 pce/m²;
Good: The number of development scum is from 1 to 2 pcs/cm²;
Fair: The number of development scum is 3 pcs/m²;
Poor: The number of development scum is from 4 to 6 pcs/cm²;
Very poor: The number of development scum is 7 pcs/cm² or more.

TABLE 14

| | Intermetallic compound | | | | | |
| --- | --- | --- | --- | --- | --- | --- |
| | 0.2 μm or more (pcs/mm²) | 1.0 μm or more (pcs/mm²) | Press life (unit: 10,000) | Scumming resistance | Residual film spot | Development scum |
| EX 51 | 41000 | 0 | Very good | Very good | Very good | Very good |
| EX 52 | 35500 | 0 | Good | Good | Very good | Very good |
| EX 53 | 76500 | 0 | Very good | Very good | Very good | Very good |
| EX 54 | 41000 | 780 | Very good | Very good | Very good | Very good |
| EX 55 | 39000 | 1550 | Very good | Very good | Good | Good |
| EX 56 | 37000 | 2470 | Very good | Very good | Fair | Fair |
| CE 15 | 33500 | 50 | Poor | Poor | Poor | Very good |
| CE 16 | 17700 | 2750 | Poor | Poor | Poor | Poor |

The results shown in Table 14 revealed that in the presensitized plates in Comparative Examples 15 and 16 formed using aluminum alloy plates each having intermetallic compound particles with a circle equivalent diameter of 0.2 μm or more at a surface density of 35,000 pcs/mm² or more, the occurrence of residual film spots is not suppressed and not only the scumming resistance but also the press life are poor. It was particularly revealed that the occurrence of development scum cannot be suppressed in the presensitized plate in Comparative Example 16 formed using an aluminum alloy plate having intermetallic compound particles with a circle equivalent diameter of 1.0 μm or more at a surface density of 2,500 pcs/mm² or more.

In contrast, it was revealed that in the presensitized plates formed using aluminum alloy plates each having intermetallic compound particles with a circle equivalent diameter of 0.2 μm or more at a surface density of 35,000 pcs/mm² or more, the occurrence of residual film spots and development scum is suppressed and not only the scumming resistance but also the press life are excellent. It was also revealed that the more the density of the intermetallic compound particles with a circle equivalent diameter of 1.0 μm or more is reduced within a range of 2,500 pcs/mm² or less, the more the occurrence of development scum can be suppressed.

DESCRIPTION OF SYMBOLS 1 aluminum alloy plate
2, 4 roller-type brush
3 abrasive-containing slurry
5, 6, 7, 8 support roller
11 aluminum alloy plate 12 radial drum roller
13a, 13b main electrode
14 electrolytic treatment solution
15 solution feed inlet
16 slit
17 solution channel
18 auxiliary anode
19a, 19b thyristor
20 AC power supply
40 main electrolytic cell
50 auxiliary anode cell
200 rotary brush roll
201 backing roll
202 transport roll
203 transport guide plate
204 spray pipe
205 pipe line
206 filter
207 plate feed table
208 plate discharge table
209 treatment solution (tank)
210 circulation pump
211 presensitized plate
410 anodizing apparatus
412 power supplying tank
413 intermediate tank
414 anodizing treatment tank
416 aluminum alloy plate
418, 426 electrolytic solution
420 anode
422, 428 pass roller
424 nip roller
430 cathode
434 DC power supply
436, 438 solution feed nozzle
440 shield
442 discharge outlet

The invention claimed is:

1. A presensitized plate comprising:
an image recording layer containing (G) a sensitizing dye, (H) a polymerization initiator, (I) a polymerizable compound, and (J) a polymer and formed on a support, unexposed portions of the image recording layer removed with printing ink, fountain solution, or any combination thereof,
wherein the support is prepared from an aluminum alloy plate containing intermetallic compound particles with a circle equivalent diameter of 0.2 μm or more at a surface density of 35,000 pcs/mm² or more, and wherein and AlFeSi intermetallic compounds are presented in the aluminum alloy, the AlFeSi intermetallic compounds of the aluminum alloy plate have peak count values as measured with an X-ray diffractometer (XRD) of 30 cps or more.

2. The presensitized plate according to claim 1, wherein the polymer (J) has an alkylene oxide chain.

3. The presensitized plate according to claim 1, wherein the polymer (J) is particulate.

4. The presensitized plate according to claim 1, wherein Al—Fe intermetallic compounds of the aluminum alloy plate have peak count values as measured with an X-ray diffractometer (XRD) of up to 400 cps.

5. The presensitized plate according to claim 1, wherein a micropore-bearing anodized film is formed on a surface side of the support on which the image recording layer is to be formed, an average pore size in a surface layer of the anodized film is from 10 to 75 nm, and a ratio of an average of a maximum diameter inside pores to the average pore size is from 1.1 to 3.0.

6. The presensitized plate according to claim 1, wherein the aluminum alloy plate is manufactured by a continuous casting process.

* * * * *